(12) United States Patent
Kinno et al.

(10) Patent No.: US 7,172,343 B2
(45) Date of Patent: Feb. 6, 2007

(54) ROLLING SLIDING MEMBER AND ROLLING APPARATUS

(75) Inventors: Dai Kinno, Kanagawa (JP); Tsuyoshi Saito, Kanagawa (JP); Yasushi Tomizuka, Kanagawa (JP); Taikou Nawamoto, Kanagawa (JP); Hirotoshi Aramaki, Kanagawa (JP)

(73) Assignee: NSK Ltd., Tokyo (JP)

( * ) Notice: Subject to any disclaimer, the term of this patent is extended or adjusted under 35 U.S.C. 154(b) by 79 days.

(21) Appl. No.: 11/062,468

(22) Filed: Feb. 22, 2005

(65) Prior Publication Data

US 2005/0141797 A1 Jun. 30, 2005

Related U.S. Application Data

(62) Division of application No. 10/119,083, filed on Apr. 10, 2002, now Pat. No. 6,994,474.

(30) Foreign Application Priority Data

| May 29, 2001 | (JP) | P. 2001-160558 |
| Jun. 27, 2001 | (JP) | P. 2001-195069 |
| Aug. 15, 2001 | (JP) | P. 2001-246738 |
| Jan. 28, 2002 | (JP) | P. 2002-018917 |
| Feb. 19, 2002 | (JP) | P. 2002-042282 |
| Mar. 1, 2002 | (JP) | P. 2002-056202 |

(51) Int. Cl.
*F16C 33/62* (2006.01)
(52) U.S. Cl. .................................... 384/492
(58) Field of Classification Search ............ 384/495, 384/565, 569, 907.1
See application file for complete search history.

(56) References Cited

U.S. PATENT DOCUMENTS

| 5,112,146 A | 5/1992 | Stangeland |
| 5,284,394 A | 2/1994 | Lemelson |
| 5,322,735 A | 6/1994 | Fridez et al. |
| 5,482,602 A | 1/1996 | Cooper et al. |
| 5,593,234 A | 1/1997 | Liston |

(Continued)

FOREIGN PATENT DOCUMENTS

GB    2 281 106 A    2/1995

(Continued)

OTHER PUBLICATIONS

Patent Abstracts of Japan, vol. 2000, No. 12, Sep. 5, 2000 for JP 2000-240667.

(Continued)

*Primary Examiner*—Lenard A. Footland
(74) *Attorney, Agent, or Firm*—Sughrue Mion, PLLC

(57) ABSTRACT

A rolling bearing includes: an inner ring mounted on a shaft to be supported; an outer ring provided around an outer periphery of the inner ring; a plurality of rolling elements rolling while contacting with an inner peripheral face of the outer ring and an outer peripheral face of the inner ring at surfaces thereof; and a retainer supporting the rolling elements. A sliding resistance-reducing film is formed on at least one of a first group being an outer peripheral face of the retainer or the inner peripheral face of the outer ring and a second group being an inner peripheral face of the retainer or the outer peripheral face of the inner ring.

9 Claims, 25 Drawing Sheets

U.S. PATENT DOCUMENTS 6,340,245 B1 1/2002 Horton et al.
6,357,923 B1 3/2002 Sato et al.

FOREIGN PATENT DOCUMENTS

| JP | 2000-161371 A | 6/2000 |
|----|---------------|--------|
| WO | WO 99/02873 | 1/1999 |
| WO | WO 99/14512 A1 | 3/1999 |
| WO | WO 01/33091 A | 5/2001 |
| WO | WO 01/33091 A1 | 5/2001 |

OTHER PUBLICATIONS

Patent Abstracts of Japan, vol. 1999, No. 13, Aug. 10, 1999 for JP 11-218134.
Patent Abstracts of Japan, vol. 1995, No. 3, Dec. 13, 1994 for JP 06-341445.
Patent Abstracts of Japan, vol. 2000,. No. 5, Feb. 18, 2000 for JP 2000-049140.
Patent Abstracts of Japan, vol. 1997, No. 8, Apr. 8, 1997 for JP 09-094911.
Patent Abstracts of Japan, vol. 1999, No. 8, Mar. 5, 1999 for JP 11-062979.
Patent Abstracts of Japan, vol. 012, No. 120, Oct. 27, 1987 for JP 62-246621.
Patent Abstracts of Japan, vol. 1999, No. 3, Dec. 8, 1988 for JP 10-326468.
Patent Abstracts of Japan, vol. 1999, No. 3, Dec. 8, 1988 for JP 10-326469.
Patent Abstracts of Japan, vol. 2000, No. 10, Jul. 25, 2000 for JP 2000-205280.
Patent Abstracts of Japan, vol. 2000, No. 10, Jul. 25, 2000 for JP 2000-205279.
Patent Abstracts of Japan, vol. 2000, No. 10, Jul. 25, 2000 for JP 2000-205277.
Patent Abstracts of Japan, vol. 2000, No. 8, May 16, 2000 for JP 2000-136828.
Patent Abstracts of Japan vol. 1997, No. 10, Jun. 3, 1997 for JP 09-144764.
Patent Abstracts of Japan, vol. 2000, No. 1, Oct. 5, 1999 for JP 11-270564.
Patent Abstracts of Japan, vol. 2000, No. 8, May 26, 2000 for JP 2000-145749.
Patent Abstracts of Japan, vol. 011, No. 205, Feb. 2, 1987 for JP 62-024025.
Patent Abstracts of Japan, vol. 18, No. 548, Jul. 15, 1994 for JP 06-193637.
Patent Abstracts of Japan, vol. 2000, No. 1, Jan. 31, 2000 for JP 11-286778.

| THICKNESS OF HARD CARBONE FILM | RISING TEMPERATURE |
|---|---|
| 0.05 | 34 |
| 0.1 | 34 |
| 0.2 | 34 |
| 0.5 | 32 |
| 1 | 27 |
| 2 | 26 |
| 5 | 25 |
| 8 | 28 |
| 10 | 28 |

| THICKNESS OF FLUORINE-CONTAINED RESIN FILM | RISING TEMPERATURE |
|---|---|
| 0.2 | 36 |
| 0.5 | 36 |
| 1 | 36 |
| 2 | 32 |
| 5 | 29 |
| 10 | 26 |
| 20 | 26 |
| 30 | 26 |
| 50 | 26 |

- 107-a
- 107-d
- 107-c
- 107-b

- CARBON LAYER
- COMPOSITE LAYER (OBLIQUE LAYER)
- INTERMEDIATE LAYER
- BASE MATERIAL 1.0 ($\mu$m)

ROLLING SLIDING MEMBER AND ROLLING APPARATUS

This is a divisional of application Ser. No. 10/119,083 filed Apr. 10, 2002, now U.S. Pat. No. 6,994,474.

BACKGROUND OF THE INVENTION

1. Field of the Invention

The present invention relates to a rolling sliding member excellent in lubricating property and a rolling apparatus with the rolling sliding member, and in particular to a rolling sliding member and a rolling apparatus enabling to be suitably served under a condition of acting a large contact stress, an oil free condition, or a micro oil lubrication. The rolling sliding member includes general rolling bearings used to a machine tool or the like, a rolling member suitable for automotive engine parts, oil free bearings served in a vacuum, and a linear guide mechanical parts such as linear guide apparatus or ball screw.

2. Description of the Related Art

In machine tools as a machining center or a high speed lathe, rolling bearings such as ball bearings or roller bearings are used as a bearing for supporting a spindle. This kind of rolling bearing includes an inner ring, an outer ring, a plurality of rolling elements and a retainer. The inner ring is mounted on a shaft to be supported such as a spindle, and the outer ring is provided in the outer peripheral face of the inner ring. The plurality of rolling elements are disposed between the inner ring and the outer ring, and when the inner ring rotates relatively together with the spindle, the rolling elements roll while contacting with the outer peripheral face of the inner ring and the inner peripheral face of the outer ring at surfaces thereof. The retainer holds the rolling elements and rotates in a circumferential direction of the inner ring and the outer ring. Accordingly, in such rolling bearings, frictional heat is generated in contacting parts between both inner, outer rings and the rolling elements, and seizure is probably caused, and so this is prevented with a grease lubrication filling the interior of the bearing with a lubricant such as a grease or the like or a minor oil lubrication such as an oil air.

However, the oil air lubrication generates an air curtain in the interior of the bearing at high speed rotation of the bearing. The air curtain obstructs the lubricant entering into the rolling faces of both inner and outer rings, and brings about a problem of insufficient supply of the lubricant. The grease lubrication is useful for a lubrication of the bearing only, but it has a large agitation resistance of the grease and a large heating value of frictional heat under a condition of high speed rotation, bringing about a problem ready for causing seizure.

In addition, when rotating the spindle at high speed, the lubricant scatters owing to a centrifugal force, and a problem arises, easily causing a boundary lubrication that lubrication is insufficient. In this case, the same problem occurs not only at the contacting parts between the raceway surface of the bearing ring and the rolling elements, but also at the contacting parts between an outer diameter face of the retainer and an inner diameter face of the outer ring and between an inner diameter face of the retainer and an outer diameter face of the inner ring.

Further, recently, a machine tool has intensively demanded a high speed rotation of a spindle for heightening processing efficiency, and based on this occasion, a rotation speed of a roller bearing for spindle has been increased. At the same time, the bearing has been asked to be low heat generation for improving processing precision.

In general, when an angular ball bearing rotates at high speed, a large sliding is caused by spin movement or gyro movement at contacting parts between rolling elements (balls) and raceway surfaces. Further, pressure at the contacting faces between the balls and the raceway surfaces increases owing to centrifugal force acting on the inner ring or the balls and decrease of spaces at the interior of the bearing caused by the difference in temperature between the inner ring and outer ring. The sliding at the contacting parts or the increase of pressure at the contacting faces generate a rising temperature or seizure by heat generation and further various kinds of inconveniences such as advance of excessive abrasion.

As a measure for restraining these inconveniences, it has been practiced to lighten increase of the face pressure effected by the centrifugal force of the balls by reducing the ball diameter or employing ceramics of lightweight. JP-A-62-24025 discloses a method of making the material of the inner ring having a smaller linear thermal expansion coefficient than that of the material of the outer ring, so as to control changes in spaces at the interior of the bearing.

JP-A-2000-145749 and JP-A-11-270564 disclose methods of making optimum designs of internal elements in the bearing in order to realize such a bearing of super high speed, high rigidity and low heat generation.

If applying such processed roller bearing to the spindle of a machine tool, an operation is available until about 3,500,000 of DmN value (Dm: pitch diameter mm of the rolling elements, and N: rotation speed min$^{-1}$) showing allowable rotation speed.

However, the rotating speed of the roller bearing trends to increase more and more, and with only the techniques disclosed above, it is difficult to cope with higher speed and the low heat generation.

In particular, the bearing for the machine tool aims at the lower torque and the low heat generation, and is served under circumstances of minor oil lubrication such as a grease-lubrication, an oil air-lubrication, an oil mist-lubrication or a direct jetting minor oil-lubrication. That is, a lubrication may be effected with a minor amount of lubricant under high speed rotation. Therefore, at the high speed rotation when the DmN value exceeds about 2,000,000, an oil film is broken at the contacting part between the balls and the raceway surface, and both are easy to contact with each other, causing a problem that damages as seizure or abrasion easily occur. Especially, comparing with the oil air-lubrication or the oil mist-lubrication, since the grease lubrication is difficult to form an oil film, the allowable rotating speed is lowered.

On the other hand, in a case that rolling sliding members such as bearings or linear guides are served under oil free conditions as vacuum, clean atmosphere, high or low temperatures, a lubricating manner becomes a problem.

Conventionally, in a vacuum or under a clean circumstance, solid lubricants as Au, Ag, Pb of soft metals, $MOS_2$, and PTFE (polytetrafluoroethylene) have been used for lubrication. Further, under the oil free condition, hard films as CrN or TiN have been often formed on raceway surfaces of inner and outer rings or surfaces of rolling elements for heightening abrasion resistance and seizure resistance.

However, the solid lubricant has a problem that abrasion of the solid lubricant itself is large because the solid lubricant is self-sacrifice. When using the conventional hard film, a life has been very often shortened because a problem is present in a lubricating property.

For solving these problems, such a technique is useful of forming on a metal, a film of a diamond like carbon (hereinafter referred to as "DLC") having low friction and excellent abrasion resistance and seizure resistance.

The DLC has a surface of hardness equal to diamond, its sliding resistance is small due to frictional coefficient being less than 0.2 similarly to molybdenum disulfide or fluorine resin. Therefore, the DLC has been employed as a new lubricating material.

For example, in a magnetic disc apparatus, if forming the DLC film of several ten angstroms on surfaces of a magnetic element or magnetic disc, the lubricating property is heightened between the magnetic element and the magnetic disc for protecting the surface of the magnetic disc.

On the other hand, because of its peculiar surface property, the DLC has been noticed as a new lubricating material for rolling sliding members, and recently utilized for imparting the lubricating property to bearings.

For example, JP-W-11-14512 discloses a rolling bearing formed with the DLC film containing a metal in raceway surfaces of the bearing rings or surfaces of the rolling elements. In this rolling bearing, a contact stress is moderated by the DLC film.

Besides, known is the rolling apparatus of the rolling bearing formed with the DLC film on raceway surfaces of the bearing rings or surfaces of the rolling elements by a CVD, a plasma CVD, an ion beam forming process, or an ionization vapor deposition (for example, in JP-A-9-144764, JP-A-2000-136828, JP-A-2000-205277, JP-A-2000-205279 and JP-A-2000-205280).

However, in the rolling apparatus such as the above mentioned conventional rolling bearing, a contact face is a point contact or a line contact having a small area, and since large contact stress acts on the raceway surfaces of raceway rings or the surfaces of rolling elements, the raceway surface of the raceway ring or the DLC film is probably broken by repeated stress or shearing resistance.

As seasons of generating such damages, the following three points are assumed.

A first point is that the DLC layer has a property very difficult to deform even if the stress acts on. The DLC is hard and has high elasticity, and if it is covered with a metallic material of small elastic modulus such as a stainless steel or a bearing steel, the DLC cannot follow deformation of a base material owing to difference in both elastic modulus, and the DLC film might be broken.

A second point is that although the DLC is expected to have lubricating property, in comparison with the grease or the lubricating oil, this property is inferior and the DLC is weak in the shearing resistance.

A third point is a problem of embrittlement of the metallic intermediate layer interposed for heightening adhesiveness between copper and the DLC film. That is, because the metal composing the metallic intermediate layer and carbon composing the DLC film are combined to form metallic carbide having brittleness, the metallic intermediate layer is embrittled and the DLC film is easily broken. In case the metallic intermediate layer is composed of one kind of metal, the metallic carbide has large brittleness, and so it is ready for becoming a breaking factor.

In addition, conventionally, for lubrication under circumstances serving bearings disliking steam of a lubricant, or lubrication of rolling members and sliding members serving in a cooling medium, solid lubricants such as fluorine based grease or fluorine resin compound have been employed.

For example, as lubricating technologies for information machinery, known are rolling members dry-adhered on metal surfaces by heating fluoropolyether or fluoropolyalkyl polymer made of fluoropolymer having functional group (for instance, JP-A-10-326468 and JP-A-10-326469).

In the methods described in these publications, the rolling member is immersed in perfluoropolyether (PFPE) or a diluted liquid of a derivative thereof, adhered on the metal surface with PFPE or the derivative thereof, and dry-adhered by heating at 200° C. or lower.

Further, there is also a known method of adhering fluoro derivative having isocyanate group as a functional group onto the surface of the rolling member or the sliding member and heating to cause hardening reaction.

On the other hand, it is difficult to supply enough lubricant to the rolling member and the sliding member used in a cooling medium as a compressor or engine parts, or to sliding members served within engines, to become a boundary lubrication and very often cause seizure. By the way, the lubrication with such a minor amount of the lubricant is small in an agitation resistance of the lubricant, and is a very useful lubricating technique for reducing generation of heat in, e.g., the spindle bearing of the machine tool, but this is difficult to control the amount of the lubricant, and especially in bearings working at high speed, an air curtain (obstructing the lubricant entering into rolling faces) occurs owing to rotation, and becomes the boundary lubrication and very often causes the seizures.

When the supply of the enough lubricant is difficult, a further known method is that endurance of the bearing is lengthened by forming a film made of a material combined with ceramic, metal and alloy on the surfaces of the rolling member and the sliding member. For example, this method is disclosed in JP-A-9-133138. In addition, this publication discloses a technology that a diamond like carbon (DLC) layer having excellent adhesiveness with base materials of the rolling member and the sliding member is formed on the surfaces thereof for imparting a lubricating property to the surfaces of the rolling member and sliding member.

In the rolling member and the sliding member of the bearing, pressure in surface of contacting parts is high, and sliding is caused in the contacting parts. Generally, as an oil film is formed by the lubricant and becomes a liquid lubricant, the contact of metal-to-metal can be avoided. However, the liquid lubricant has a problem that rotation torque or sliding resistance are large by the agitation resistance of the lubricant. Accordingly, a similar problem occurs also in the method of using the solid lubricant as mentioned above.

As the fluorine based grease has a low wettability with metal and a poor oil film-forming ability, it easily becomes the boundary lubrication, and the rolling member and the sliding member using the fluorine based grease have problems about the endurance. Particularly, the usage of the solid lubricant such as the fluorine based compound is useful for improving conformability at an initial period, but not adequate to lubrication of a long time, and its application is limited to the sliding member of very light weighted load.

The technologies disclosed in JP-A-10-326468 and JP-A-10-326469 are that since the liquid lubricating film is difficult to form under a condition where the contacting surface pressure is high as a rolling contact, it easily becomes the boundary lubrication and easily causes the seizure and abrasion. In particular, as the metallic surface is covered with chemically stable metallic oxide, a problem is that the functional group of fluoropolymer is less to combine with metal, and adhesive force of fluoropolymer to the metallic surface is remarkably low.

Explanation will be made to a problem concerned with the above mentioned lubricating method of forming a film made of a material combined with ceramic, metal and alloy on the surfaces of the rolling member and the sliding member, specifically, with reference to the bearings provided with an alloy-steel bearing ring and ceramic-made balls.

If a film of a compound of, e.g., TiN or CrN is formed on the raceway surface of the bearing ring, abrasion resistance in the raceway surface increases. But although having a large affinity with an alloy steel, this compound is harder than the alloy steel composing the bearing ring, and the rolling elements are worn under the boundary lubrication and a preload escapes. Further, since the surface composed of the above mentioned compound has a large sliding resistance, it is difficult to prevent the seizure.

Another example uses hard carbon instead of the above mentioned compound. The hard carbon has hardness equivalent to or higher than the compound as TiN, and is characterized in that coefficient of dynamic friction in the surface is small. However, as the adhesiveness with the metallic surface is weak, the hard carbon layer is ordinarily formed on an intermediate layer made of W, Ti, Si, or Cr for increasing the adhesiveness with the metal as the base material.

SUMMARY OF THE INVENTION

It is accordingly a first object of the invention to solve the above mentioned problems and offer a rolling bearing enabling to suitably serve not causing seizure even under circumstances ready for becoming the boundary lubrication.

Further, it is a second object of the invention to offer a rolling sliding member enabling to secure the excellent lubricating properties of the DLC film for a long period of time without peeling of the DLC film in usage of large contact stress.

In addition, it is a third object of the invention to offer a roller bearing for high speed rotation enabling to of course the low torque and the generation of low heat and enabling to provide seizure resistance and abrasion resistance under the high speed rotation.

Moreover, it is a fourth object of the invention to offer a rolling sliding member enabling to be suitably served under a condition of acting a large contacting stress or an oil free condition, and offer a rolling apparatus excellent in the lubricating property provided with such a rolling sliding member.

Additionally, it is a fifth object of the invention to offer a rolling sliding member of the DLC film having a high adhesiveness and enabling to secure the excellent lubricating properties of the DLC film for a long period of time without peeling of the DLC film even under usage of large contact stress.

Further, it is a sixth object of the invention to offer a rolling member difficult to cause abrasion or fretting by contact of metal-to-metal even if becoming the condition of the boundary lubrication and having excellent seizure resistance under the condition of the boundary lubrication.

In addition, it is a seventh object of the invention to offer a rolling sliding member and a rolling apparatus enabling to be suitably served under such conditions of acting a large contacting stress or an oil free condition.

To solve the first object, according to a first aspect of the invention, there is provided a rolling bearing, comprising:

an inner ring mounted on a shaft to be supported;

an outer ring provided around an outer periphery of the inner ring;

a plurality of rolling elements rolling while contacting with an inner peripheral face of the outer ring and an outer peripheral face of the inner ring at surfaces thereof; and a retainer supporting the rolling elements, wherein a sliding resistance-reducing film is formed on at least one of a first group being an outer peripheral face of the retainer or the inner peripheral face of the outer ring and a second group being an inner peripheral face of the retainer or the outer peripheral face of the inner ring.

With such a structure, sliding resistance (frictional resistance) produced at the sliding parts between the outer ring and the retainer and/or the inner ring and the retainer is reduced by the sliding resistance-reducing films, so that the seizure by the frictional heat can be avoided, and the rolling bearing is enabled to suitably serve not causing seizure even under circumstances ready for becoming the boundary lubrication.

Herein, the sliding resistance-reducing film means a film enabling to reduce the sliding resistance produced at the sliding parts between the outer ring and the retainer and/or the inner ring and the retainer, and specifically, this can be accomplished by forming a hard carbon film (diamond like carbon film) or a fluorine-contained resin coating film on, for example, an outer peripheral face of the retainer. In this case, preferably, the retainer is made of heat resistant resins as polyether ether ketone (PEEK, linear thermal expansion coefficient: $45 \times 10^{-6}/°$ C.), polyphenylene sulfnoid (PPS, $28 \times 10^{-6}/°$ C.), thermoplastic polyimide resin, phenol resin, polyamide 66 (nylon, linear thermal expansion coefficient: $28 \times 10^{-6}/°$ C.), otherwise a light metal of specific gravity being less than 3 (for example, magnesium alloy). If the retainer is made of the heat resistant resin, the light metal of specific gravity being less than 3 or titanium alloy, such retainers can be prevented from thermal damages by frictional heat in comparison with the retainer made of, e.g., a bearing steel, and at the same time, those can be formed on the outer peripheral face with the good sliding resistance-reducing film as the hard carbon film (hereinafter referred to as "DLC film").

Further, if the retainer is made of the light metal such as a magnesium alloy, its weight can be lightened and strength can be heightened in comparison with the retainer made of an iron or a copper alloy.

Materials composing the retainer are enough with composite materials comprising the heat resistant resins as PEEK and reinforcing fibers as a glass fiber or carbon fiber, and if employing these composite materials, mechanical strength of the retainer can be increased. When forming the DLC film on the outer peripheral face of the retainer, an intermediate layer of Ti or Si may be in advance formed between the outer peripheral face of the retainer and the DLC film, thereby enabling to desirably form the DLC film on the outer peripheral face of the retainer.

If the DLC film is thicker than 10 µm, an internal stress thereof increases, and a sliding resistance-reducing function goes down by generation of a self-destruction, and if being thinner than 0.5 µm, the surface of the retainer is partially exposed, the sliding resistance-reducing function goes down. For these reasons, the thickness of the DLC film is desirable within a range of 0.5 to 10 µm, preferably, 1 to 5 µm. From the viewpoint of a film forming time or control of gas pressure, the thickness is desirably 1 to 3 µm.

For reasons why if the fluorine-contained resin coating film is thicker than 30 µm, unevenness is easy to happen in the film thickness, and if being less than 2 µm, a sliding resistance-reducing effect remarkably decreases, the thickness is desirable within a range of 2 to 30 μm, preferably, 5 to 20 μm.

Practices of forming the DLC film on the outer peripheral face of the retainer may depend on a plasma CVD (Chemical Vapor Deposition), an unbalanced spattering process, a vacuum arc discharge PVD (Physical Vapor Deposition), an ion beam forming process, or an ionization vapor deposition, and the DLC film may be formed on the outer peripheral face of the retainer by targeting carbon based gas (acetylene, ethylene, methane, ethane, or benzen) or graphite.

As practices of forming the fluorine-contained resin coating film on the outer peripheral face of the retainer, there may be proposed a process of performing a surface preparation by carrying out, e.g., a shot peening or barrel on the outer peripheral face of the retainer, using a spray gun to form thereon a coating layer of tetrafluoroethylene and molybdenum disulfide with a binder of thermosetting resin such as polyamideimide or epoxy resin, and baking the coating layer.

Molybdenum disulfide and tetrafluoroethylene may be used independently. It is useful for heightening seizure resistance to plate a metallic solid lubricant layer such as Ag, Sn after performing the surface preparation.

A synthetic resin as the binder may include not only polyamideimide but also thermosetting resins such as epoxy resin. The surface treatment by baking the solid lubricant for reducing friction may be carried out on at least one of retainer guiding faces of the inner ring and the outer ring other than the retainer.

To attain the second object, according to a second aspect of the invention, there is provided a rolling sliding member, comprising:

an inside member having a raceway surface in an outer face;

an outside member having a raceway surface opposite to the raceway surface of the inside member and disposed in the outside of the inside member; and rolling elements rollably placed between both raceway surfaces, wherein at least one of base materials of the raceway surface of the inside member, the raceway surface of the outside member and the rolling elements has a surface made of a steel, and a diamond like carbon film is formed on the base material surface made of steel, and wherein the diamond like carbon film at least includes an intermediate layer having a metal component and a carbon layer, and an equivalent elastic modulus is 80 to 240 Gpa and a plastic deformation hardness is 8 to 37 Gpa.

Further, the rolling sliding member may includes a composite layer having a carbon component between the intermediate layer and the carbon layer.

In addition, in the above rolling sliding member, the composite layer may be an oblique layer continuously changing compositions from the intermediate layer toward the carbon layer.

Moreover, according to a third aspect of the invention, there is provided a rolling sliding member, comprising:

an inside member having a raceway surface in an outer face;

an outside member having a raceway surface opposite to the raceway surface of the inside member and disposed in the outside of the inside member; and rolling elements rollably placed between both raceway surfaces, wherein at least one of base materials of the raceway surface of the inside member, the raceway surface of the outside member and the rolling elements has a surface made of a steel, and a diamond like carbon film is formed on the base material surface made of steel, and wherein the diamond like carbon film has an intermediate layer having a metal component, a composite layer having a carbon component and a carbon layer, wherein the composite layer is an oblique layer continuously changing compositions from the intermediate layer toward the carbon layer, and wherein a plastic deformation hardness of the diamond like carbon film is 8 to 37 GPa.

In the conventional rolling sliding members, the DLC films formed on surfaces of bearing steels or stainless steels are broken owing to the contact stress between the rolling elements and the raceway surface, and as breaking factors, there are taken up two points of "the DLC film cannot follow deformation of the base material" and "the physical properties (linear thermal expansion coefficient) of the intermediate layer and the carbon layer are different".

A cause of the former of "the DLC film cannot follow deformation of the base material" is because the equivalent elastic modulus of the base material is smaller than that of the DLC film, so that when loading the stress, the base material deforms prior to the deformation of the DLC film and then the DLC film is broken.

It is accordingly necessary that the plastic deformation hardness of the DLC film is higher (8 to 37 GPa) and the equivalent elastic modulus is smaller than that of the base material. Thereby, since the DLC film itself is easy to deform following the base material, the strength is improved until a value of stress up to a range of plastic deformation, and rupture strength of the DLC film becomes strong against the repeated stress.

As to the latter, since the physical properties of the intermediate layer and the carbon layer are different, an interface between the intermediate layer and the carbon layer is easy to peel, but if continuously changing ratios of the composition of the intermediate layer to that of the carbon layer and forming an oblique layer (composite layer) between the intermediate layer and the carbon layer, it is possible to make such a DLC film which is strong to expansion and contraction caused by temperature change owing to frictional abrasion and is high in the mechanical strength.

Herein, the metallic components of the intermediate layer are not especially limited as far as being similar in the components contained in the steel of the base material and in atomic radii of the composing elements, and for example, Cr, W, Ti, Si, Ni, Fe, or Co are taken up. Among them, in case the base material is the stainless steel or the bearing steel, Cr or Ni are desirable for the intermediate layer, and depending on the components of the steel, Si, W, or Co may be appropriately selected.

As processes of forming the DLC film, enumerated are an unbalanced magnetron spattering process, a pulse laser arc deposition process, or a plasma CVD, and desirable is the unbalanced magnetron spattering process which is easy to independently control the equivalent elastic modulus and the plastic deformation hardness.

To attain the third object, according to a fourth aspect of the invention, there is provided a rolling bearing for high speed rotation, comprising:

an inner ring having an outer raceway surface;

an outer rings having an inner raceway surface;

a plurality of rolling elements are disposed between the inner and outer rings; and a retainer supporting the plurality of rolling elements, wherein at least one of base materials of the outer raceway surface of the inner ring, the inner raceway surface of the outer ring, the rolling elements, and the retainer is formed at the surface thereof with a steel, and a diamond like carbon film is formed on the base material surface, wherein the diamond like carbon film has an intermediate layer having a metal component, a composite layer having a carbon component, and a carbon layer, wherein the composite layer is an oblique layer continuously changing compositions from the intermediate layer toward the carbon layer, and wherein a plastic deformation hardness of the diamond like carbon film is 8 to 35 GPa.

Further, according to the rolling bearing of the fourth aspect, an equivalent elastic modulus of the diamond like carbon film may be set to be 80 to 280 GPa. In addition, a thickness of the diamond like carbon film may be 0.1 to 5 μm. Moreover, the rolling bearing may be served under one of minor oil lubrication circumstances such as a grease-lubrication, an oil air-lubrication, an oil mist-lubrication or a direct jetting minor oil-lubrication.

Further, in the rolling bearing of the fourth aspect, the blank material of the rolling elements may be made of ceramics. And, the base material of the outer ring and/or the inner ring may be made of a steel for heat resistant bearing. In addition, the rolling bearing may be served as a main shaft of a machine tool.

Further, in order to attained the fourth object of the invention, according to a fifth aspect of the invention, there is provided a rolling sliding member adapted to causing a rolling contact or a sliding contact relative to an opposite member, comprising:

a base material made of steel; and a diamond like carbon layer formed on the contacting face with the opposite member and having a lubricating property, the diamond like carbon layer including:

a metallic layer made of two kinds or more of metals of Cr, W, Ti, Si, Ni, and Fe;

a composite layer made of the metal and carbon; and a carbon layer made of carbon, wherein the diamond like carbon layer is arranged in the order of the carbon layer, the composite layer and the metallic layer from a surface side.

Such a rolling sliding member interposes the composite layer and the metallic layer between the steel as the base material and the carbon layer, so that adhesiveness is superior between the diamond like carbon (DLC layer) having the excellent lubricating property and the steel as the base material.

In particular, if the composite layer has a structure gradually increasing the rate of carbon from the metallic layer side toward the carbon layer side, the adhesiveness is made more excellent.

Further, since the composite layer is composed of carbon and the metal of two kinds or more of Cr, W, Ti, Si, Ni, and Fe, the brittleness of the metallic carbide formed with the metal and carbon is smaller than that of a composite layer composed of one kind of metal and carbon. Thus, as the brittleness of the composite layer is small, the DLC film is less to be broken even if being loaded with repeated stress or shearing force.

It is preferable that an equivalent elastic modulus of the DLC film is determined to be set to be 80 to 240 GPa, preferably, 100 to 240 GPa. With this structure, the DLC has a smaller equivalent elastic modulus than that of the steel as the base material, so that the DLC film can deform when the repeated stress acts. As a result, the DLC film can follow the deformation of the base material, and the breakage of the DLC film is difficult to occur.

If the equivalent elastic modulus of the DLC is more than 240 GPa, the DLC film has a larger equivalent elastic modulus than that of the steel, and it is difficult for the DLC film to follow the deformation of the base material when the repeated stress acts on, and the breakage of the DLC film is easy to occur. On the other hand, being less than 80 GPa, the hardness of the DLC film is low, and abrasion is easy to occur.

It is preferable to form the DLC film by a sputtering using an unbalanced magnetron sputter. Such physical film forming process is suited to parts for composing units on which large contact stress acts such as the rolling apparatus in comparison with a CVD, a plasma CVD, an ion beam forming process or an ionization vapor deposition.

Accordingly, since the rolling sliding member according to the fifth aspect has the lubricating film (DLC film) less to be broken even if a large contact stress acts on, it is possible to suitably apply to members composing units (e.g., the rolling apparatus) on which the large contact stress acts. In addition, having the excellent lubricating property, it can be suitably served under an oil free condition, and it is less to have abrasion and heat generation and has the strong and long life against the repeated stress.

A rolling apparatus according to the invention is provided with an inner member having a raceway surface on an outer face, an outer member having on an inner face a raceway surface in opposition to the raceway surface of the inner member and being disposed outside of the inner member, and rolling elements rotatably disposed between both raceway surfaces, wherein at least one of the inner member, the outer member and the rolling elements is obtained by the rolling sliding member as set forth in the fifth aspect of the invention.

With this structure, as the DLC film of the rolling sliding member composing the rolling apparatus is difficult to be broken by large contact stress, it has a long life even if being used under the condition of acting the large contact stress or under the oil free condition.

Incidentally, as the rolling apparatus of the invention, there are the rolling bearing, linear guide apparatus, ball screw or direct-acting bearing.

The inner member means an inner ring in case the rolling apparatus is the rolling bearing, a guiding rail in case of the linear guide bearing, a screw shaft in case of the ball screw, and a shaft in case of the direct-acting bearing, respectively. The outer member means an outer ring in case the rolling apparatus is the rolling bearing, a slider in case of the linear guide bearing, a nut in case of the ball screw, and an outer cylinder in case of the direct-bearing, respectively.

The rolling member in the invention can be also used as the sliding member, and herein the sliding member is meant by a member moving on a surface having a sliding resistance, and mechanical parts doing the contact movement in a cylindrical, spherical and plane faces. A cam and cam follower composing an engine of a vehicle, a fuel jetting apparatus, a friction plate, clutch parts, and a retainer of the bearing are taken up.

Further, in order to attain the fifth object, according to a sixth aspect of the invention, there is provided a rolling sliding member, comprising:

an inside member having a raceway surface in an outer face;

an outside member having on an inner face, a raceway surface opposite to the raceway surface of the inside member and being disposed in the outside of the inside member; and rolling elements rotatably placed between both raceway surfaces, wherein at least one of base materials of the raceway surface of the inside member, the raceway surface of the outside member and the rolling elements is made of steel at a surface thereof, and a diamond like carbon film is formed on a surface of the base material, and wherein the surface of the base material made of steel comprises a retained austenite of 0 vol % to 6 vol % and has hardness of Hv600 to Hv740.

In rolling sliding member of the sixth aspect, the film of diamond like carbon may be formed by using an unbalanced magnetron sputter.

Accordingly, as the retained austenite existing in the surface of the base material to be formed with the DLC film is small, even if the temperature forming the DLC film is high, the amount of the retained austenite to be decomposed is restrained, so that a desired dimensional stability is secured and the adhesiveness of the formed DLC film is increased.

A reason for determining the retained austenite to be 0 to 6 vol % is why if limiting in this range, the dimension is stable with respect to the conventional DLC treatment in comparison with the retained austenite of more than 6 vol %, and the life of the DLC film is by far lengthened (see FIG. 29).

That is, the reason for setting the retained austenite to be 6 vol % or less is why if being more than 6 vol %, the dimension changes more than a predetermined change, and the adhesiveness of the DLC film or the precision of the bearing are caused to decrease. The retained austenite is desirable to be 0 vol %, but the hardness is necessary to be Hv600 or higher.

When hardness in the surface of the base material is low, a bad influence occurs in the adhesiveness of the formed DLC film, but the invention secures the sufficient hardness from Hv600 to Hv740 in the base material surface, so that the adhesiveness between the formed DLC film and the base material.

Herein, the lower limit of the surface hardness is Hv600 because it has been confirmed that the desired adhesiveness is secured when being more than Hv600. The higher the surface hardness is, the better it is, but if a heating treatment is carried out at temperature making a surface hardness exceed Hv740, the retained austenite is probable to go over 6 vol %, and so the upper limit is set to be Hv740 for securing the dimensional safety with respect to the existing DLC treatment.

Incidentally, it has been confirmed that the DLC easily peels from the base material if being less than Hv600.

The DLC film to be formed comprises three layers of a metallic layer made of one kind or plural kinds of metals of Cr, W, Ti, Si, Ni, Mo, V, Al, Mn, Nb, and Fe, a composite layer made of metal and carbon, and a carbon layer made of carbon, and it is preferable to arrange in the order of the carbon layer, the composite layer and the metallic layer from the surface of the DLC film. In this case, there intervene the composite layer and the metallic layer between the steel as the base material and the carbon layer as the surface, so that the adhesiveness is superior between the surface of the DLC film excellent in the lubricating property and the bearing steel as the base material.

In particular, if the composite layer is composed to gradually increase the rate of carbon from the side of the metallic layer toward the side of the carbon layer, the adhesiveness is more excellent. That is, since the physical properties of the intermediate layer and the carbon layer are different, an interface between the intermediate layer and the carbon layer is easy to peel, but if continuously changing ratios of the composition of the intermediate layer vis. that of the carbon layer so as to form an oblique layer (composite layer) between the intermediate layer and the carbon layer, it is possible to make such a DLC film which is strong to expansion and contraction caused by temperature change owing to frictional abrasion and is high in the mechanical strength.

If the composite layer is composed of metal and carbon of two kinds or more of Cr, W, Ti, Si, Ni, Mo, V, Al Mn, Nb, and Fe, the brittleness of the metallic carbide formed with the metal and carbon is smaller than that of a composite layer composed of one kind of metal and carbon. That is, as the brittleness of the composite layer is controlled to be small, the DLC film is less to be broken even if being loaded with repeated stress or shearing force. Herein, as the metallic components of the intermediate layer, no especial limitation is made as far as elements in the steel of the base material or atomic radii are similar, and Cr, W, Ti, Si, Ni and Fe are taken up as the metallic components of the intermediate layer. If the base material is the stainless steel or the bearing steel, Cr and Ni are desirable, and depending on the containing components of the steel, Si, W, Co may be appropriately selected.

In case the DLC film is formed by the unbalanced magnetron spatter process (hereinafter referred to as "UBMS process"), as the processing temperature is comparatively low as 150 to 250° C., the decomposition of the retained austenite owing to the film processing heat is controlled, and the adhesiveness of the formed DLC film is improved.

As the thickness of the DLC film, if the whole of the metallic layer—the composite layer—the carbon layer is in a range of from 0.2 μm to 5 μm, it is useful for the rolling sliding member.

For controlling the retained austenite in the base material surface to be 6 vol % or less, it may be realized by tempering the steel at high temperatures as 200° C. or higher but 280° C. or lower.

Further, in order to attain the sixth object, according to a seventh aspect of the invention, there is provided a rolling member comprising:

a base material; and a lubricating layer having a lubricating property on a surface of the base material, wherein the lubricating layer has a diamond like carbon layer and a fluorine compound layer, the fluorine compound layer being disposed on an uppermost surface, and wherein the diamond like carbon layer comprises a metallic layer made of at least one kind of metals of Cr, W, Ti, Si, Ni and Fe, a composite layer made of the metal and carbon, and a carbon layer made of carbon.

Further, the rolling sliding member according to the seventh aspect of the invention may be formed that the rate of carbon in the composite layer gradually increases from the metallic layer side toward the carbon layer side.

Besides, an equivalent elastic modulus of the diamond like carbon may be set to be 80 to 240 GPa.

In addition, the diamond like carbon may be formed by using an unbalanced magnetron sputter.

The above mentioned diamond like carbon layer is excellent in slidability and has hardness equal to diamond. The fluorine compound layer has an excellent effect imparting lubricating property. Thus, owing to a synergistic effect of the diamond like carbon layer and the fluorine compound layer, the rotating torque and the sliding resistance are low, and even if the surface of the rolling members enter into the boundary lubrication, as there is no contact of metal-to-metal, it is possible to prevent occurrence of abrasion and fretting.

The diamond like carbon layer includes carbon as a main component, and may include metallic or non-metallic elements as other material. The hardness is 15 GPa or more measured by a micropenetrometer (made by Fisher Inc) and the thickness is preferably 0.8 to 8 µm, and more preferably 1 to 5 µm.

If the hardness of the diamond like carbon is 15 GPa or more, even if the lubricating layer vanishes so that the diamond like carbon and the metal-made opposite member contact with each other, the diamond like carbon is less to be worn. If being less than 15 GPa, it is scraped by abrasive of the opposite member.

Further, if the thickness of the diamond like carbon is out of the above mentioned range, there occur problems that a seizure is caused or a self-destruction thereof happens.

The diamond like carbon layer may be formed on the metal surface by use of hydrocarbon based gas, sintered carbon or graphite as plasma source of carbon or steam source through a film-forming process such as a sputtering process, plasma CVD process, or ion plating process.

The diamond like carbon layer comprises three layers of a metallic layer made of at least one kind of metals of Cr, W, Ti, Si, Ni and Fe, a composite layer made of metal and carbon, and a carbon layer made of carbon, and these three layers are arranged in the order of the metallic layer, the composite layer and the carbon layer from a core portion.

As a substance composing the fluorine compound layer, a compound having perfluoroalkyl group is taken up.

The diamond like carbon layer gives the excellent slidability to the surface of the rolling member, and is less to be broken in the rolling surface, so that the contact of metal-to-metal is avoided under the condition of the boundary lubrication, and occurrences of seizure and abrasion can be prevented. The metallic layer made of at least one kind of metals of Cr, W, Ti, Si, Ni and Fe has a high affinity with the metal as the base material, so that the adhesiveness between the diamond like carbon layer and the base material can be increased.

For forming the composite film of the metal and carbon, if a stoichometric ratio of the metal and carbon (titanium is most preferable) is controlled by the film-forming process, a physical property in the surface of the equivalent elastic modulus being 80 to 240 GPa is obtained by a combination with the diamond like carbon. The compound layer thus controlled in the composition is most suitable as the composite layer of the diamond like carbon.

For the composite layer made of the metal and carbon, it is sufficient that a gas component as nitrogen is introduced when film-forming for reacting with the metal for producing the compound of the metal and the gas component.

The above mentioned equivalent elastic modulus is difficult to be directly measured since the film is thin, and is expressed with a Young's rate obtained by calculation of depth of indentation when an indenter of the micro penetrometer is inserted and the amount of elastic deformation. A property of the equivalent elastic modulus of the composite layer of metal as titanium and carbon can be changed by the film-forming condition. For example, in case the compound layer is formed by the spattering process, the property of the titanium compound layer can be changed by changing temperatures of a material to be processed, a flowing amount of nitrogen gas, or a treating time.

The composite layer may be formed by the ion plating process or the spattering process, and the spattering process is desirable since the physical property of the surface can be independently controlled by the titanium layer and the carbon layer.

The diamond like carbon layer can be brought about with the lubricating effect if coefficient of the dynamic friction is 0.2 or less under a condition of existence of no lubricant, and the diamond like carbon layer preferably has the hardness equivalent to or more than the above mentioned composite layer.

The diamond like carbon layer is formed by the spattering process, the ion plating process or the CVD process, and it is preferable to adopt a process enabling to more reduce the sliding resistance on the surface.

The composite layer and the diamond like carbon layer are not especially limited as to the thickness, but for delaying progress of fatigue failure in the rolling member, it is desirable that the thickness of the composite layer is 0.1 to 5 µm and the thickness of the diamond like carbon layer is 0.8 to 8 µm (more preferably 1 to 5 µm).

A rolling apparatus according to the invention is a rolling apparatus which is provided with an inner member having a raceway surface on an outer face, an outer member having, on an inner face, a raceway surface in opposition to the raceway surface of the inner member and being disposed outside of the inner member, and a plurality of rolling elements rotatably disposed between both raceway surfaces, and characterized in that at least one of the inner member, the outer member and the rolling elements is rendered to be the rolling sliding member as set forth in the seventh aspect.

Further, in order to attain the seventh object, according to an eighth aspect of the invention, there is provided a rolling sliding member adapted to causing a rolling contact or a sliding contact relative to an opposite member, comprising:

a base material made of steel;

a diamond like carbon layer formed on the contacting face with the opposite member and having a lubricating property, the diamond like carbon layer including:

a metallic layer made of at least one kind of metal;

a first composite layer having the metal and carbon;

a carbon layer made of carbon;

a second composite layer having a fluorine compound and carbon; and a fluorine composite layer on an uppermost surface.

Herein, Cr, W, Ti, Si, Ni and Fe are used as metallic components of the metallic layer, and among them, one or two kinds or more may be appropriately selected in response to kinds of the base material, and particularly preferable are two kinds of Cr and W.

The arrangement of the layers composing the diamond like carbon layer (DLC layer) is preferably in the order of the fluorine composite layer, the second composite layer, the carbon layer, the first composite layer and the metallic layer from the surface side toward a base material.

According to this, the DLC layer is furnished on the uppermost surface with the fluorine compound layer, thereby enabling to form the excellent DLC layer strong in a shearing resistance and largely increase the lubricating property. In addition, the first composite layer and the metallic layer intervene between the steel as the base material and the carbon layer, adhesiveness is made superior between the DLC layer having the excellent lubricating property and the steel as the base material.

Thereby, it is possible to form the DLC layer having the lubricating film which is less to be destructed even with a large contacting stress and the uppermost lubricating layer, so that the DLC layer may be suitably applied to members composing such units receiving large contacting stress (for example, the rolling apparatus).

Further, having the excellent lubricating property, the DLC layer enables to suitably serve under the oil free condition, and is less to cause abrasion or generation of heat and is strong against repeated stress, and has a long life.

In particular, if making the ratio of carbon in the first composite layer gradually increase from the metallic layer side toward the carbon layer side, the adhesiveness between the DLC layer and the steel of the base material can be made more excellent. If making the ratio of carbon in the second composite layer gradually decrease from the carbon layer side toward the fluorine composite layer side, the adhesiveness of the fluorine compound layer can be made more excellent.

It is preferable that an equivalent elastic modulus of the diamond like carbon layer is set to be 80 to 240 GPa.

Thereby, as the DLC has a smaller equivalent elastic modulus than that of the base material steel, the DLC layer can deform when the repeated stress acts. As a result, the DLC layer follows the deformation of the base material, and the DLC layer is difficult to be broken.

If the equivalent elastic modulus of the DLC is more than 240 GPa, the DLC film has a larger equivalent elastic modulus than that of the steel, and it is difficult for the DLC film to follow the deformation of the base material when the repeated stress acts on, and the breakage of the DLC film is easy to occur. On the other hand, being less than 80 GPa, the hardness of the DLC film is low, and abrasion is easy to occur.

Further, it is preferable to form the DLC film by using an unbalanced magnetron sputter.

The UBMS apparatus is attached with a plurality of targets to be used for spattering, and as the spattering electric sources of the respective targets are independently controlled, whereby the spattering efficiency of the respective elements may be arbitrarily controlled, the UBMS apparatus is suited to the film-forming.

For example, in the process of forming the first composite layer and the carbon layer, while decreasing the electric power of the spatter source (DC source) of the metal targets, the power of the spatter source (DC source) of the carbon target is increased (at this time, negative bias voltage is supplied to the roller sliding member).

In the process of forming the fluorine compound layer and the second composite layer, while decreasing the power of the electric source (DC source) of the carbon target, the power of the spatter source (DC source) is increased using ethylene tereflouride resin as a target imparted with, e.g., electric conductivity (at this time, negative bias voltage is supplied to the roller sliding member).

Such physical film forming process is suited to parts for composing units on which large contact stress acts as the rolling apparatus in comparison with a CVD, a plasma CVD, an ion beam forming process or an ionization vapor deposition. This process is the most suited technique of making a multi-layer while changing the oblique composition.

By controlling the bias voltage of the material to be processed, the thickness of the film can be controlled through the ion assist effect and the elastic modulus can be also controlled. It is therefore possible to obtain a physical property of low elasticity and large surface hardness.

Depending on the kind of the target, it is also possible to produce functional composite layers of optional thickness, hardness and elasticity made of metal, carbon and lubricating resin.

DETAILED DESCRIPTION OF THE PREFERRED EMBODIMENTS

A description will be given of embodiments for carrying out the invention with reference to the accompanying drawings.

Figure 1:
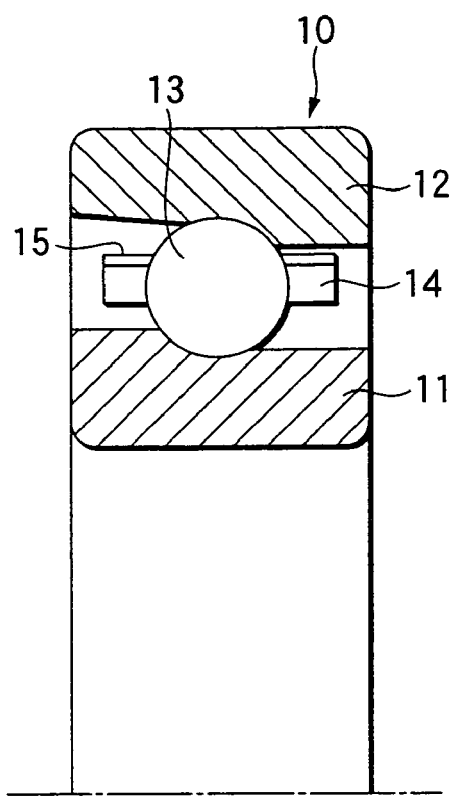
FIG. 1 is a view showing a first embodiment of applying the invention to the ball bearing.

FIG. 1 is a view showing an embodiment of applying the invention to a ball bearing, and as illustrated in the same, the embodied ball bearing 10 comprises an inner ring 11 mounted on an shaft to be supported thereby, and an outer ring 12 on the outer peripheral face of the inner ring 11, a plurality of balls rolling 13 as contacting with the inner peripheral face of the outer ring 12 and the outer peripheral face of the inner ring 11 at surfaces thereof, and a retainer 14 supporting these balls at even intervals along the circumferences of the inner ring 11 and the outer ring 12.

Of these structural members, the inner ring 11, the outer ring 12 and the balls 13 are formed with a metal, for example, the bearing steel (linear thermal expansion coefficient: $12.5 \times 10^{-6}/°C$.) or a stainless steel (the ball 13 may be made of ceramics as silicon nitride), while the retainer 14 is formed with heat resistant resins as polyether ether ketone (PEEK), poly-phenylene sulfnoid (PPS), thermoplastic polyimide resin, phenol resin, polyamide, or nylon. The retainer 14 has the DLC film 15 of the sliding resistance-reducing film on the outer peripheral face. The DLC film 15 is formed on the outer peripheral face of the retainer 14 through, e.g., the plasma CVD (Chemical Vapor Deposition), the unbalanced spattering process, the vacuum arc discharge PVD (Physical Vapor Deposition), the ion beam forming process, or the ionization vapor deposition. The thickness is 0.5 to 10 μm, preferably 1 to 5 μm, and more preferably 1 to 3 μm. In addition, the DLC film 15 has surface hardness of Hv800 to 3000 at an indentation load of 20 mN, and has the friction coefficient of less than 0.2.

In the thus structured ball bearing 10, since the DLC film is formed on the outer peripheral face of the retainer 14, the sliding resistance (frictional resistance) produced at the sliding parts between the outer ring 12 and the retainer 14 is reduced in comparison with a ball bearing having no DLC film on the outer peripheral face of the retainer 14, and the ball bearing is enabled to suitably serve not causing seizure even under circumstances ready for being the boundary lubrication, and the seizure resistance may be attempted to increase.

The retainer 14 is made of the heat resistant resin as PEEK or PPS, and has specific gravity smaller than that of a retainer made of, for example, the bearing steel, the retainer 14 can be avoided from thermal damages by centrifugal force, and at the same time, as this is formed on the outer peripheral face of the retainer 14 with the good DLC film 15, so that this effect becomes larger.

By the way, in the above mentioned embodiment, the DLC film 15 is formed on the outer peripheral face of the retainer 14 for increasing the seizure resistance, and the same effect is also obtained by forming the DLC film 15 on the inner peripheral face of the outer ring 12, and further, if forming the DLC film on the inner peripheral face of the retainer 14 or on the outer peripheral face of the inner ring 11, the seizure resistance is more increased. The position of forming the DLC film is not limited to the outer peripheral face of the retainer 14, but may be at edge faces, pockets of the retainer 14 or also on the inner peripheral face.

In the above embodiment, the retainer 14 is formed with the heat resistant resin as PEEK or PPS, and materials for composing the retainer are enough with composite materials comprising the heat resistant resins as PEEK and reinforcing fibers as a glass fiber or carbon fiber, and if employing these composite materials, mechanical strength of the retainer 14 can be heightened. In addition, if the DLC film 15 is formed on the outer peripheral face of the retainer 14 formed with a light metal of specific gravity being less than 3 (for example, magnesium alloy), the same effect as in the above embodiment may be obtained.

When forming the DLC film on the outer peripheral face of the retainer 14, the intermediate layer of Ti or Si may be formed between the outer peripheral face of the retainer 14 and the DLC film 15. By forming the intermediate layer of Ti or Si between the outer peripheral face of the retainer 14 and the DLC film 15, it is possible to desirably form the DLC film 15 on the outer peripheral face of the retainer 14.

Next, a second embodiment of the invention will be explained, referring to FIG. 2.

Figure 2:
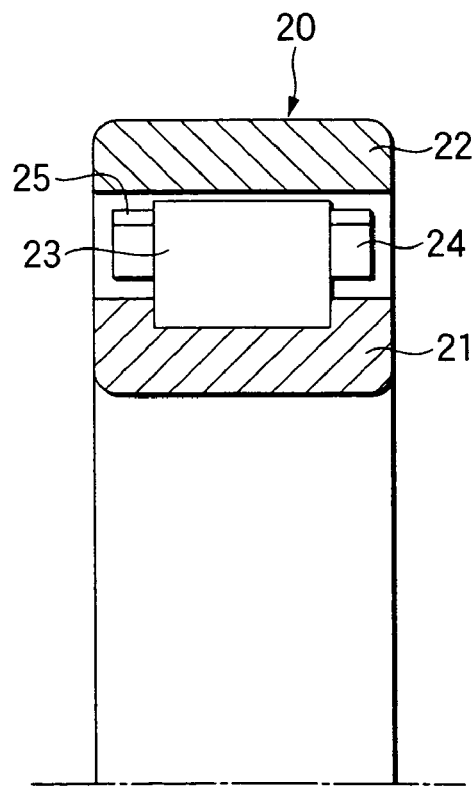
FIG. 2 is a view showing a second embodiment of applying the invention to the roller bearing.

FIG. 2 is a view showing an embodiment of applying the invention to a roller bearing, and as illustrated in the same, the embodied roller bearing 20 comprises an inner ring 21 mounted on an shaft to be supported thereby, and an outer ring 22 on the outer peripheral face of the inner ring 21, a plurality of rollers 23 while contacting with the inner peripheral face of the outer ring 22 and the outer peripheral face of the inner ring 21 at surfaces thereof, and a retainer 24 supporting these rollers at even intervals along the circumferences of the inner ring 21 and the outer ring 22.

Of these structural members, the inner ring 21, the outer ring 22 and the rollers 23 are made of a metal, for example, the bearing steel or the stainless steel (the rollers 23 may be made of ceramics as silicon nitride), while the retainer 24 is formed with the light metal of specific gravity being less than 3 (for example, magnesium alloy). The retainer 24 has the fluorine-contained resin coating film 25 as the sliding resistance-reducing film on the outer peripheral face. The fluorine-contained resin coating film 25 is formed by performing the surface preparation of the shot peening, e.g., on the outer peripheral face of the retainer 24, followed by forming thereon a coating layer of tetrafluoroethylene (PTFE) and molybdenum disulfide while using the heat resistant resin such as polyamideimide or epoxy resin, serving as a binder, and heating the coating layer at about 200 to 250° C., resulting in the film thickness being 2 to 30 μm, preferably 5 to 20 μm.

In the thus structured roller bearing 20, since the fluorine-contained resin coating film 25 is formed on the outer peripheral face of the retainer 24, the sliding resistance (frictional resistance) produced at the sliding parts between the outer ring 22 and the retainer 24 is reduced in comparison with a roller bearing having no fluorine-contained resin coating film on the outer peripheral face of the retainer 24, and the roller bearing is enabled to suitably serve not causing seizure even under circumstances ready for becoming the boundary lubrication, and the seizure resistance may be attempted to increase.

Further, since the retainer 24 is formed with the light metal of specific gravity being less than 3, its weight can be lightened and centrifugal force generated at high speed rotation can be reduced in comparison with the retainer formed with an iron or a copper alloy.

By the way, in the above mentioned embodiment, the fluorine-contained resin coating film 25 is formed on the outer peripheral face of the retainer 24 for increasing the seizure resistance, and the same effect is also obtained by forming the fluorine-contained resin coating film 25 on the inner peripheral face of the outer ring 22, and further, if forming the fluorine-contained resin coating film 25 on the inner peripheral face of the retainer 24 or on the outer peripheral face of the inner ring 21, the seizure resistance can be more increased. The position of forming the fluorine-contained resin coating film 25 is not limited to the outer peripheral face of the retainer 24, but may be at edge faces, pockets of the retainer 24 or also on the inner peripheral face thereof.

In the above embodiment, the retainer 24 is fabricated with the light metal of specific gravity being less than 3, and may be made of, e.g., the heat resistant resin as PEEK or PPS. When forming fluorine-contained resin coating film 25 on the outer peripheral face of the retainer 24, it is sufficient to plate the metallic solid lubricant layer as Ag or Sn between the outer peripheral face of the retainer 24 and the fluorine-contained resin coating film 25. By forming the metallic solid lubricant layer as Ag or Sn between the outer peripheral face of the retainer 24 and the fluorine-contained resin coating film 25, the seizure resistance can be more increased.

Figure 3:
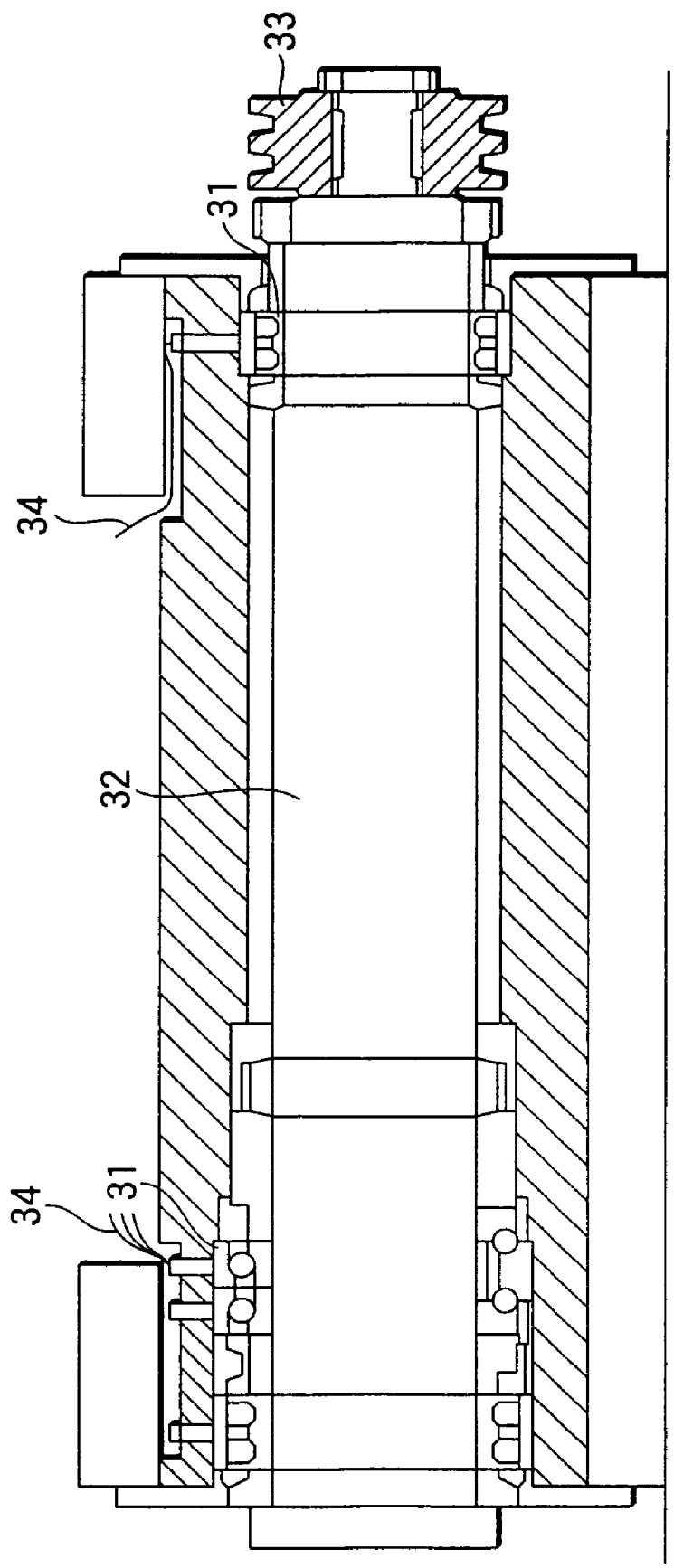
FIG. 3 is a view showing the testing apparatus to be used to seizure tests of the rolling bearing.

In the ball bearing shown in FIG. 1, with respect to the seizure resistibility in cases of the sliding resistance-reducing film of the DLC film formed on the outer peripheral face of the retainer 14 and not formed thereon, tests were made with a tester of FIG. 3 on an angular ball bearing of an inner diameter being 65 mm, an outer diameter being 120 mm and width being 23 mm, and the test results are shown in Tables 1 and 2. Table 1 shows the results tested under conditions of the oil air-lubrication (0.08 cc/12 min, the spindle oil), constant pressure preload: 147 N, and rotation speed: 15000 rpm, while Table 2 shows the results tested under conditions of the grease-lubrication (Isoflex NBU15), constant pressure and preload: 196 N, and rotation speed: 12000 rpm. Numeral 31 in FIG. 3 designates the angular ball bearing as a test sample, 32: a rotating shaft, 33: a pulley, and 34: a thermocouple.

TABLE 1

|  | Qualities of Retainer | Process | Film thickness [μm] | Rising temperature at 15000 rpm Δd [° C.] | Limit of rotation speed [rpm] | Breakage abrasion of retainer |
|---|---|---|---|---|---|---|
| Example 1 | PEEK | DLC | 1 | 31 | 18000 | Partial abrasion |
| Example 2 | Mg alloy | DLC | 3 | 25 | 19500 | Non |
| Example 3 | PEEK | Fluorine resin | 10 | 26 | 19000 | Partial abrasion |
| Example 4 | Mg alloy | Fluorine resin | 15 | 28 | 17500 | Non |
| Comparative Example 1 | PEEK | Non | — | 34 | 16000 | Breakage |
| Comparative Example 2 | Mg alloy | Non | — | 36 | 16500 | Breakage |

TABLE 2

| | Qualities of Retainer | Process | Film thickness [μm] | Rising temperature at 12000 rpm Δd [° C.] | Limit of rotation speed [rpm] | Breakage abrasion of retainer |
|---|---|---|---|---|---|---|
| Example 1 | PEEK | DLC | 1 | 25 | 16000 | Partial abrasion |
| Example 2 | Mg alloy | DLC | 3 | 23 | 17500 | Non |
| Example 3 | PEEK | Fluorine resin | 10 | 22 | 16000 | Partial abrasion |
| Example 4 | Mg alloy | Fluorine resin | 15 | 25 | 15500 | Partial abrasion |
| Comparative Example 1 | PEEK | Non | — | 30 | 14000 | Breakage |
| Comparative Example 2 | Mg alloy | Non | — | 34 | 12500 | Breakage |

In Tables 1 and 2, Example 1 embodies the ball bearing formed with the DLC film of 1 μm thickness on the outer peripheral face of the retainer 14 fabricated with polyether ether ketone. The 30% carbon fiber is compounded in the polyether ether ketone material for heightening strength of the retainer. A necessary position is the outer peripheral face of the retainer, and since this embodiment did not take a masking, the DLC film is formed at the edge faces, pockets and inner peripheral face. The DLC film was formed by a high vacuum arc discharge PVD apparatus made by DIARC Inc. (Finland). A film forming process is not especially limited, and may depend on, for example, a hot-cathode plasma CVD apparatus with a pulse source enabling to form the DLC film on an insulating material. A surface hardness measured with an indentation load of 20 mN by a penetrometer is 2600 Hv in Examples where the film was formed through the high vacuum arc discharge PVD apparatus, and is ordinarily 2200 Hv in case of using the hot-cathode plasma CVD apparatus.

In this Example, the inner, outer rings and the rolling elements were made of the bearing steel, and it is also possible to use a stainless steel as SUS 440C for the inner ring and the outer ring and the ceramics as silicon nitride for the rolling elements.

Example 2 embodies the ball bearing formed by the plasma CVD with the DLC film of 3 μm thickness on the outer peripheral face of the retainer 14 formed with the Mg alloy. Ti and Si intermediate layers of about 0.4 μm thickness were formed by the PVD, and a methane gas was made a plasma by an ion gas into the chemical vapor deposition. The surface hardness by the penetrometer was 2100 Hv.

Example 3 embodies the ball bearing formed with the fluorine-contained resin coat film of 10 μm thickness on the outer peripheral face of the retainer 14 fabricated with polyether ether ketone. The retainer of polyether ether ketone was in advance roughened on the surface by the shot peening, heated to 70° C., formed on the outer peripheral face of the retainer with the coat film of ethylene fluoride as a binder of polyamideimide by the spray gun while evenly rotating the retainer, and heated at 220° C. for 1 hour for forming the sintered film of 10 μm thickness.

Example 4 embodies the ball bearing formed with the fluorine-contained resin coat film of 15 μm thickness on the outer peripheral face of the retainer 14 fabricated with Mg alloy. The retainer of Mg alloy was in advance roughened on the surface by the shot peening, heated to 70° C., formed on the outer peripheral face of the retainer with the coating film of ethylene fluoride by making polyamideimide as a binder through the spray gun while evenly rotating the retainer, and heated at 220° C. for 1.5 hour for forming the sintered film of 15 μm thickness.

Comparative Example 1 is a conventional example of the ball bearing where the retainer 14 was formed with polyether ether ketone, and Comparative Example 2 is a conventional example of the ball bearing where the retainer 14 was formed with Mg alloy.

As shown in Tables 1 and 2, comparing the case (Examples 1 to 4) where the sliding resistance-reducing film of the DLC film was formed on the outer peripheral face of the retainer 14 with the case of not formed thereon (Comparative Examples 1 and 2), temperatures of the outer ring 12 do not rise so much. The limit of rotation speed causing the seizure goes up about 10 to 20% in comparison with Comparative Examples 1 and 2. Accordingly, by forming the sliding resistance-reducing film of the DLC film or the fluorine-contained resin coating film on the outer peripheral face of the retainer 14, the limit of rotation speed of the bearing goes up comparing with the case of not formed thereon, so that the seizure resistance may be attempted to increase.

In the roller bearing shown in FIG. 2, with respect to the seizure resistibility in cases of the sliding resistance-reducing film of the DLC film formed on the outer peripheral face of the retainer 24 and not formed thereon, tests were made by use of a cylindrical roller bearing of designation number: N1014 (inner diameter: 70 mm, outer diameter: 110 mm and width: 20 mm). The test results are shown in Tables 3 and 4. The tester of FIG. 3 was remodeled for coping with higher rotation speed. Table 3 shows the results tested under conditions of the oil air-lubrication (0.08 cc/12 min, the spindle oil), constant pressure preload: 147 N, and rotation speed: 25000 rpm, while Table 4 shows the results tested under conditions of the grease-lubrication (Isoflex NBU15), constant pressure preload: 196 N, and rotation speed: 15000 rpm.

TABLE 3

| | Qualities of Retainer | Process | Lubricant | Film thickness [μm] | Rising temperature Δd [° C.] |
|---|---|---|---|---|---|
| Ex. 5 | PEEK | DLC | Oil air | 1 | 29 |
| Ex. 6 | Mg alloy | DLC | Oil air | 3 | 27 |
| Ex. 7 | PEEK | Fluorine resin | Oil air | 10 | 26 |
| Ex. 8 | Mg alloy | Fluorine resin | Oil air | 15 | 26 |

TABLE 3-continued

| | Qualities of Retainer | Process | Lubricant | Film thickness [μm] | Rising temperature Δd [° C.] |
|---|---|---|---|---|---|
| Com. Ex. 3 | PEEK | Non | Oil air | — | 34 |
| Com. Ex. 4 | Mg alloy | Non | Oil air | — | Rotation impossible |

Com. Ex.: Comparative Example

TABLE 4

| | Qualities of Retainer | Process | Lubricant | Film thickness [μm] | Rising temperature Δd [° C.] |
|---|---|---|---|---|---|
| Ex. 5 | PEEK | DLC | Grease | 1 | 34 |
| Ex. 6 | Mg alloy | DLC | Grease | 3 | 30 |
| Ex. 7 | PEEK | Fluorine resin | Grease | 10 | 29 |
| Ex. 8 | Mg alloy | Fluorine resin | Grease | 15 | 33 |
| Com. Ex. 3 | PEEK | Non | Grease | — | 36 |
| Com. Ex. 4 | Mg alloy | Non | Grease | — | 40 |

Com. Ex.: Comparative Example

In Tables 3 and 4, Example 5 embodies the roller bearing formed with the DLC film of 1 μm thickness on the outer peripheral face of the retainer 24 formed with polyether ether ketone. Example 6 embodies the roller bearing formed with the DLC film of 3 μm thickness on the outer peripheral face of the retainer 24 formed with Mg alloy. Example 7 embodies the roller bearing formed with the fluorine-contained resin coating film of 10 μm thickness on the outer peripheral face of the retainer 24 formed with polyether ether ketone. Example 8 embodies the roller bearing formed with the fluorine-contained resin coating film of 15 μm thickness on the outer peripheral face of the retainer 24 formed with Mg alloy. In addition, Comparative Example 3 is a conventional example of the roller bearing where the retainer 24 was formed with polyether ether ketone, and Comparative Example 4 is a conventional example of the roller bearing where the retainer 24 was formed with Mg alloy.

As shown in Tables 3 and 4, comparing the case (Examples 5 to 8) where the sliding resistance-reducing film of the DLC film was formed on the outer peripheral face of the retainer 24 with the case of not formed thereon (Comparative Examples 3 and 4), temperatures of the outer ring 22 do not rise so much. The limit of rotation speed causing the seizure goes up about 10 to 20% in comparison with Comparative Examples 3 and 4. Accordingly, by forming the sliding resistance-reducing film of the DLC film or the fluorine-contained resin coating film on the outer peripheral face of the retainer 24, the limit of rotation speed of the bearing goes up comparing with the case of not formed thereon, so that the seizure resistance may be attempted to increase.

Figure 4:
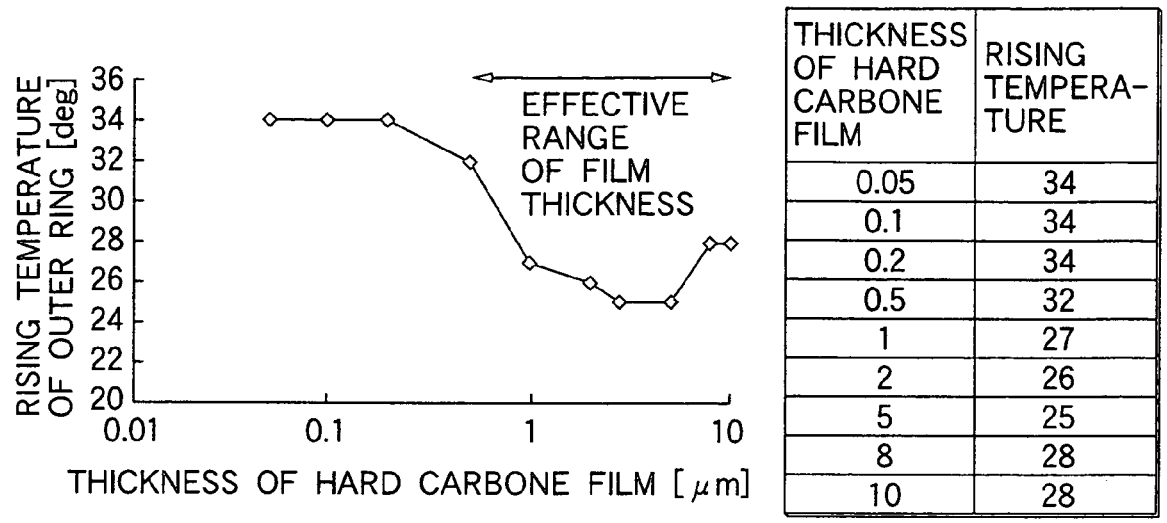
FIG. 4 is a graph showing the relationship between the thickness of the DLC film formed on the outer peripheral face of the retainer and the temperature of the outer ring.

FIG. 4 is a graph showing the relationship between the film thickness and the rising temperature of the outer ring while changing the thickness of the DLC film formed on the outer peripheral face of the retainer of Example 2. As shown in the same, if the DLC film is thicker than 10 μm, an internal stress thereof increases and generates a self-destruction, and the temperature of the outer ring rapidly goes up. If being thinner than 0.5 μm, the metal surface of the retainer is partially exposed, so that a sliding resistance-reducing function of the DLC film under a condition of a boundary lubrication decreases, and the temperature of the outer ring rapidly increases. Therefore, the thickness the DLC film formed on the outer peripheral face of the retainer is desirable within a range of 0.5 to 10 μm, preferably, 1 to 5 μm. From the viewpoint of a film forming time or control of gas pressure, the thickness is desirably 1 to 3 μm.

Figure 5:
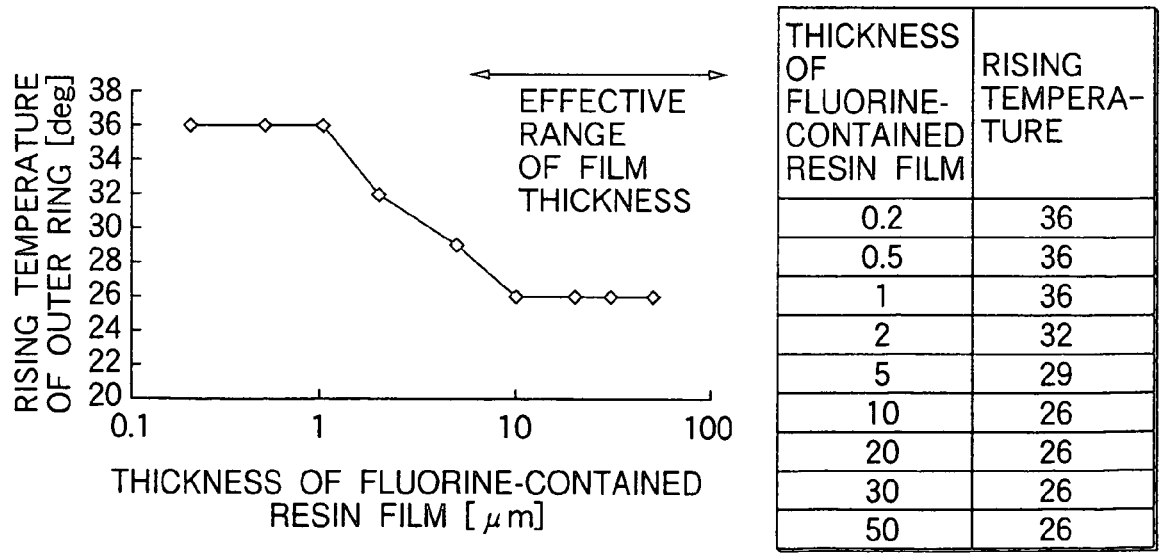
FIG. 5 is a graph showing the relationship between the thickness of the fluorine-contained resin coating film formed on the outer peripheral face of the retainer and the temperature of the outer ring.

FIG. 5 is a graph showing the relationship between the film thickness and the rising temperature of the outer ring while changing the thickness of the fluorine-contained resin coating film formed on the outer peripheral face of the retainer of Example 3. As shown in the same, if the thickness of the fluorine-contained resin coating film is thinner than 2 μm, the sliding resistance-reducing film function remarkably goes down and the temperature of the outer ring rapidly goes up. Further, if the fluorine-contained resin coating film is thicker than 30 μm, an effect of improving the performance is little, and unevenness is easy to happen in the film thickness. Accordingly, the thickness of the fluorine-contained resin coat film formed on the outer peripheral face of the retainer is desirable within a range of 2 to 30 μm, preferably, 5 to 20 μm.

As explained above, the rolling bearing according to the first and second embodiments of the invention is formed with the sliding resistance-reducing films on the outer peripheral face of the retainer or the inner peripheral face of the outer ring and/or the inner peripheral face of the retainer or the outer peripheral face of the inner ring, whereby the sliding resistance produced at the sliding parts between the outer ring and the retainer and/or the inner ring and the retainer is reduced by the sliding resistance-reducing films, so that the seizure by the frictional heat can be avoided, and the rolling bearing is enabled to suitably serve not causing seizure even under circumstances ready for being the boundary lubrication.

Next, a description will be given of a third embodiment of the invention with reference to FIGS. 6–13.

At first, referring to the thrust endurance testing machine shown in FIG. 6, evaluated results of rolling fatigue strength of the DLC film will be explained.

The thrust endurance testing machine has an SUJ2 made-thrust bearing 101-a having an inner diameter of 30 mm, an outer diameter of 62 mm, a thickness of 7 mm, and the raceway surface of a curvature being 52% of diameter of the rolling element, the SUJ2 made-rolling elements 101-b of 11 pieces, a steel made-retainer 101-c arraying the rolling elements 101-b at even intervals along the circumference, and an SUJ2 made-plane test piece 101-d enabling to load stress through the rolling elements.

The plane test piece (base material) 101-d was formed on the surface with the DLC film of a total amount being 0.3 to 5.2 μm by the following manner.

Namely, by use of an unbalanced magnetron spattering apparatus 504 (hereinafter referred to as "UBMS") made by Kobe Steel Works, Ltd., the plane test piece 101-d was washed off to remove an oil content, followed by performing a bombard treatment for 15 minutes through the spattering process of an argon plasma, and then the intermediate layer of Cr component was formed on the surface of the plane test piece 101-d from a chromium target.

Subsequently, a sputtering efficiency of the carbon target was increased, and while supplying the plane test piece 101-d with negative bias voltage, the carbon layer was formed as a second layer and the DLC film was formed on the surface of the plane test piece 101-d.

The equivalent elastic modulus of the DLC film can be easily changed by controlling the bias voltage to be supplied to the plane test piece 101-d or controlling a partial pressure of a gas to be introduced, and the thickness of the DLC film can be precisely controlled by controlling a sputtering time.

Incidentally, at this time, if controlling sorts or ratios of the partial pressure of the gases to be introduced (Ar, $H_2$ or hydrocarbon based gas such as $CH_4$), the equivalent elastic modulus and the sliding resistance of the DLC film can be more controlled, so that it is possible to form a film composition meeting a purpose by introducing a mixed gas or a sole gas.

Figure 6:
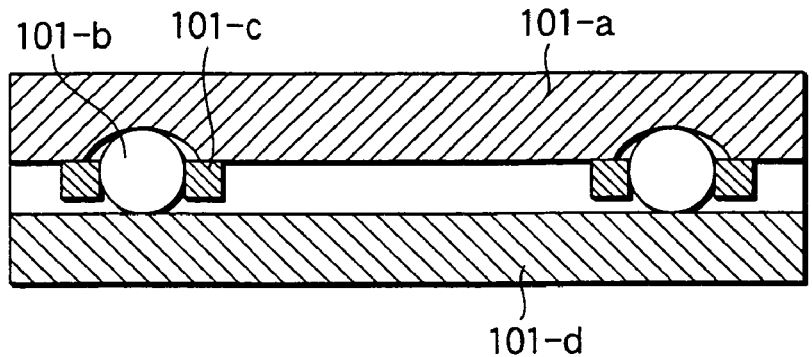
FIG. 6 is a schematic view of a thrust endurance testing machine according to third and fourth embodiments of the invention.
Figure 7:
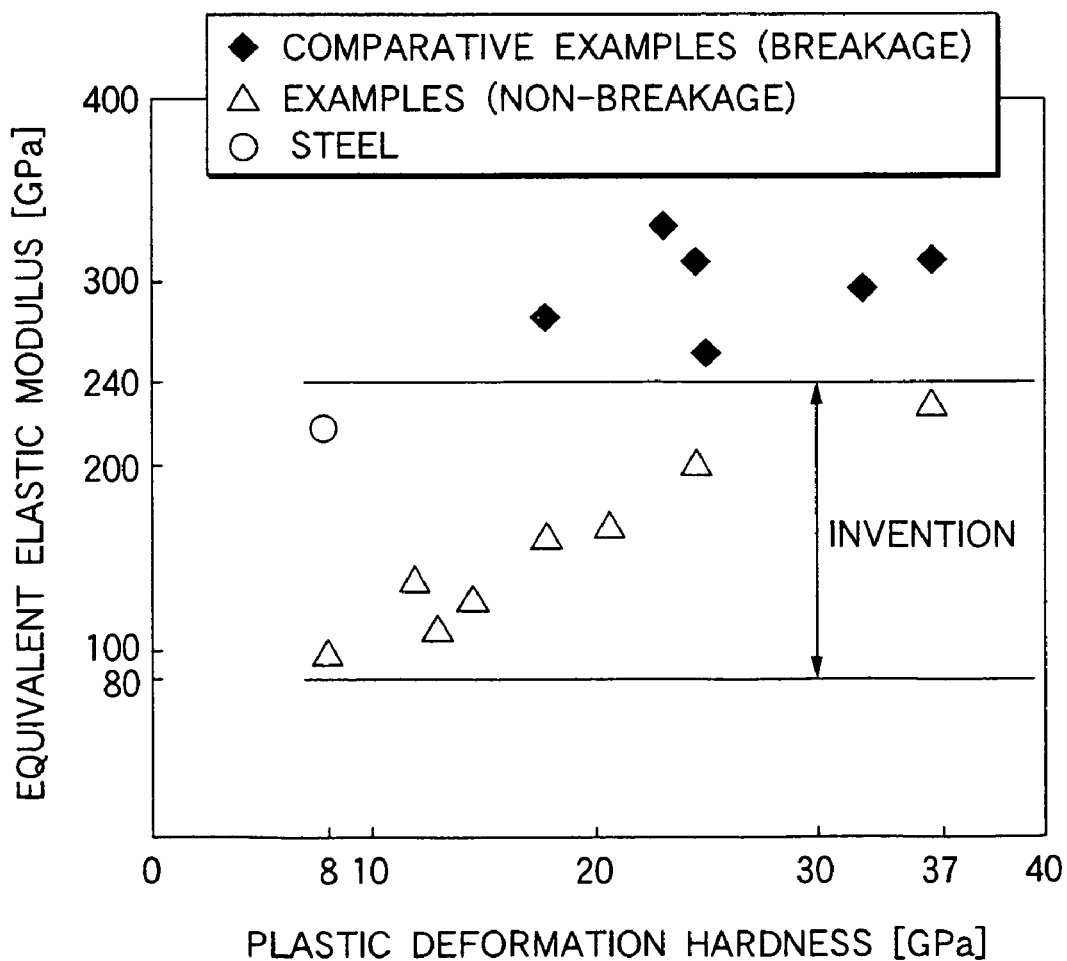
FIG. 7 is a graph showing the relationship in the equivalent elastic modulus, the plastic deformation hardness and the rupture strength of the DLC film.
Figure 8:
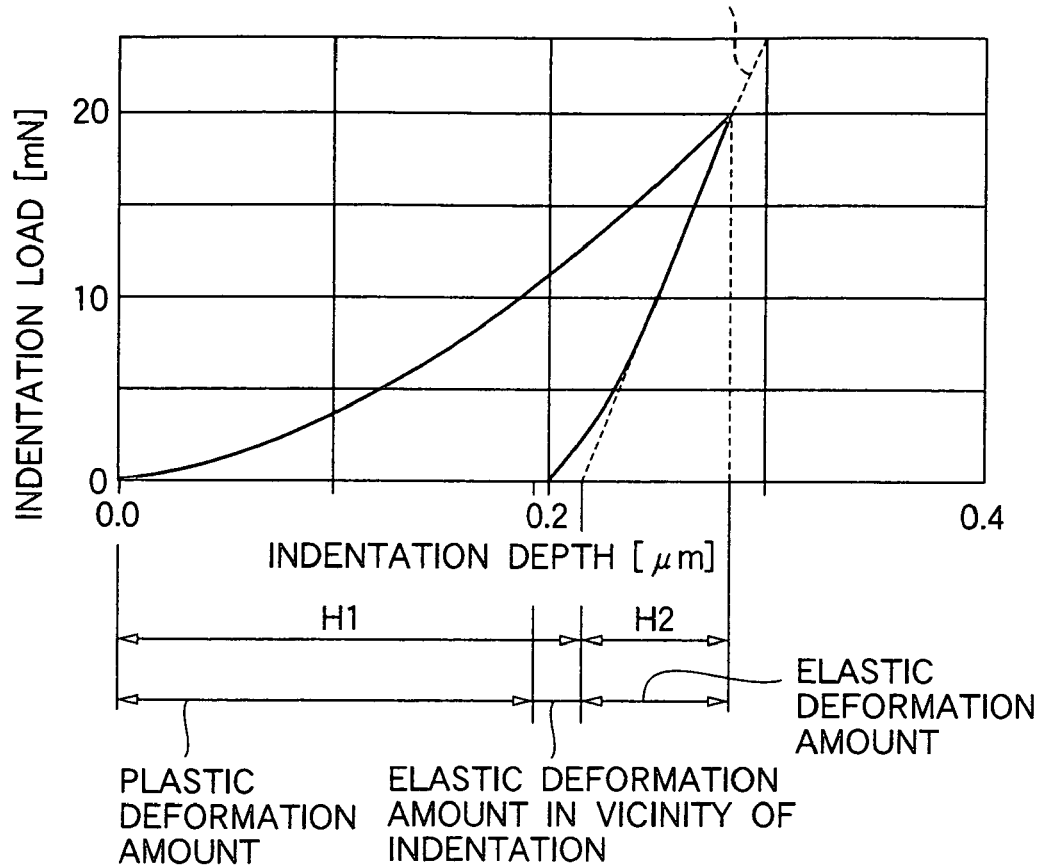
FIG. 8 is a graph showing the relationship between the indentation load and the indentation depth.

As to a plurality of plane test pieces 101-d prepared by the above film-forming process, the equivalent elastic modulus and the plastic deformation hardness of each DLC film were measured, and the rupture strength of the DLC film against the repeated stress was investigated per each of the respective plane test pieces 101-d by use of the same thrust testing machine as shown in FIG. 6. FIG. 7 shows the relationship in the equivalent elastic modulus, the plastic deformation hardness and the rupture strength of the DLC film. The rupture strength was evaluated by presence and absence of the DLC film peeling at a point that the number of the repeated stress got to $10^9$ under a condition of loading a Hertz contact stress of 2 GPa. The testing conditions were the rotation number of 6000 rpm, the contact stress of 2 GPa and a mineral oil lubrication.

As apparently from FIG. 7, the plastic deformation hardness of the DLC film was 8 to 37 GPa harder than that of the base material, the equivalent elastic modulus of the DLC film was 80 to 240 GPa smaller than that of the base material, to thereby obtain the high rupture strength. Accordingly, if forming the DLC film of such structure on at least one base material of the inner, outer rings and the rolling elements of the bearing, it is possible to offer a rolling sliding member enabling to secure the excellent lubricating properties of the DLC film for a long period of time without peeling of the DLC film in usage of large contact stress.

If the plastic deformation hardness of the DLC film is less than 8 GPa, the abrasion becomes large, and if exceeding 37 GPa, a brittle fracture is easy to occur. If the equivalent elastic modulus of the DLC film is less than 80 GPa, the surface hardness of the DLC film lowers and the abrasion is easy to arise against the large contact stress, and if exceeding 240 GPa, the equivalent elastic modulus of the DLC film becomes larger than that of the base material (steel), and since the steel deforms following the large contact stress prior to the DLC film, a problem arises that the DLC film is broken by the repeated stress.

The equivalent elastic modulus and the plastic deformation hardness are measured with the micro penetrometer made by ELIONIX Inc., and the equivalent elastic modulus is demanded from the load—load removal curve (refer to FIG. 8) under the conditions of the indentation load: 20 mN. When measuring the film less than 1 μm, it is desirable that the indentation load is appropriately set to be 0.4 to 20 mN and the indentation depth is set to be at least within the range of the DLC film.

Further, when the thickness of the DLC film is 2 μm, the indentation load is appropriately set between 0.4 and 50 mN for measuring. In the following th embodiments, the indentation load being 50 mN is employed for measurement.

Another measuring method of the equivalent elastic modulus adopts the micro penetrometer made by Fisher Inc. This method does not use a (micro) Vickers penetrometer, but desirably uses a micro penetrometer or a nanoindentator enabling to control with a capacitance type. Then, it is necessary that the indentation depth is to be within the thickness of the DLC film, and the equivalent elastic modulus is also measured similarly by the micro penetrometer or the nanoindentator for demanding the equivalent elastic modulus from the amount of elastic deformation of load—load removal curve.

By the way, if the equivalent elastic modulus on the surface of carbon chromium steel (SUJ2) of HRC60 is obtained by the above mentioned method, it is 250 GPa being larger than 210 GPa ordinarily described in catalogues or the like. This is why the above mentioned method has an influence of a work hardening layer in the surface of SUJ2 because of the measuring in the range of the fine indentation.

Next, explanation will be made to a fourth embodiment of the invention.

A rolling sliding member of this embodiment is an example which is suited to when being served under circumstances accompanied with temperature change by the frictional abrasion, and this example makes no interface between the intermediate layer and the carbon layer, forms the composite layer (oblique layer) continuously changing compositions from the intermediate layer toward the carbon layer so as to increase adhesiveness with the base material, and determines the plastic deformation hardness of the DLC film to be 8 to 37 GPa.

Detailed explanation will be made as follows. As a test piece, the plane test piece 101-d was used similarly to the third embodiment, and the DLC film was formed on the surface of the plane test piece 101-d.

Prior to forming the DLC film on the surface of the plane test piece 101-d, the bombard treatment was carried out with Ar gas on the surface of the plane test piece 101-d, and the intermediate layer was formed with a mixing layer with a composing element of the plane test piece 101-d at a level of an atomic order.

Figure 13:
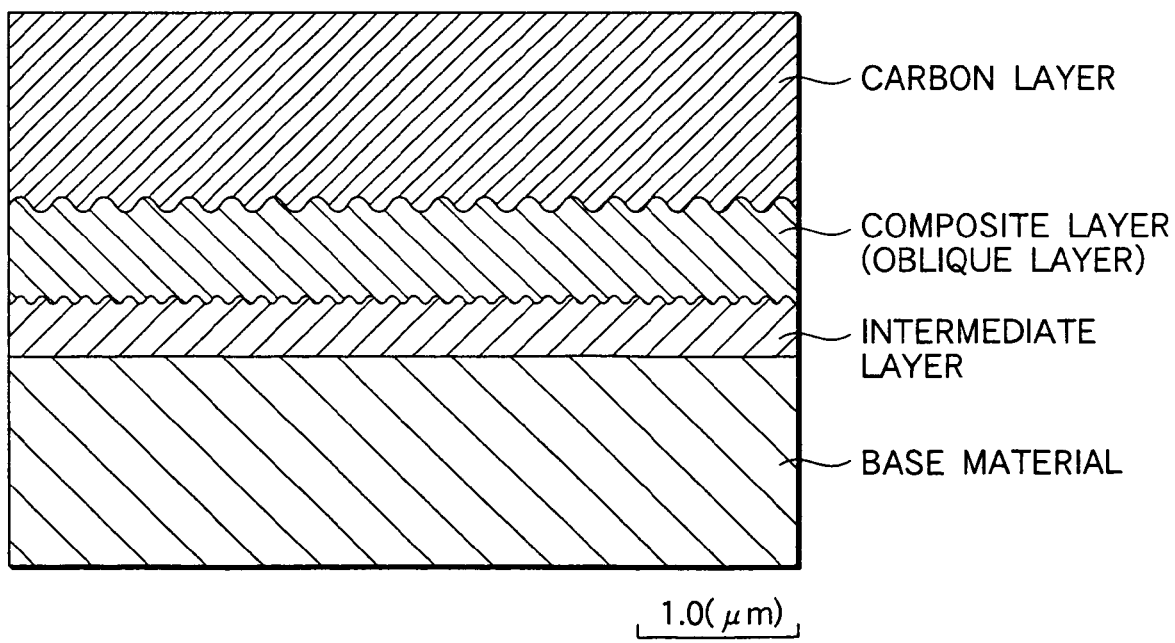
FIG. 13 is a cross sectional view of the DLC film.

The UBMS apparatus 504 is attached with a plurality of targets to be used for spattering, and spattering electric sources of the Cr target of the intermediate layer and the C target of the carbon layer are independently controlled, whereby the spattering efficiency of Cr forming the intermediate layer is continuously decreased, while the spattering efficiency of C target is increased, so that the composite layer of Cr and C is formed between the intermediate layer and the carbon layer (see FIG. 13). The spattering electric source of the target is DC source, and the plane test piece 101-d is supplied with the bias voltage. This composite layer is an oblique layer of C and Cr where the composition ratios are continuously changed.

After forming the intermediate layer, while decreasing the electric source power of the target of the intermediate layer, the power of DC spatter of the C target is increased simultaneously. While supplying the bias voltage to the plane test piece 101-d, these operations are performed by a computer control, and it is possible to form the composite layer being the oblique layer of C and Cr between the intermediate layer and the carbon layer. By controlling DC source being the spattering source of the target, the spattering efficiency of Ar ion is changed continuously.

The thickness of the composite layer is measured by use of X-ray photoelectron spectra analyzer (hereinafter referred to as "XPS").

This means that the X-ray is irradiated on the surface of the test specimen for obtaining information (qualitative and determination) of elements on the surface of the test specimen and a combined condition by analyzing energy of photoelectron emitted from the outermost surface (about several angstroms) of the specimen, and further the surface of the specimen is measured as spattering the surface of the specimen by using an argon ion gun of high speed, thereby enabling to analyze the distribution condition in the depth direction (i.e., under the surface of the specimen) of the element.

Figure 9:
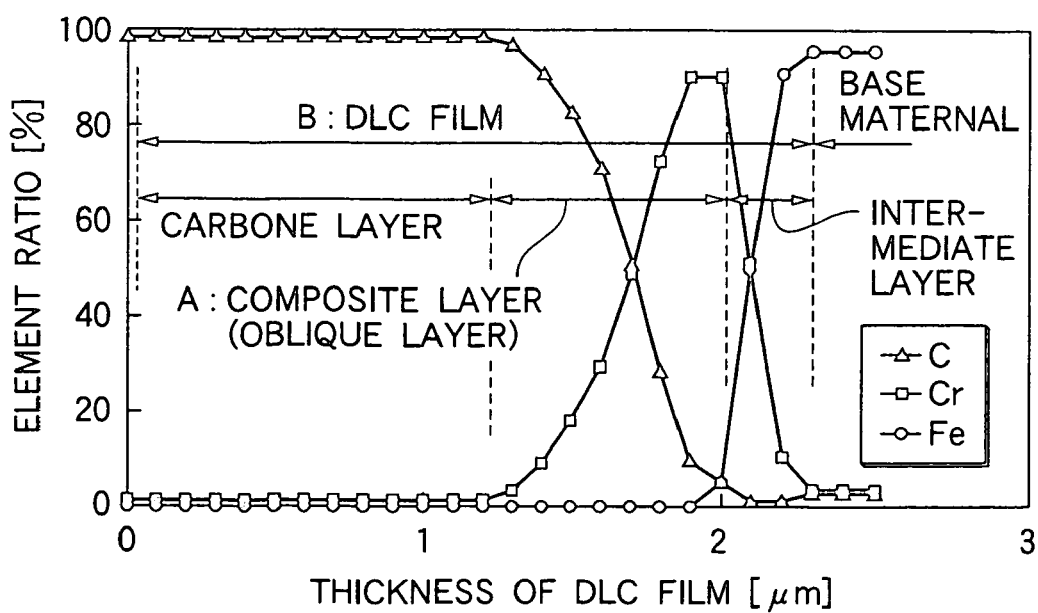
FIG. 9 is a graph showing the relationship between the thickness of the DLC film and ratio in elements of carbon, chromium and iron.

FIG. 9 is a graph showing the relationship between the thickness of the DLC film and ratio in elements of carbon, chromium and iron. The thickness of the composite layer of the DLC film formed by the UBMS apparatus 504 is measured by, for example, taking a depth profile of the specimen by use of the XPS, expressing changes in intensity of photoelectron of C, Cr and iron in the DLC film with the element ratios so as to discriminate the composite layer, and calculating the thickness of the composite layer based on an etching speed of 30 nm/min and a time taken therefor.

By the above film forming process, the plane test piece 101-d was formed on the surface with the DLC film having the composite layer (oblique layer) between the intermediate layer and the carbon layer, and the DLC strength was investigated by giving the repeated stress thereto. The testing way used a heater for giving to the DLC film the heat cycle at 60 to 180° C. from a housing, and evaluated the DLC film with the number of repeating stresses until the DLC film was broken under the condition of giving the heat cycle to the coat layers of the linear thermal expansion coefficient being different. With respect to the number of repeating stresses, a vibration sensor was provided to the housing, increase of vibration was detected, the motor was stopped when breaking the DLC film, and the number of repeating stress was calculated from the stopping time and the rotation number.

Figure 10:
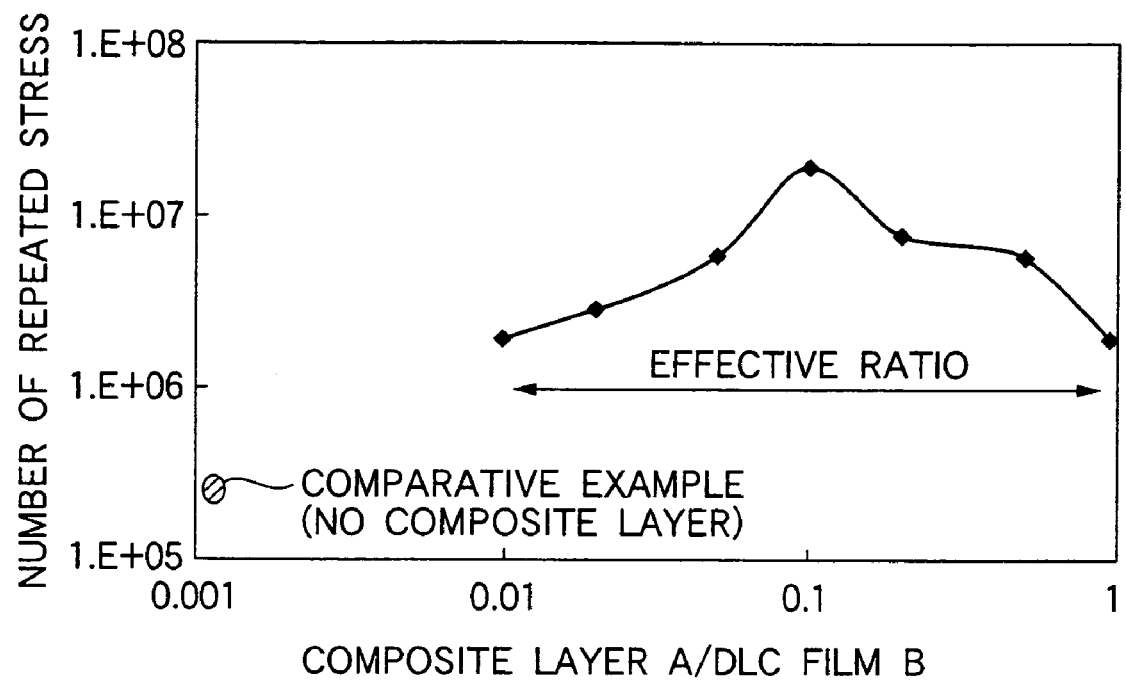
FIG. 10 is a graph showing the relationship between the ratio of the composite layer and the amount of repeating stress.

FIG. 10 shows the relationship the ratio of the composite layer (oblique layer) to the DLC film and the number of repeating stresses. Herein, the ratio of the composite layer to the DLC film shows the ratio of A/B of the thickness A of the composite layer to the total thickness B of the DLC in FIG. 9.

As is seen from FIG. 10, the ratio A/B of the composite layer is 0.01 to 0.95, especially preferably 0.05 to 0.2. Therefore, if forming the DLC film of such a structure on at least one base material surface of the inner, outer rings and rolling elements of the bearing, it is possible to offer such a rolling sliding member enabling to secure the excellent lubricating properties of the DLC film for a long period of time without peeling of the DLC film even in case of being served under circumstances accompanied with temperature change by the frictional abrasion and used to the large contact stress.

By the way, if the ratio A/B is less than 0.01, the composite layer less functions so that durability given the heat cycle goes down, while being larger than 0.95, the sliding property of the DLC film is spoiled and the frictional coefficient goes up, so that the abrasion of the DLC film itself is easy to progress.

Further, if the equivalent elastic modulus of the DLC film is set to be within the range of 80 to 240 GPa, the mechanical strength can be more heightened.

The rotational tests of the actual rolling bearings according to the third and fourth embodiments were performed for investigating the rising temperature of the bearing and the peeling of the DLC film.

Figure 11:
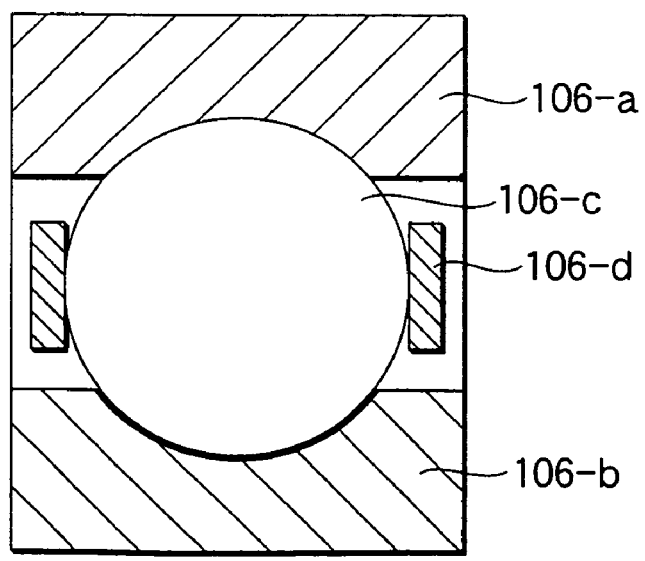
FIG. 11 is a schematic view of the bearings to be used to the bearing rotation test.

FIG. 11 is a deep groove ball bearing having an inner diameter of 30 mm and an outer diameter of 62 mm, which comprises the outer ring 106-a, the inner ring 106-b, the rolling elements 106-c and the retainer 106-d, made of high carbon chromium steel. Example 9 was made where the inner ring 106-b of the bearing was carried out on the raceway surface with the DLC treatment (having the oblique layer) by the UBMS apparatus, Comparative Example 9A was the bearing whose inner ring 106-b was not carried out on the raceway surface with the DLC treatment, Comparative Example 9B was the bearing whose inner ring 106-b was performed on the raceway surface with the DLC treatment through the plasma CVD, and in regard to these respective examples, the rising temperatures by generation of heat were measured under the conditions of the axial load: 2.5 kN, rotation number: 12000 rpm, and the grease lubrication. The results are shown in Table 5.

As to the temperature, the thermocouple was attached to the outer ring of the bearing, and after 24 hours, the stable temperature was measured in a room at high temperature. As to the plasma CVD, the intermediate layer was coated with Cr by the ion plating, on which the plasma was generated with a raw material of methane gas through a high frequency source and the DLC film was made from the methane gas while supplying the bias voltage to the inner ring 106-b. Thus, in Comparative Example 9B, the interface exists between the intermediate layer and the carbon layer.

TABLE 5

|  | Example 9 | Comparative Example 9A | Comparative Example 9B |
| --- | --- | --- | --- |
| Hardness of plastic deformation (GPa) | 14 | 8 | 23 |
| Equivalent elastic modulus (GPa) | 130 | 230 | 260 |
| Intermediate layer - Carbon layer | Composite layer (Oblique layer) | — | Interface of single layer |
| Film forming process | UBMS | — | Plasma CVD |
| Rising temperature of outer ring (Δdeg) | 21 | 28 | 28 |
| Peeling | No | No | Yes |

As apparently from Table 5, Example 9 satisfies the two embodiments of the invention, having the plastic deformation hardness being 14 GPa, the equivalent elastic modulus being 130 GPa and the composite layer (oblique layer) between the intermediate layer and the carbon layer. Accordingly, since the DLC film has the lower frictional coefficient than that of the steel of the base material, the generation of heat is little even under the condition of the boundary lubrication as the present Example, and the rising temperature of the outer ring is low. Besides, since the equivalent elastic modulus of the DLC film is smaller than the value of the base material steel, the DLC film is easy to follow deformation by stress so that no peeling appears. In addition, as the oblique composition is formed as the composite layer between the intermediate layer and the carbon layer, the strength of the DLC film is high even if the heating cycle is loaded by the generation of heat.

Comparative Example 9A is the bearing without the DLC treatment, so that metal-to-metal contact occurs under the boundary lubrication, and the generation of heat is large between the rolling elements and the raceway surface.

Comparative Example 9B has the larger equivalent elastic modulus of the DLC film than that of the steel, and so the DLC film easily peels by stress, and as it has no oblique layer between the intermediate layer and the carbon layer, the strength of the DLC film is extremely weak. Therefore, the DLC film peels at an initial period of operation, and the rising temperature in the outer ring is almost equal to that of the non-treated bearing, and the lubricating effect of the DLC film cannot be expected.

Figure 12:
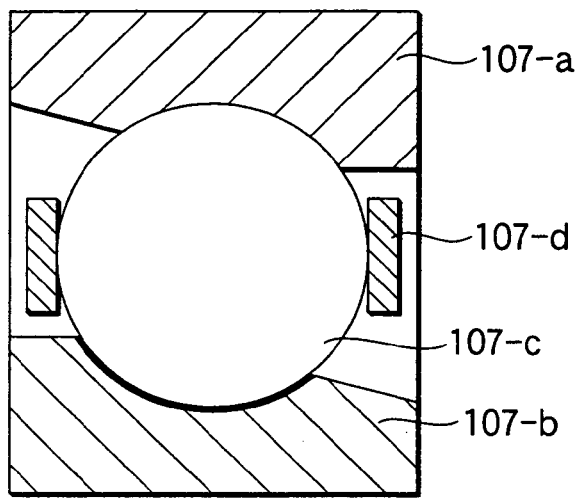
FIG. 12 is a schematic view of the bearings to be used to the bearing rotation test.

FIG. 12 is an angular contact ball bearing having an inner diameter of 65 mm and an outer diameter of 100 mm, which comprises an outer ring 107-a and an inner ring 107-b made of high carbon chromium steel, rolling elements 107-c made of silicon nitride and a retainer 107-d made of high carbon chromium steel. Example 10A was made where the inner ring 107-b of the bearing was carried out with the DLC treatment by the UBMS apparatus for effecting the equivalent elastic modulus being 170 GPa, Example 10B was the bearing whose inner ring 107-b was carried out with the DLC treatment for having the oblique layer between the intermediate layer and the carbon layer, Comparative Example 10 was the bearing whose inner ring 107-b was performed with the DLC treatment through the ion plating, and in regard to these respective examples, the rising temperatures in the outer ring were measured under the conditions of the pressure on the contact face: 2.2 GPa, rotation number: 32000 rpm, and oil air (VG22) lubrication. The results are shown in Table 6.

As to the temperature, the thermocouple was attached to the outer ring of the bearing, and after 48 hours, the stable temperature was measured in the room at high temperature. As to the ion plating, the intermediate layer was coated with tungsten, on which the DLC film was formed on the raceway surface of the inner ring 107-d while supplying the bias voltage to the inner ring 107-d with the raw material of graphite by use of the arc discharge.

TABLE 6

|  | Example 10A | Example 10B | Comparative Example 10 |
|---|---|---|---|
| Hardness of plastic deformation (GPa) | 20 | 25 | 25 |
| Equivalent elastic modulus (GPa) | 170 | 245 | 245 |
| Intermediate layer - Carbon layer | Interface of single layer | Composite layer (Oblique layer) | Interface of single layer |
| Film forming process | UBMS | UBMS | Ion plating |
| Rising temperature of outer ring (Δdeg) | 60 | 62 | 75 |
| Peeling | No | No | Yes |

As apparently from Table 6, in Example 10A, although the composition of the intermediate layer has a single interface, the equivalent elastic modulus of the DLC film is 170 GPa smaller than that of the steel and the plastic deformation hardness is 20 GPa larger than that of the steel, so that the DLC film does not peel when the bearing rotates. In Example 10B, although the equivalent elastic modulus of the DLC film is 245 GPa larger than 230 GPa of the steel (the measured value of the nano-indentation in FIG. 8: indentation load of 20 mN), since the composition between the intermediate layer and the carbon layer is oblique, the DLC film does not peel. Therefore, the heating value of the bearing is less and the rising temperature in the outer ring is low.

In Comparative Example 10, since the equivalent elastic modulus of the DLC film is 245 GPa larger than 230 GPa of the steel (the measured value of the nano-indentation in FIG. 8: indentation load of 20 mN) and the composition of the intermediate layer has the single interface, the DLC film occurs, and the generation of heat is large.

The DLC film having the smaller value of the equivalent elastic modulus than that of the base material has the high rupture strength to the mechanical parts of the large contact stress such as the bearing, and therefore the rolling sliding member of the invention has the immense effects in the low generation of heat, the anti-seizure and the abrasion resistance under the using conditions where the surface-to-surface contact appears as the boundary lubrication.

As described the above, according to the third and fourth embodiments of invention, such effects are available that the DLC film does not peel even in the usage of large contact stress, securing the excellent lubricating property of the DLC film.

Next, a description will be given of fifth and sixth embodiments of the invention with reference to FIGS. 14 to 22.

Figure 14:
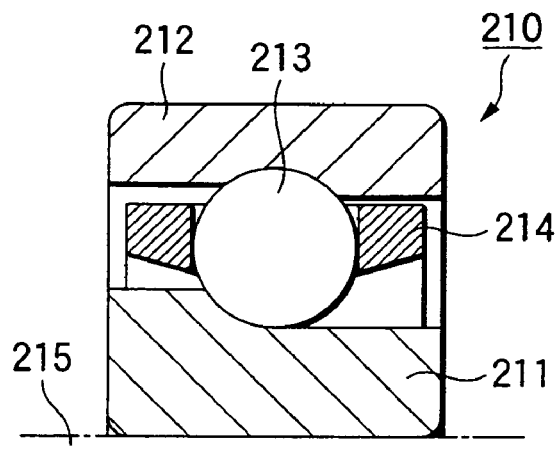
FIG. 14 is a cross sectional view for explaining the angular ball bearing as one example of a fifth embodiment of the invention.

At first, referring to FIG. 14, an angular ball bearing (roller bearing for high speed rotation) as the fifth embodiment of the invention will be explained. This angular ball bearing 210 is that a plurality of ceramic-made balls (rolling elements) 213 are disposed between an inner ring 211 and an outer ring 212 via a retainer 214, and the inner ring 211 and the outer ring 212 are made of steel, and the inner ring 211 is mounted on a rotating shaft 215. The DLC film is formed on the raceway surface of the inner ring 211 and the raceway surface of the outer ring 12. The retainer 214 is an outer ring guiding type.

As shown in FIG. 13, this DLC film also makes no interface between the intermediate layer and the carbon layer composed of metallic components as Cr, W, Ti, Si, forms the composite layer (oblique layer) therebetween continuously changing compositions from the intermediate layer toward the carbon layer. Further, the plastic deformation hardness of the DLC film is set to be 8 to 35 GPa.

A process of forming the DLC film includes a unbalanced spattering process, or a plasma CVD, and for example, it is preferable to form the DLC film by use of the unbalanced magnetron spattering apparatus (UBMS 504) made by Kobe Steel Works, Ltd., or a hot-cathode plasma CVD apparatus (PIG system-film forming apparatus) made by Shinko Seiki, Ltd.

Figure 15:
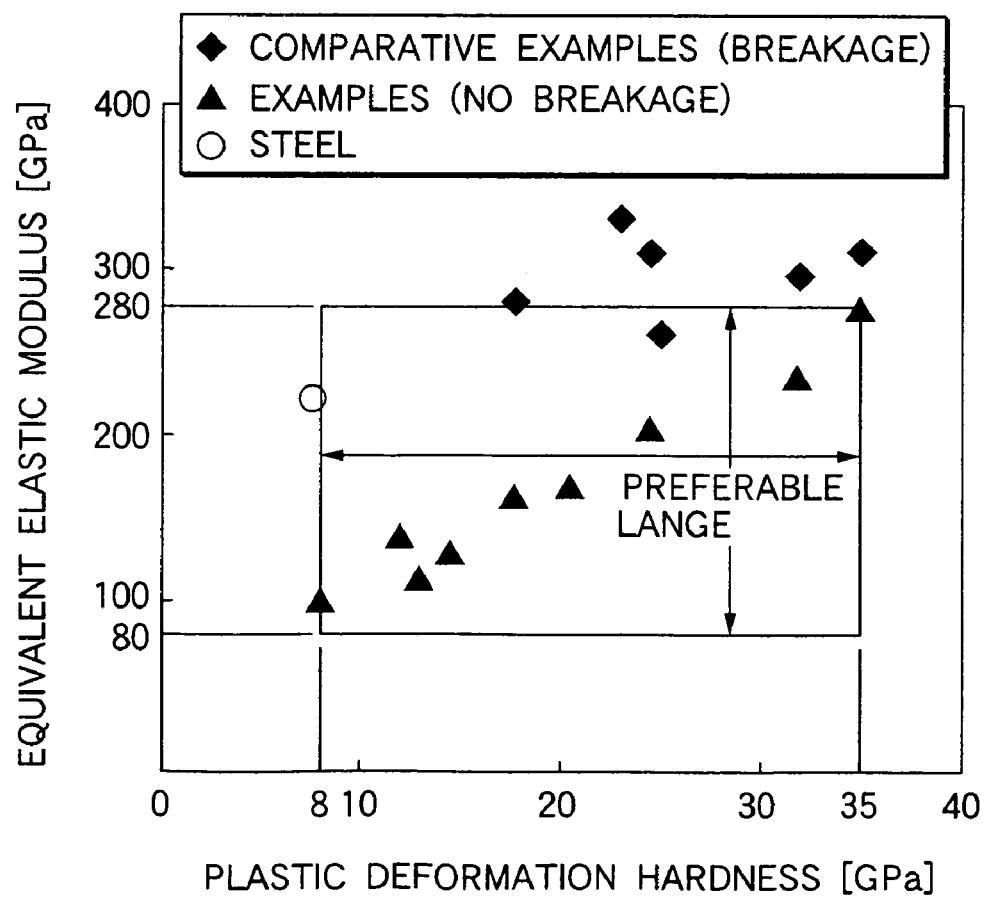
FIG. 15 is a graph showing the relationship in the equivalent elastic modulus, the plastic deformation hardness and the rupture strength.

FIG. 15 shows the relationship in the equivalent elastic modulus, the plastic deformation hardness and the rupture strength of the DLC film. The rupture strength was evaluated by using a thrust endurance tester (not shown) through presence and absence of the DLC film peeling at a point that the number of the repeated stress got to $10^9$ under a condition of loading a Hertz contact stress of 2 GPa. The testing conditions were the rotation number of 8000 $min^{-1}$, and a grease-lubrication.

As apparently from FIG. 15, the plastic deformation hardness of the DLC film was 8 to 35 GPa higher than that of the base material, the equivalent elastic modulus of the DLC film was 80 to 280 GPa, preferably, 100 to 280 GPa smaller than that of the base material, to thereby obtain the high rupture strength.

If the plastic deformation hardness of the DLC film is less than 8 GPa, the abrasion becomes large, and if exceeding 35 GPa, a brittle fracture is easy to occur. If the equivalent elastic modulus of the DLC film is less than 80 GPa, the surface hardness of the DLC film lowers and the abrasion is easy to arise against the large contact stress, and if exceeding 280 GPa, the equivalent elastic modulus of the DLC film becomes larger than that of the base material (steel), and since the steel deforms following the large contact stress prior to the DLC film, a problem arises that the DLC film is broken by the repeated stress.

The ratio (H/E) of the plastic deformation hardness (H) to the equivalent elastic modulus (E) is desirably 0.08 to 0.16, and the composite layer is 1 to 99% (more desirably 5 to 50%) of the total thickness of the DLC film, and the outermost surface of the DLC film is 100% in the carbon element.

In the fifth embodiment, the relationship between the ratio in elements of carbon, chromium and iron, and the thickness of the DLC film are the same as the fourth embodiment shown in FIG. 9.

The thickness of the DLC film is desirably 0.1 to 5 µm, and preferably 0.5 to 3 µm. If being less than 0.1 µm, the surface of the base material is largely exposed and property of the DLC film is reduced, and as a result, the improving effects of the sliding property and the abrasion resistance are smaller. On the other hand, if being more than 5 µm, the internal stress within the film becomes large to spoil the adhesiveness with the base material.

As the metallic material of the raceway surface becoming the base material to be formed with the DLC film, that is, as the bearing steel, there are suitably a material formed with an eutectic carbide of secondary hardening precipitation type (for example, high speed steel, semi high speed steel, or martensite based stainless steel), a material where a temper resistibility is heightened by composing elements to stabilize dimensions (materials equal to high carbon chromium steels). The former includes, for example, SKD, SKH, SUS440, while the latter includes not only the heat resistant-specified bearing steel of, for example, Si: 0.7 to 1.5 wt %, Cr: 0.5 to 2.0 wt %, Mo: 0.5 to 2.0 wt %, and previously performed with carbonitriding treatment on the surface but also M50, M50NIL materials.

A general bearing steel (SUJ2) may be served as the metallic material of the raceway surface, and in such case, the tempering temperature is determined to be 120 to 400° C., desirably 180 to 330° C., more desirably 180 to 260° C. If being lower than 120° C., the bearing is deformed by a DLC film forming temperature (120 to 130° C.), and if being higher than 400° C., the surface hardness is remarkably decreased. Therefore, for not deforming the bearing by the DLC film forming treatment and giving the surface hardness HRC 50 or more, it is desirable to fall within the above mentioned range of the tempering temperature.

As a surface preparation of the base material to be formed with the DLC film, suitable are, among the nitriding treatments, a gas nitriding, an ionitriding or an ion implantation, and it is desirable to appropriately control a nitrogen containing amount. For example, thickness of the nitride layer is suitably 0.1 to 60 µm as a diffusion layer, and a nitrogen density is preferably 0.1 to 0.8%. If being less than 0.1%, the surface part is short in the sliding property, and on the other hand, if being more than 0.8%, the nitrogen density is high in the surface, the adhesiveness of base material with the reacted precipitation is spoiled.

A reason why the above structured DLC film is useful is because the DLC film has the surface hardness equivalent to that of the ceramic as silicon nitride to be used to the rolling elements, has a more excellent seizure resistance and abrasion resistance than those of the base material of the bearing ring, has an excellent lubricating property, a lower frictional coefficient and a high rupture strength. Further, by forming the DLC film on the rolling bearing requiring for the low torque performance and the low heat generation performance, these performances are improved.

In case the angular ball bearing having the inner and outer bearing rings formed with the DLC film is attached to the spindle of the machine tool and is used under circumstances of minor oil lubrication such as a grease-lubrication, an oil air-lubrication, an oil mist-lubrication or a direct jetting minor oil-lubrication in order to reduce a shearing resistance or an agitation resistance of the lubricant to realize the low torque and the low heat generation, although the oil film is broken at the contacting part between the balls and the raceway surface, and both contact each other, occurrences of damages as seizure or abrasion can be favorably avoided together with the low torque and the low heat generation by the DLC film itself and heightening effects of the seizure resistance and the abrasion resistance.

By the way, the above embodiment takes up the example of forming the DLC film on the raceway surfaces of the inner and outer rings 211, 212, and if necessary, it is sufficient to form the DLC film on an entire surface of an outer diameter face of the inner ring 211, on an entire surface of an inner diameter face of the outer ring 212, or on either of the inner ring 211 and the outer ring 212.

Besides, it is also sufficient to form the DLC film on the allover surface of the inner ring 211, the allover surface of the outer ring 212, or the retainer 214. In addition, the allover surface of the steel-made rolling elements 213 is formed with the DLC film.

Figure 16:
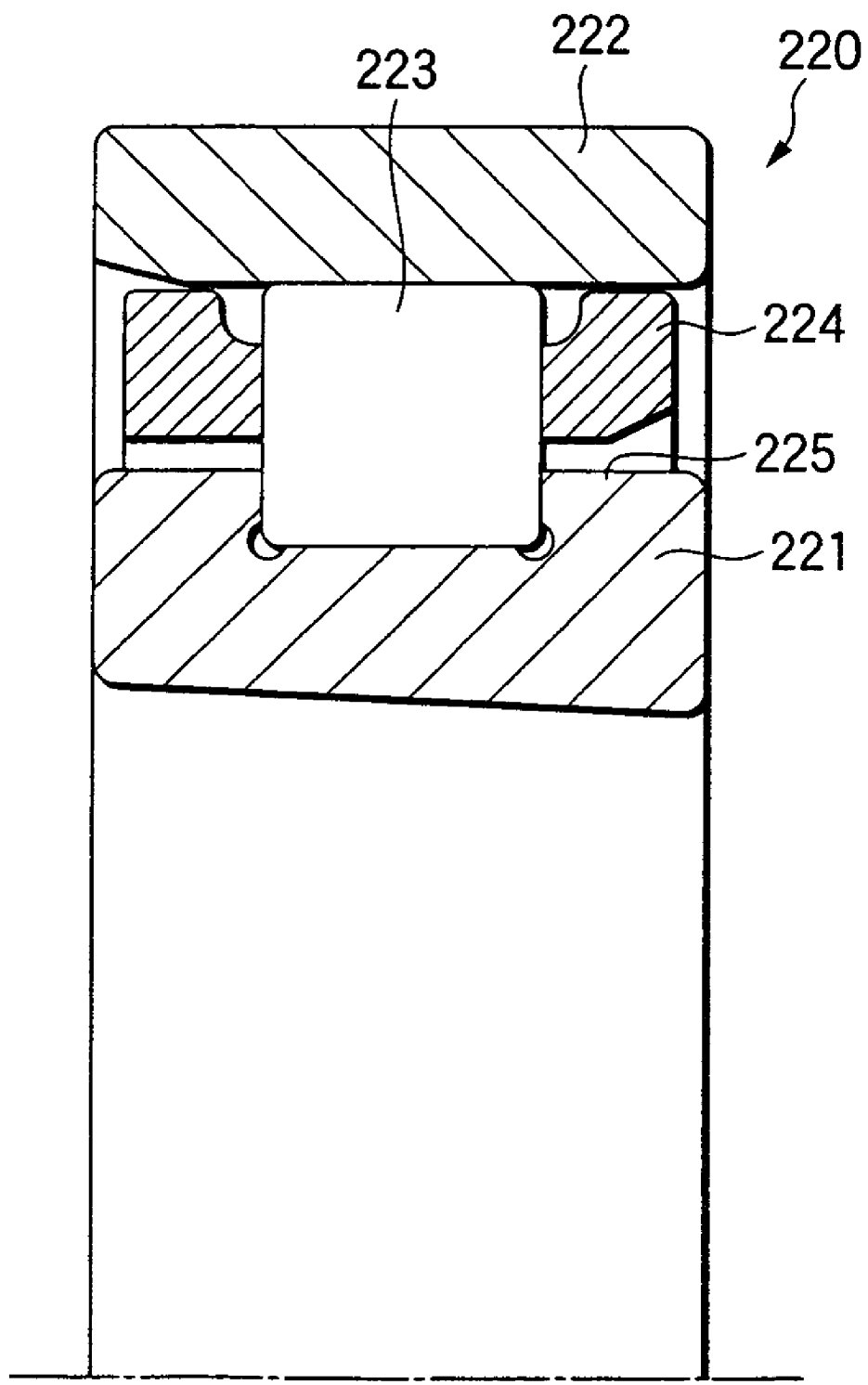
FIG. 16 is a cross sectional view for explaining the cylindrical roller bearing as a sixth embodiment of the invention.

This embodiment uses the angular ball bearing as the rolling bearing for high speed rotation, and instead of this, the cylindrical roller bearing as shown in FIG. 16 may be applied to the invention.

This cylindrical roller bearing (rolling bearing for high speed rotation) 220 is that a plurality of rollers (rolling elements) 223 are disposed between an inner ring 221 and an outer ring 222 via a retainer 224, and the inner ring 221, the outer ring 222, the rollers 223 and the retainer 224 are made of steel, and the inner ring 221 is mounted on a rotating shaft (not shown). The DLC film is formed on the raceway surface provided in the outer diameter face of the inner ring 21, at an edge of a collar 225, on the raceway surface provided in the inner diameter face of the outer ring 222, a guiding face of the retainer, and on the entire surfaces of the rollers 223, and the outer diameter face of the retainer 224. The retainer 214 is an outer ring guiding type.

In case such structured cylindrical roller bearing 20 is attached to the spindle of the machine tool and is used under circumstances of minor oil lubrication as a grease-lubrication, an oil air-lubrication, an oil mist-lubrication or a direct jetting minor oil-lubrication in order to reduce a shearing resistance or an agitation resistance of the lubricant to realize the low torque and the low heat generation, although the oil film is broken at the contacting part between the rollers 223 and the edge of the collar 225, at the contacting part between the retainer 224 and the guiding face of the outer ring 222, and at the contacting part between the rollers 223 and the raceway surfaces so that the retainer 224 are directly contacted with raceway rings, occurrences of damages as seizure or abrasion can be favorably avoided together with the low torque and the generation of low heat by the DLC film itself and heightening effects of the seizure resistance and the abrasion resistance similarly to the above embodiment. Other structures and the working effects are almost the same, and explanations therefor will be omitted.

Figure 17:
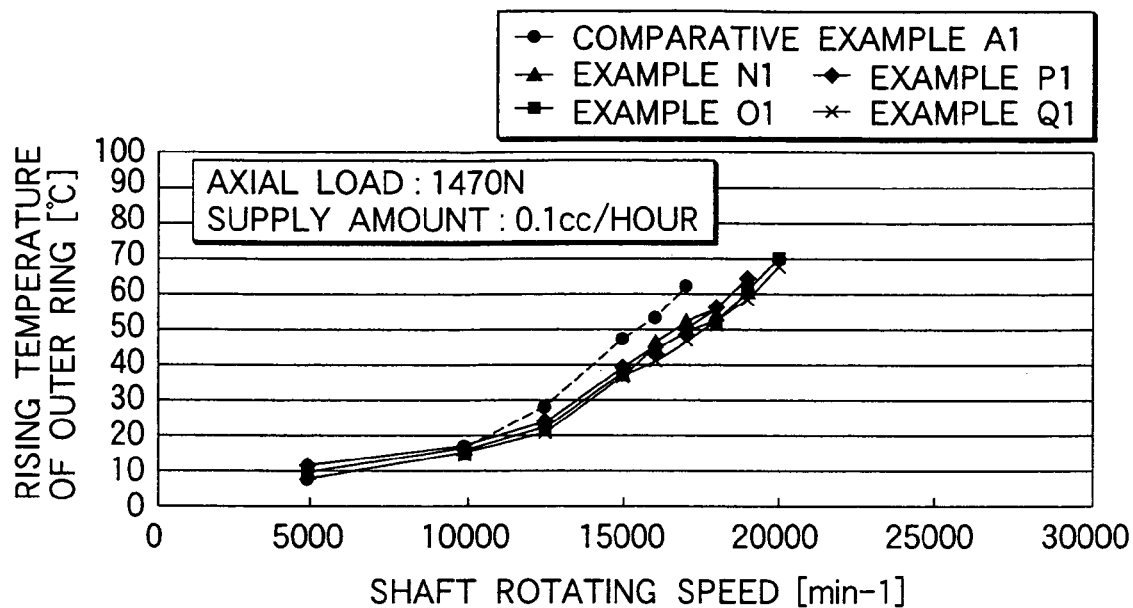
FIG. 17 is a graph sowing the relationship between the rotating speed of the shaft and the rising temperature of the outer ring in the Comparative Example and the Examples.
Figure 18:
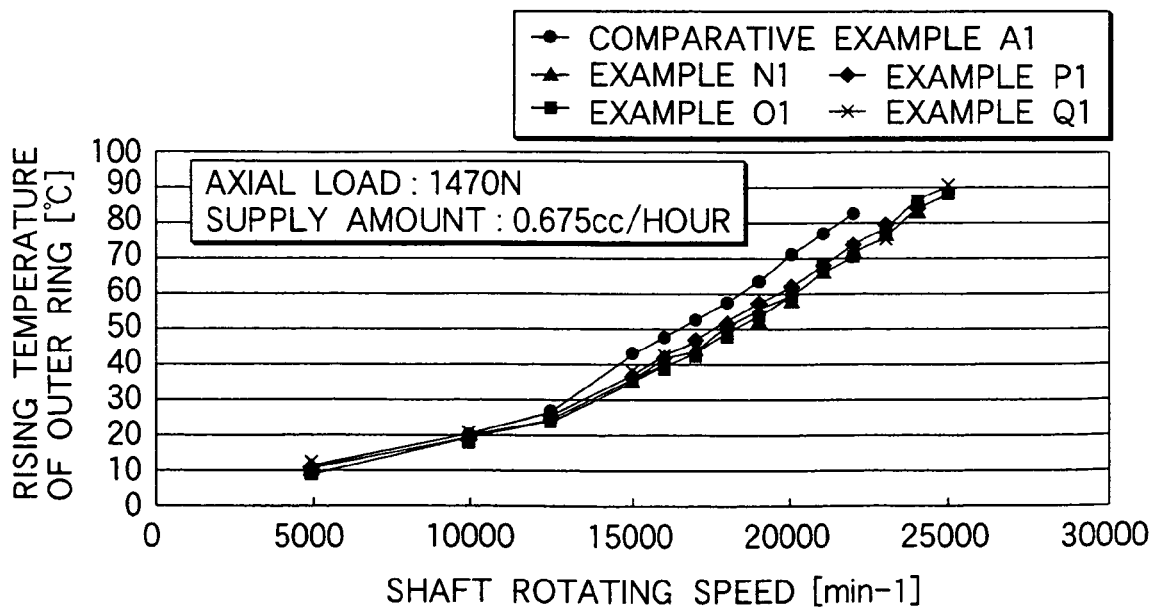
FIG. 18 is a graph sowing the relationship between the rotating speed of the shaft and the rising temperature of the outer ring in the Comparative Example and the Examples.
Figure 19:
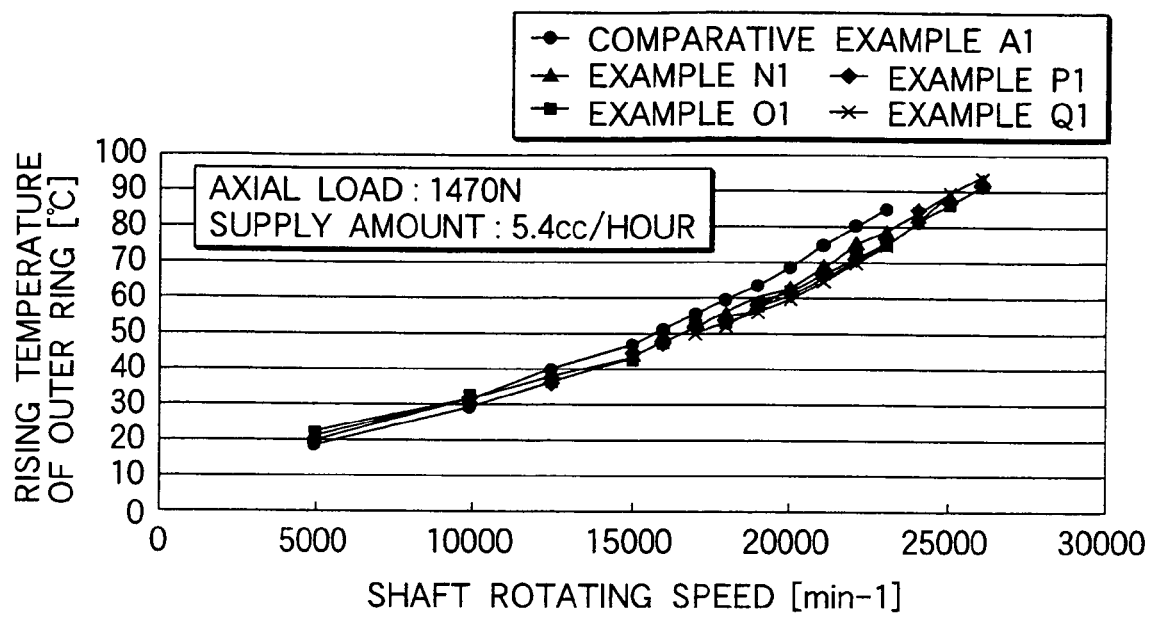
FIG. 19 is a graph sowing the relationship between the rotating speed of the shaft and the rising temperature of the outer ring in the Comparative Example and the Examples.

FIGS. 17 to 19 show experimented results where the rising temperature (temperature in the outer ring rose) of the angular ball bearing in the oil air lubrication and the limit of the seizure for confirming the effect of the DLC film of the invention by using the testing apparatus shown in FIG. 3. Table 7 shows the specimens (the specification of the bearing) used in the test. The rising temperature corresponds to the heating value generated in the entire angular ball bearing.

TABLE 7

| Bearing | Qualities of films | A (μm) | B (μm) | C (GPa) | D (GPa) | E | F | G (° C.) | H (mm) | I (mm) | J (mm) | K (mm) |
|---|---|---|---|---|---|---|---|---|---|---|---|---|
| Comparative Example A1 | Absence | — | — | — | — | SUJ2 | $Si_3N_4$ | 20 | 100 | 160 | 132.5 | 12.7 |
| Example N1 | DLC (Made by Kobe Steel Works Ltd.) | 2 | — | 13 | 110 | SUJ2 | $Si_3N_4$ | 20 | 100 | 160 | 132.5 | 12.7 |
| Example O1 | DLC (Made by Kobe Steel Works Ltd.) | 2 | 2 | 30 | 190 | SUJ2 | $Si_3N_4$ | 20 | 100 | 160 | 132.5 | 12.7 |
| Example P1 | DLC (Made by Shinko Seiki Ltd.) | 2 | — | 12 | 140 | SUJ2 | $Si_3N_4$ | 20 | 100 | 160 | 132.5 | 12.7 |
| Example Q1 | DLC (Made by Shinko Seiki Ltd.) | 2 | 2 | 17 | 160 | SUJ2 | $Si_3N_4$ | 20 | 100 | 160 | 132.5 | 12.7 |

A: Film thickness of inner ring
B: Film thickness of outer ring
C: Hardness of plastic deformation
D: Equivalent elastic modulus
E: Material of inner and outer rings
F: Material of rolling elements
G: Contact angle (Degree)
H: Inner diameter
I: Outer diameter
J: Pitch diameter of rolling element
K: Diameter of rolling element This experiment uses, as specimens, a plurality of angular ball bearings comprising the inner ring made of SUJ2 having the inner diameter of 100 mm, the outer ring made of SUJ2 having the outer diameter of 160 mm and the ceramic rolling elements made of $Si_3N_4$ (pitch diameter: 132.5 mm). The retainer is the outer ring guiding type.

In the experiments shown in FIGS. 17 to 19, the load of 1470 N is acted on the angular ball bearing in the axial direction, while the oil air lubrication where the lubricant is VG22 oil is used as a lubricating way of the angular ball bearing. VG22 oil is a lubricant defined in JIS (Japanese Industrial Standards) K2211. Values of the rising temperatures in the outer ring on the axes of ordinate in FIGS. 17 to 19 show results of measuring the temperatures in the outer ring in terms of the rising temperatures in the outer ring (temperatures in the outer ring–temperatures in the outside air) by attaching the thermocouple 34 to the outer diameter face of the outer ring. As to the lubricating conditions, the inventive products (Examples) and the conventional products (Comparative Examples) were subjected to the experiments in three kinds of 0.1 cc/hour (FIG. 17), 0.675 cc/hour (FIG. 18), and 5.4 cc/hour (FIG. 19).

The Example N1 in FIGS. 17 to 19 is formed with the DLC film to the only raceway surface of the inner ring of the angular ball bearing by use of the UBMS apparatus 504 made by Kobe Steel Works, Ltd.

The Example O1 in FIGS. 17 to 19 is formed with the DLC film to the raceway surface of the inner ring and the raceway surface of the outer ring of the angular ball bearing by use of the UBMS apparatus 504 made by Kobe Steel Works, Ltd.

The Example P1 in FIGS. 17 to 19 is formed with the DLC film to the only raceway surface of the inner ring of the angular ball bearing by use of the PIG system film forming apparatus made by Shinko Seiki Ltd.

The Example Q1 in FIGS. 17 to 19 is formed with the DLC film to the raceway surface of the inner ring and the raceway surface of the outer ring of the angular ball bearing by use of the PIG system film forming apparatus made by Shinko Seiki Ltd.

The Comparative Example A1 in FIGS. 17 to 19 is the conventional angular ball bearing not formed with the DLC film.

As seen from FIGS. 17 to 19, the Examples N1, O1, P1 and Q1 show substantially equal performances, and are lower in the rising temperatures (temperatures in the outer ring) and higher in the limit of the seizure than the Comparative Example A1. Accordingly, apparently the inventive products are useful to the high speed and the temperature slow rising of the angular ball bearing. The difference between the Examples and the Comparative Example is further clarified in ranges of the DmN value exceeding 2,000,000.

Figure 20:
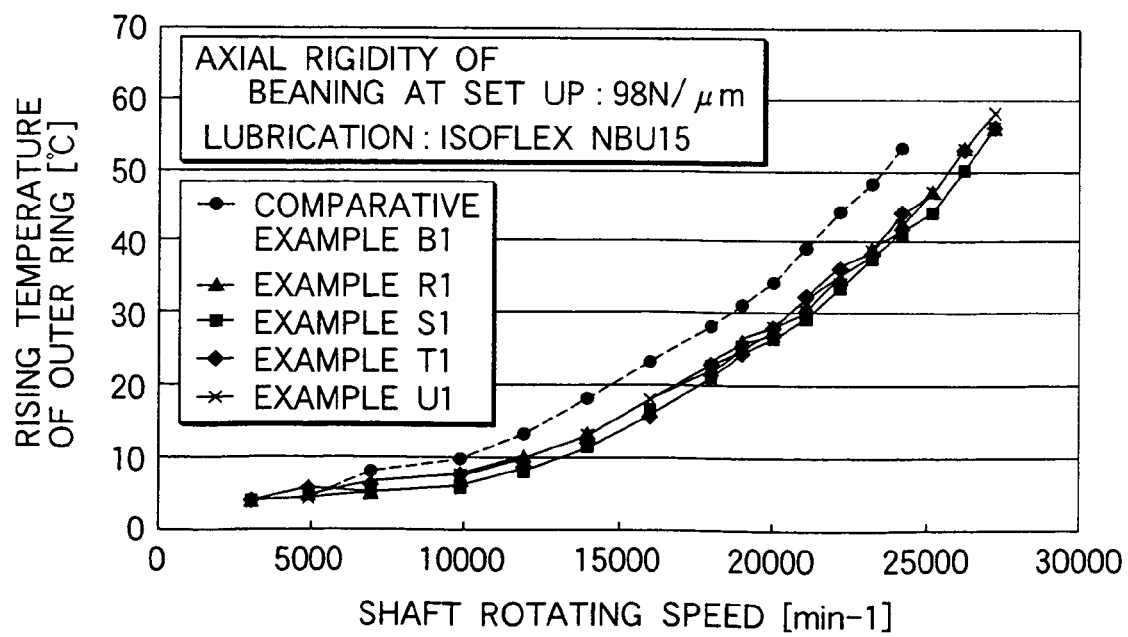
FIG. 20 is a graph sowing the relationship between the rotating speed of the shaft and the rising temperature of the outer ring in the Comparative Example and the Examples.

FIG. 20 shows the experimented results of measuring the rising temperatures (temperatures in the outer ring) and the limit of the seizure of the angular ball bearing in the grease lubrication. The specimens used then are shown in Table 8. The rising temperature corresponds to the heating value generated in the entire angular ball bearing.

TABLE 8

| Bearing | Qualities of films | A (μm) | B (μm) | C (GPa) | D (GPa) | E | F | G (° C.) | H (mm) | I (mm) | J (mm) | K (mm) |
|---|---|---|---|---|---|---|---|---|---|---|---|---|
| Comparative Example B1 | Absence | — | — | — | — | SUJ2 | $Si_3N_4$ | 18 | 65 | 100 | 81.65 | 7.144 |

TABLE 8-continued

| Bearing | Qualities of films | A (μm) | B (μm) | C (GPa) | D (GPa) | E | F | G (° C.) | H (mm) | I (mm) | J (mm) | K (mm) |
|---|---|---|---|---|---|---|---|---|---|---|---|---|
| Example R1 | DLC (Made by Kobe Steel Works Ltd.) | 2 | — | 29 | 230 | SUJ2 | $Si_3N_4$ | 18 | 65 | 100 | 81.65 | 7.144 |
| Example S1 | DLC (Made by Kobe Steel Works Ltd.) | 2 | 2 | 13 | 110 | SUJ2 | $Si_3N_4$ | 18 | 65 | 100 | 81.65 | 7.144 |
| Example T1 | DLC (Made by Shinko Seiki Ltd.) | 2 | — | 22 | 240 | SUJ2 | $Si_3N_4$ | 18 | 65 | 100 | 81.65 | 7.144 |
| Example U1 | DLC (Made by Shinko Seiki Ltd.) | 2 | 2 | 23 | 270 | SUJ2 | $Si_3N_4$ | 18 | 65 | 100 | 81.65 | 7.144 |

A: Film thickness of inner ring
B: Film thickness of outer ring
C: Hardness of plastic deformation
D: Equivalent elastic modulus
E: Material of inner and outer ring
F: Material of rolling elements
G: Contact angle (Degree)
H: Inner diameter
I: Outer diameter
J: Pitch diameter of rolling element
K: Diameter of rolling element This experiment uses as the specimens a plurality of angular ball bearings comprising the inner ring made of SUJ2 having the inner diameter of 65 mm, the outer ring made of SUJ2 having the outer diameter of 100 mm and the ceramic rolling elements made of $Si_3N_4$ (pitch diameter: 81.65 mm). The retainer is the outer ring guiding type.

In the experiments in FIG. 20, the load is actuated by the amount of setting preload for constant position preload when setting up the respective angular ball bearings as the specimens (axial rigidity of the bearing at setting up: 98 N/μm), and as the lubricating way of the angular ball bearing, the grease-lubrication is used where Isoflex NBU made by NOK Kluber Inc. (the sealing amount: 15% of the space capacity of the bearing).

In FIG. 20, values of the rising temperatures in the outer ring show results of measuring the temperatures in the outer ring in terms of the rising temperatures in the outer ring (temperatures in the outer ring—temperatures in the outside air) by attaching the thermocouple to the outer diameter face of the outer ring.

The Example R1 in FIG. 20 is formed with the DLC film to the only raceway surface of the inner ring of the angular ball bearing by use of the UBMS apparatus 504 made by Kobe Steel Works, Ltd.

The Example S1 in FIG. 20 is formed with the DLC film to the raceway surface of the inner ring and the raceway surface of the outer ring of the angular ball bearing by use of the UBMS apparatus 504 made by Kobe Steel Works, Ltd.

The Example T1 in FIG. 20 is formed with the DLC film to the only raceway surface of the inner ring of the angular ball bearing by use of the PIG system film forming apparatus made by Shinko Seiki Ltd.

The Example U1 in FIG. 20 is formed with the DLC film to the raceway surface of the inner ring and the raceway surface of the outer ring of the angular ball bearing by use of the PIG system film forming apparatus made by Shinko Seiki Ltd.

The Comparative Example B1 in FIG. 20 is the conventional angular ball bearing not formed with the DLC film.

It is seen from FIG. 20 that the inventive products R1, S1, T1 and U1 are lower in the rising temperatures (temperatures in the outer ring) and higher in the limit of the seizure than the Comparative Example B1, and show substantially equal performances, and thus it is seen that even if forming the DLC film on the only raceway surface of the inner ring, the inventive products are useful to the high speed and the temperature slow rising of the angular ball bearing.

Figure 21:
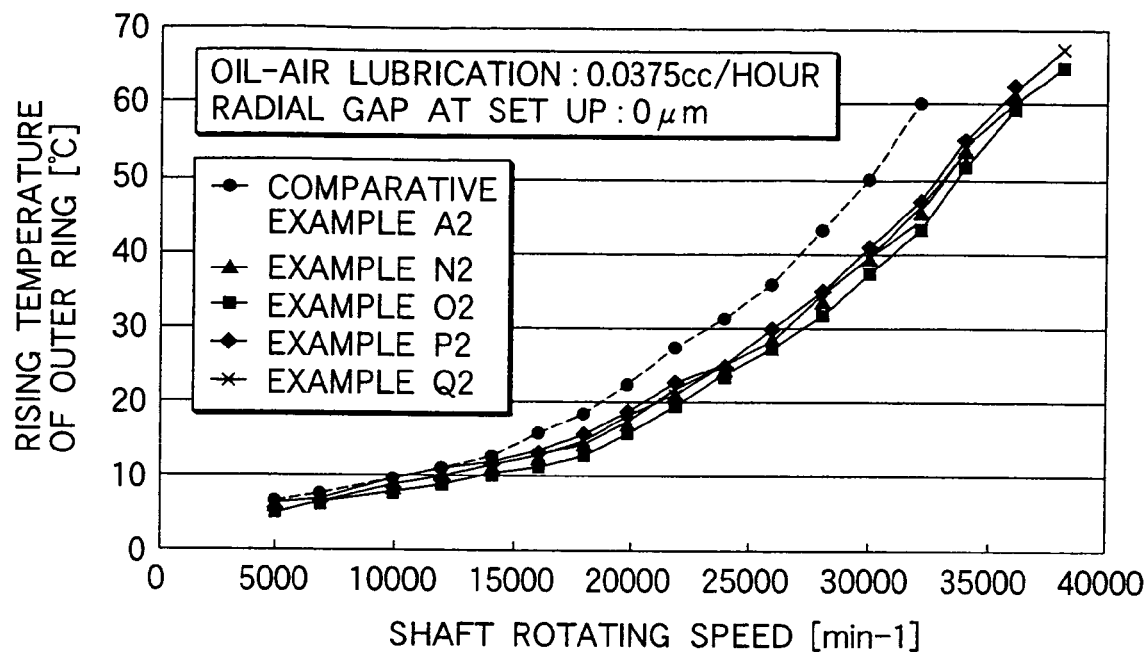
FIG. 21 is a graph sowing the relationship between the rotating speed of the shaft and the rising temperature of the outer ring in the Comparative Example and the Examples.

FIG. 21 shows the experimented results of measuring the rising temperatures (temperatures in the outer ring) and the limit of the seizure of the cylindrical roller bearing in the oil air lubrication. The specimens used then are shown in Table 9. The rising temperature corresponds to the heating value generated in the entire angular ball bearing.

TABLE 9

| Bearing | Qualities of films | A (μm) | B (μm) | C (GPa) | D (GPa) | E | F | H (mm) | I (mm) | J (mm) |
|---|---|---|---|---|---|---|---|---|---|---|
| Comparative Example A2 | Absence | — | — | — | — | Alloy Steel | Alloy Steel | 70 | 110 | 91 |
| Example N2 | DLC (Made by Kobe Steel Works Ltd.) | 2 | — | 13 | 110 | Alloy Steel | Alloy Steel | 70 | 110 | 91 |

TABLE 9-continued

| Bearing | Qualities of films | A (μm) | B (μm) | C (GPa) | D (GPa) | E | F | H (mm) | I (mm) | J (mm) |
|---|---|---|---|---|---|---|---|---|---|---|
| Example O2 | DLC (Made by Kobe Steel Works Ltd.) | 2 | 2 | 30 | 190 | Alloy Steel | Alloy Steel | 70 | 110 | 91 |
| Example P2 | DLC (Made by Shinko Seiki Ltd.) | 2 | — | 12 | 140 | Alloy Steel | Alloy Steel | 70 | 110 | 91 |
| Example Q2 | DLC (Made by Shinko Seiki Ltd.) | 2 | 2 | 17 | 160 | Alloy Steel | Alloy Steel | 70 | 110 | 91 |

A: Film thickness of inner ring and collar
B: Film thickness of outer ring
C: Hardness of plastic deformation
D: Equivalent elastic modulus
E: Material of inner and outer rings
F: Material of rolling elements
H: Inner diameter
I: Outer diameter
J: Pitch diameter of rolling element This experiment uses as the specimens a plurality of cylindrical roller bearings comprising an inner ring having an inner diameter of 70 mm and made of the heat resistant-specified bearing steel containing Si: 0.7 to 1.5 wt %, Cr: 0.5 to 2.0 wt % and Mo: 0.5 to 2.0 wt % and previously treated with carbonitriding on the surface thereof, the outer ring having an outer diameter of 110 mm and made of the same material as the inner ring and the rolling elements made of the same material as the inner ring (pitch diameter: 91 mm). The retainer is the outer ring guiding type.

In the experiments shown in FIG. 11, radial spaces were adjusted to be 0 μm for setting up the cylindrical roller bearings as the specimens. The oil air lubrication where the lubricant is VG22 oil is used as a lubricating way. The VG22 oil is a lubricant defined in JIS (Japanese Industrial Standards) K2211. Values of the rising temperatures in the outer ring on the axis of ordinate in FIG. 21 show results of measuring the temperatures in the outer ring in terms of the rising temperatures in the outer ring (temperatures in the outer ring−temperatures in the outside air) by attaching the thermocouple 34 to the outer diameter face of the outer ring. As to the lubricating conditions, the inventive products (Examples) and the existing products (Comparative Examples) were subjected to the experiments of 0.0375 cc/hour.

The Example N2 in FIG. 21 is formed with the DLC film to the raceway surface of the inner ring and the collar-edge of the cylindrical roller bearing by use of UBMS apparatus 504 made by Kobe Steel Works, Ltd.

The Example O2 in FIG. 21 is formed with the DLC film to the raceway surface of the inner ring, the collar-edge and the raceway surface of the outer ring of the cylindrical roller bearing by use of the UBMS apparatus 504 made by Kobe Steel Works, Ltd.

The Example P2 in FIG. 21 is formed with the DLC film to the raceway surface of the inner ring and the collar-edge of the cylindrical roller bearing by use of the PIG system film forming apparatus made by Shinko Seiki Ltd.

The Example Q2 in FIG. 21 is formed with the DLC film to the raceway surface of the inner ring, the collar-edge and the raceway surface of the outer ring of the cylindrical roller bearing by use of the PIG system film forming apparatus made by Shinko Seiki Ltd.

The Comparative Example A2 in FIG. 21 is the conventional cylindrical roller bearing not formed with the DLC film.

As seen from FIG. 11, the inventive products N2, O2, P2 and Q2 show substantially equal performances, and are lower in the rising temperatures (temperatures in the outer ring) and higher in the limit of the seizure than the Comparative Example A2. Accordingly, apparently the inventive products (Examples) are useful to the high speed and the temperature slow rising of the cylindrical roller bearing.

Figure 22:
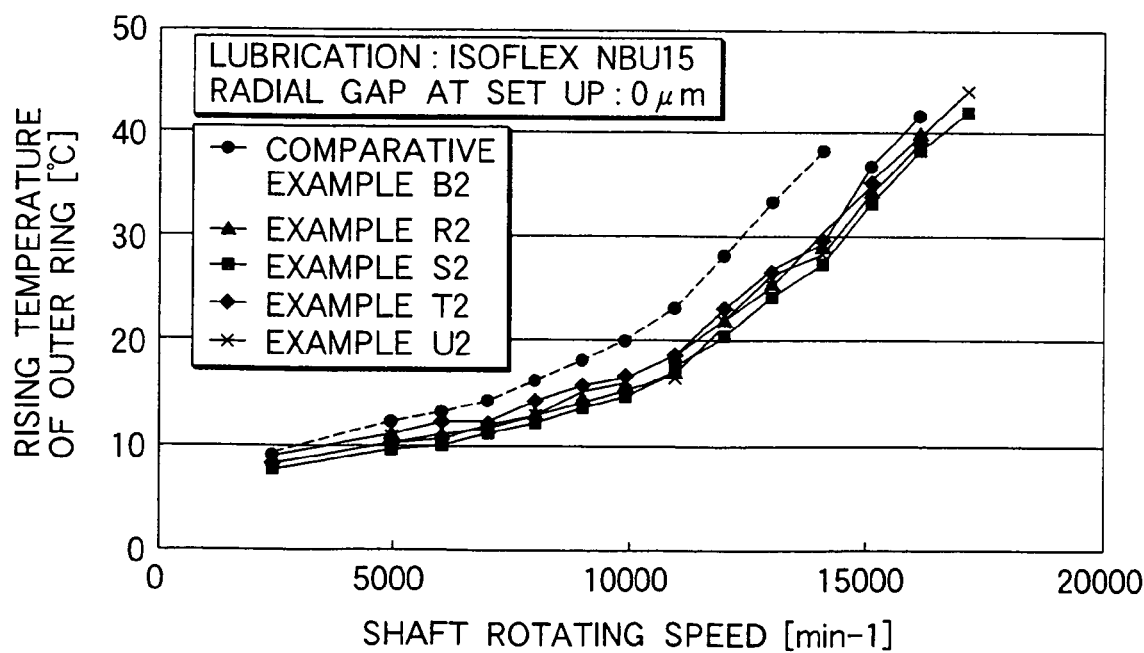
FIG. 22 is a graph sowing the relationship between the rotating speed of the shaft and the rising temperature of the outer ring in the Comparative Example and the Examples.

FIG. 22 shows the experimented results of measuring the rising temperatures (temperatures in the outer ring) and the limit of the seizure of the cylindrical roller bearing in the grease lubrication. The specimens used then are shown in Table 10. The rising temperature corresponds to the heating value generated in the entire angular ball bearing.

TABLE 10

| Bearing | Qualities of films | A (μm) | B (μm) | C (GPa) | D (GPa) | E | F | H (mm) | I (mm) | J (mm) |
|---|---|---|---|---|---|---|---|---|---|---|
| Comparative Example B2 | Absence | — | — | — | — | Alloy Steel | Alloy Steel | 70 | 110 | 91 |
| Example R2 | DLC (Made by Kobe Steel Works Ltd.) | 2 | — | 29 | 230 | Alloy Steel | Alloy Steel | 70 | 110 | 91 |

TABLE 10-continued

| Bearing | Qualities of films | A (μm) | B (μm) | C (GPa) | D (GPa) | E | F | H (mm) | I (mm) | J (mm) |
|---|---|---|---|---|---|---|---|---|---|---|
| Example S2 | DLC (Made by Kobe Steel Works Ltd.) | 2 | 2 | 13 | 110 | Alloy Steel | Alloy Steel | 70 | 110 | 91 |
| Example T2 | DLC (Made by Shinko Seiki Ltd.) | 2 | — | 22 | 240 | Alloy Steel | Alloy Steel | 70 | 110 | 91 |
| Example U2 | DLC (Made by Shinko Seiki Ltd.) | 2 | 2 | 23 | 270 | Alloy Steel | Alloy Steel | 70 | 110 | 91 |

A: Film thickness of inner ring and collar
B: Film thickness of outer ring
C: Hardness of plastic deformation
D: Equivalent elastic modulus
E: Material of inner and outer rings
F: Material of rolling elements
H: Inner diameter
I: Outer diameter
J: Pitch diameter of rolling element This experiment uses as the specimens a plurality of cylindrical roller bearings comprising an inner ring having an inner diameter of 70 mm and made of the heat resistant-specified bearing steel containing Si: 0.7 to 1.5 wt %, Cr: 0.5 to 2.0 wt % and Mo: 0.5 to 2.0 wt % and previously treated with carbonitriding on the surface, an outer ring having an outer diameter of 110 mm and made of the same material as the inner ring and rolling elements made of the same material as the inner ring (pitch diameter: 91 mm). The retainer is the outer ring guiding type.

In the experiments shown in FIG. 22, radial spaces were adjusted to be 0 μm for setting up the cylindrical roller bearings as the specimens. The oil air lubrication where the lubricant is Isoflex NBU15 (sealing amount: 10% of the space capacity of the bearing) is used as the lubricating way. Values of the rising temperatures in the outer ring on the axis of ordinate in FIG. 22 show results of measuring the temperatures in the outer ring in terms of the rising temperatures in the outer ring (temperatures in the outer ring–temperatures in the outside air) by attaching the thermocouple 34 to the outer diameter face of the outer ring.

The Example R2 in FIG. 22 is formed with the DLC film to the raceway surface of the inner ring and the collar-edge of the cylindrical roller bearing by use of the UBMS apparatus 504 made by Kobe Steel Works, Ltd.

The Example R2 in FIG. 22 is formed with the DLC film to the raceway surface of the inner ring, the collar-edge and the raceway surface of the outer ring of the cylindrical roller bearing by use of the UBMS apparatus 504 made by Kobe Steel Works, Ltd.

The Example T2 in FIG. 22 is formed with the DLC film to the raceway surface of the inner ring and the collar-edge of the cylindrical roller bearing by use of the PIG system film forming apparatus made by Shinko Seiki Ltd.

The Example U2 in FIG. 22 is formed with the DLC film to the raceway surface of the inner ring, the collar-edge and the raceway surface of the outer ring of the cylindrical roller bearing by use of the PIG system film forming apparatus made by Shinko Seiki Ltd.

The Comparative Example B2 in FIG. 22 is the conventional cylindrical roller bearing not formed with the DLC film.

As seen from FIG. 22, the inventive products R2, S2, T2 and U2 are lower in the rising temperatures (temperatures in the outer ring) and higher in the limit of the seizure than the Comparative Example B2. Accordingly, apparently the inventive products R2, S2, T2 and U2 show substantially equal performances and thus it is seen that even if forming the DLC film on the only inner ring (the raceway surface of the inner ring and the collar-edge), the inventive products are useful to the high speed and the temperature rising slowly of the cylindrical roller bearing.

As is seen from the above explanation, according to the fifth and sixth embodiments of the invention, it is possible to realize of course the low torque and the generation of low heat and accomplish the seizure resistance and the abrasion resistance under the high speed rotation.

Explanation will be made to a seventh embodiment of the rolling sliding member and the rolling apparatus with reference to FIGS. 23 to 27.

Figure 23:
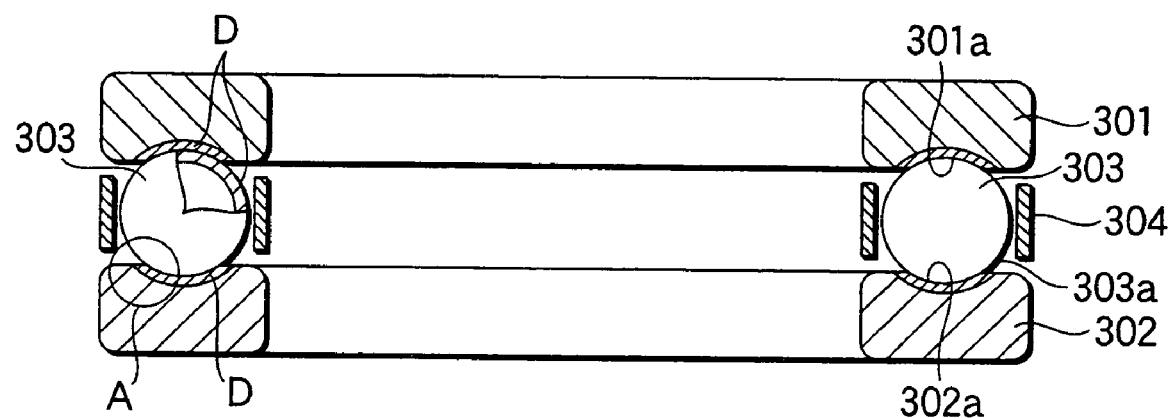
FIG. 23 is a vertically cross sectional view showing the structure of a thrust ball bearing as one embodiment of the rolling apparatus according to the invention.

The thrust ball bearing of FIG. 23 comprises the inner ring 301 having the raceway surface 301a, the outer ring 302 having the raceway surface 302a opposite to the raceway surface 301a, a plurality of balls 303 rotatably disposed between both raceway surfaces 301a, 302a, and a retainer 304 for holding the plurality of balls 303 between both raceway surfaces 301a, 302a at even intervals in the peripheral direction of the bearing.

The inner ring 301, the outer ring 302 and the balls 303 are made of steel such as SUJ2. As to dimensions of the inner ring 301 and the outer ring 302, the inner diameter is 30 mm, the outer diameter is 62 mm and the thickness is 7 mm, and a transversally cross section of the raceway surfaces 301a, 302a is formed in an arc-shape having the curvature of radius being 52% of the diameter of the ball 303.

Figure 24:
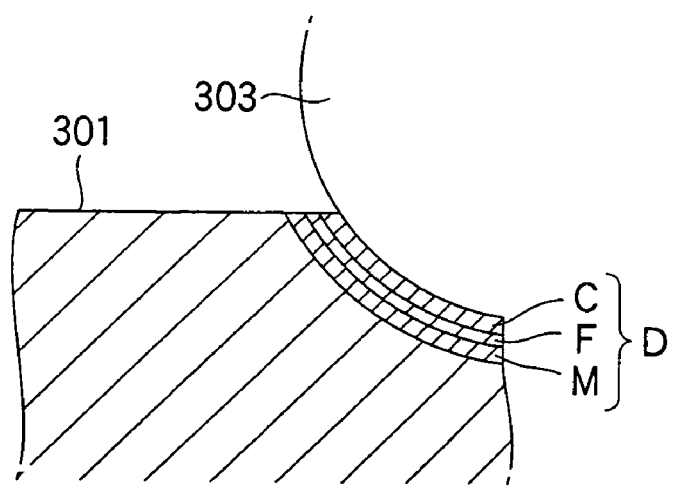
FIG. 24 is a partially enlarged cross sectional view of a part A of FIG. 23.

The raceway surface 301a of the inner ring 301, the raceway surface 302a of the outer ring 302 and the rolling faces 303a of the balls 303 are provided with the diamond like carbon layer (DLC) D having the lubricating property and the equivalent elastic modulus being 80 to 240 GPa, preferably, 100 to 240 GPa. The DLC layer D, as shown in FIG. 24, includes three layers of a metallic layer M made of two kinds or more of metals of Cr, W, Ti, Si, Ni, and Fe, a composite layer F composed of the metal and carbon and a carbon layer C composed of carbon, and the three layers are formed in the order of the carbon layer C, the composite layer F and the metallic layer M from a surface side.

A process for forming the DLC film will be explained by use of an example of the outer ring 302.

The degreased outer ring 302 was installed on the unbalanced magnetron spattering apparatus (UMBS 504) made by Kobe Steel Works, Ltd., and a bombard treatment was performed for 15 minutes through the spattering process by an argon plasma.

Targeting tungsten and chromium, these two kinds of metals were spattered on the raceway surface 2a so as to form the metallic layer M. Subsequently, continuing the spattering of these two kinds of metals, a sputtering of carbon was started, targeting carbon. By the spattering, the composite layer F of metallic carbide of the two kinds of metals and carbon was formed on the metallic layer M.

While gradually decreasing the spattering efficiency of the two kinds of metals, the carbon spattering efficiency was slowly increased. The spattering of the two kinds of metals was ended, and with the only carbon spattering, the carbon layer C was formed on the composite layer F (the entire thickness of the DLC film: 2.2 μm).

If carrying out the film forming by the spattering, it is possible to form the DLC film continuously and slowly changing the composition of the layer from the layer (metallic layer M) composed of the two kinds of metals toward the layer (carbon layer). The DLC film D of such a structure has the very excellent adhesiveness between the respective layers (metallic layer M, composite layer F and carbon layer C) and also the very excellent adhesiveness between the carbon layer having the excellent lubricating property and the steel as the base material.

The UBMS apparatus is attached with a plurality of targets to be used for spattering, and as the spattering electric sources of the respective targets are independently controlled, whereby the spattering efficiency of the respective elements may be arbitrarily controlled, the UBMS apparatus is suited to the film-forming. For example, in the process of forming the composite layer F and the carbon layer C, while decreasing the electric power of the spatter source (DC source) of the metal targets, the power of the spatter source (DC source) of the carbon target is increased (at this time, negative bias voltage is supplied to the outer ring 302).

Herein, explanation will be made to results of analyzing the elements forming the DLC film by use of a glow discharge emission analyzer (GDLS-9950 made by Shimadzu Corporation.) with reference to the measuring chart of FIG. 25.

An axis of abscissa of the chart shows the depth from the surface, meaning that 0 nm is the surface of the DLC film. An axis of ordinate shows the containing amounts of the respective elements in positions of the depth.

Since information in the depth direction is obtained by discharge using argon gas, curve lines designating the containing amounts of the respective elements are broad in the interface between the steel as the base material and the DLC film D. As the interface between the steel and the DLC film is positioned in the vicinity of 8000 nm, it is read from this chart that the thickness of the DLC film is about 8 μm, but as this method analyzes circular parts of 2 mm diameter by the discharge emission, the DLC film appears to be about 8 μm in the precision in the depth direction, but the actual thickness of the DLC film is 2.2 μm.

With respect to the bearing having almost the same structure as the thrust ball bearing, testing bearings were prepared which variously changed kinds of metals used in the metallic layer and the composite layer, and the endurance tests were carried out for appreciating rolling fatigue of the DLC film. In the tests, the DLC film was formed only on the raceway surface of the outer ring, and three pieces of balls were disposed between the raceway surfaces of the inner and outer rings. A mineral oil of 0.05 ml which was diluted with hexane to be 3% was coated to lubricate the raceway surface of the outer ring.

The conditions of the rotating test were that the axial load was 6 kN and the rotation speed was 6000 rpm. The thermo couple was inserted in the interior for measuring temperature, and when being 200° C., the DLC film was broken and the base material was exposed, and so the time reaching 200° C. was determined to be an endurance time.

Figure 26:
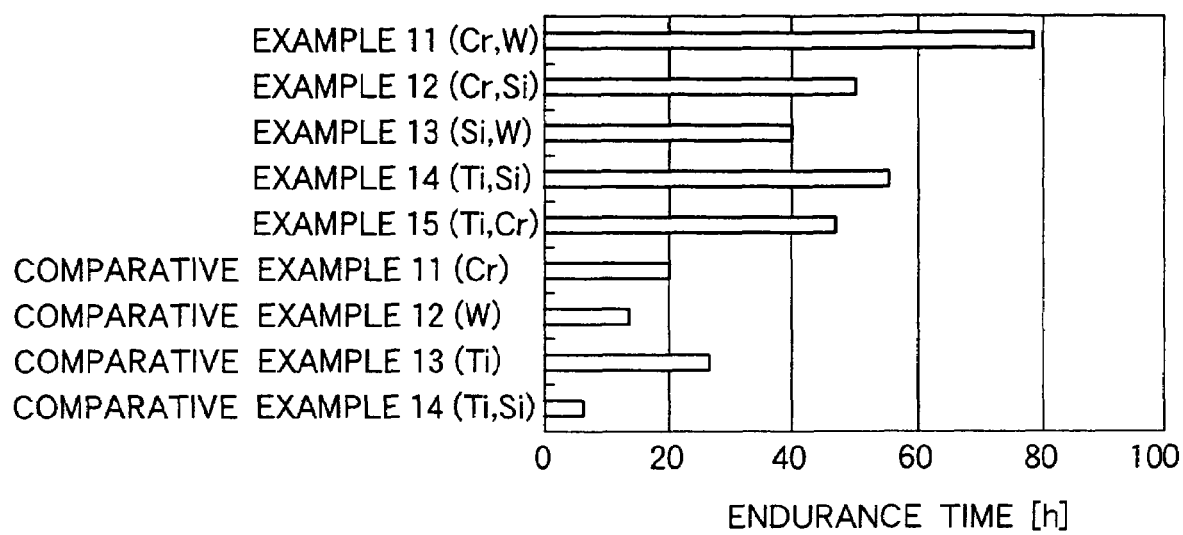
FIG. 26 is a graph showing the interrelation between the number and kinds of metals used to the composite layer and the during time.

The kinds of the tested metals and the tested results are shown in the graph of FIG. 26. The Examples 11 to 15 use the two kinds of metals, and generation of the metallic carbide was controlled by an ion assist effect, so that the endurance time was good. In particular, the combination of chromium and tungsten in the Example 1 was very excellent in the endurance time. The other combinations of titanium and tungsten or titanium-chromium-tungsten were particularly preferable.

Thus, the combination of metal of low melting points such as chromium and metal of high melting points such as tungsten, is desirable, since the brittleness of the metallic carbide becomes small, and the effect is large if the metal of the high melting point is more than the metal of the low melting point.

On the other hand, the Comparative Examples 1 to 3 having the composite layer of one kind of metal was large in brittleness of the metallic carbide, so that the DLC film was subject to destruction, and the sufficient endurance time was not obtained.

The Comparative Example 14 used the two kinds of metals (chromium and titanium), and formed the film of the metallic layer by a holocathode type ion plating process on which the carbon layer was formed by the plasma CVD process. Therefore, having no composite layer, the adhesiveness was insufficient between the DLC film and the steel as the base material, so that the endurance time was short.

With respect to the bearing having almost the same structure as the thrust ball bearing of FIG. 23, testing bearings were prepared which variously changed the equivalent elastic modulus of the DLC film, and the rotating tests were carried out for evaluating the correlation between the equivalent elastic modulus and the endurance of the DLC film. In the tests, the outer ring was a plane member having no raceway groove, and the raceway part contacting with the ball was formed with the DLC film, and 11 pieces of balls were disposed between the raceway surfaces of the inner and outer rings.

The DLC film was formed by the UBMS apparatus similarly to the above mentioned, and the two kinds of chromium and tungsten were used to the metallic layer and the composite layer. The equivalent elastic modulus of the DLC film can be changed by controlling the bias voltage supplied to the outer ring, otherwise controlling the partial pressure of a gas to be introduced.

If controlling sorts or ratios of the partial pressure of the gases to be introduced (Ar, $H_2$ or hydrocarbon based gas such as methane), the equivalent elastic modulus and the surface sliding resistance of the DLC film can be arbitrarily controlled, so that it is possible to form a desired DLC film meeting a purpose by introducing a mixed gas or a sole gas.

Further, the thickness of the DLC film can be more precisely controlled depending on the spattering time.

Figure 27:
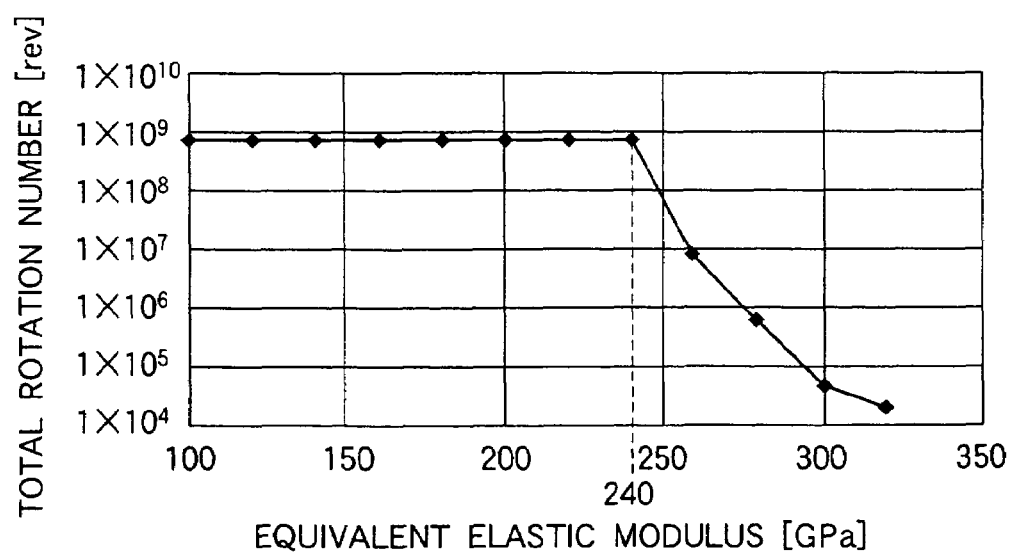
FIG. 27 is a graph showing the interrelation between the equivalent elastic modulus and the durability of the DLC layer.

The rotating test was carried out in the mineral oil, and the testing conditions (the axial load and the rotating speed) were the same as the above mentioned testing conditions. Vibrations were measured by an accelerating sensor made by Endebuko Inc. attached to a bearing supporting portion, and the breakage of the DLC film was detected by increase of the vibration values. The endurance of the DLC film was evaluated by the total rotation number of the bearing until breakage of the DLC film. The testing results are shown in the graph of FIG. 27.

It is seen from this graph that if the equivalent elastic modulus of the DLC film is 100 to 240 GPa, the endurance of the DLC film is good.

The seventh embodiment shows one example of the invention, and the invention is not limited to this embodiment.

In the seventh embodiment, the thrust ball bearing is exemplified for explanation, but the rolling apparatus of the invention may be applied to various rolling bearings, for example, to a deep groove ball bearing, angular ball bearing, cylindrical roller bearing, tapered roller bearing, needle roller bearing, radial shape rolling apparatus such as a self-aligning roller bearing, a thrust shape rolling apparatus such as the thrust roller bearing.

In the seventh embodiment, the rolling bearing is exemplified as the rolling apparatus for explanation, but the rolling apparatus of the invention may be applied to various kinds of rolling apparatus, for example, to a linear guide bearing, ball screw, or other rolling apparatus such as direct-acting bearing.

In addition, the DLC film was formed by the spattering using the unbalanced magnetron, but may depend on a pulse laser arc deposition process or a plasma DVC process. Such spattering is most suited which uses the unbalanced magnetron easy to independently control the equivalent elastic modulus and a plastic deformation hardness.

As mentioned above, the DLC film having the composite layer composed of the two kinds or more of metals and carbon is excellent in adhesiveness and small in brittleness. Thus, the rolling sliding member and the rolling apparatus of the invention can be suitably served under conditions of acting a large contacting stress or under an oil free condition.

As the equivalent elastic modulus of the DLC film is 80 to 240 GPa, preferably, 100 to 240 GPa, the DLC film is difficult to be broken even if the repeated stress acts.

Further, a description will be given of an eighth embodiment of the invention with reference to FIGS. 28 and 29.

Figure 28:
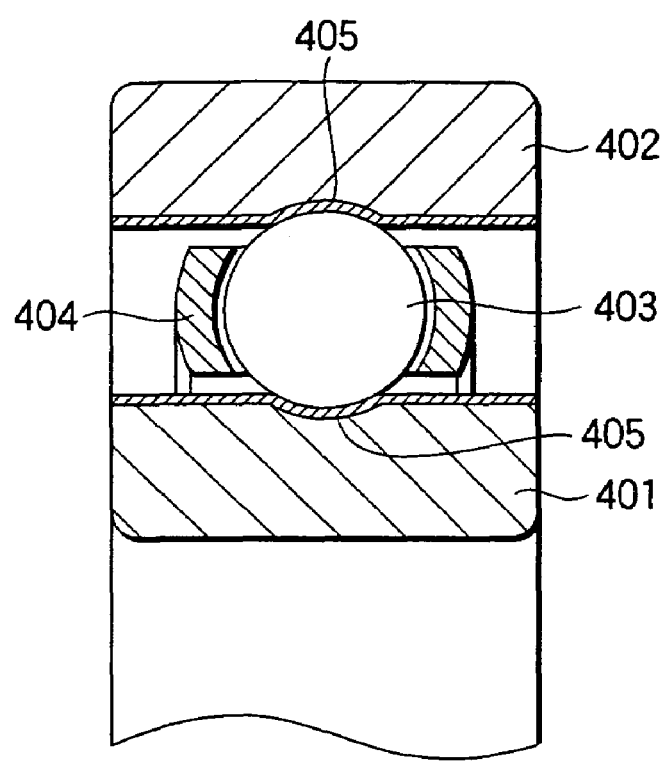
FIG. 28 is a view showing the rolling bearing of an eighth embodiment according to the invention.

In the eighth embodiment, a deep groove ball bearing shown in FIG. 28 is exemplified as a rolling sliding member.

In this rolling bearing, balls as rolling elements 403 are disposed between the rolling faces of an inner ring 401 and an outer ring 402, and further, the rolling bearing includes a waveform retainer 404.

The inner ring 401, the outer ring 402 and the rolling elements 403 are processed where the bearing steel is the base material, and the DLC film 405 is formed on the rolling face of the inner ring 401 and the rolling face of the outer ring 402.

The base material constructing the inner ring 401, the outer ring 402 and the rolling elements 403 is subjected to the tempering treatment at high temperature from 200° C. to 280° C., so that the retained austenite is 6 vol % or lower, and the surface hardness is in the range of Hv600 to Hv740.

The DLC film 405 is formed by using the unbalanced magnetron spattering apparatus (UBMS) as described in the third and fourth embodiments and is laminated in the order of the metallic layer, the composite layer and the carbon layer from the side of the base material surface.

In the above structured rolling bearing, although forming the DLC film 405, the dimensional stability of the bearing parts is heightened, the adhesiveness of the DLC film 405 is improved, and the peeling at the early serving period is prevented even if receiving the repeated stress.

The above mentioned bearings are exemplified with SUJ 1 to 5 described in JIS as shown in Table 11.

TABLE 11

| JIS | C | Si | Mn | P | S | Cr | Mo |
|---|---|---|---|---|---|---|---|
| SUJ1 | 0.95~1.10 | 0.15~0.35 | <0.50 | <0.025 | <0.025 | 0.90~1.20 | — |
| SUJ2 | 0.95~1.10 | 0.15~0.35 | <0.50 | <0.025 | <0.025 | 1.30~1.60 | — |
| SUJ3 | 0.95~1.10 | 0.40~0.70 | 0.90~1.15 | <0.025 | <0.025 | 0.90~1.20 | — |
| SUJ4 | 0.95~1.10 | 0.15~0.35 | <0.50 | <0.025 | <0.025 | 1.30~1.60 | 0.10~0.25 |
| SUJ5 | 0.95~1.10 | 0.40~0.70 | 0.90~1.15 | <0.025 | <0.025 | 0.90~1.20 | 0.10~0.25 |

The eighth embodiment exemplifies the cases of forming the DLC film 405 on the outer ring 402 and the inner ring 401, and the DLC film 405 may be formed on the side of the rolling elements 403. By the way, it is sufficient that the DLC film exists at parts contacting with opposite members.

In the eighth embodiment, the deep groove ball bearing is exemplified for explanation, but the invention may be applied to various rolling bearings, for example, to an angular ball bearing, cylindrical roller bearing, tapered roller bearing, needle roller bearing, radial shape rolling apparatus such as a self-aligning roller bearing, a thrust shape rolling apparatus such as the thrust roller bearing.

In the eighth embodiment, the rolling bearing is exemplified for explanation, but the rolling sliding member of the invention may be applied to various kinds of rolling apparatus, for example, to a linear guide bearing, ball screw, or other rolling apparatus such as direct-acting bearing.

Further, the case of forming the DLC film by the UBMS process is exemplified, and other film forming processes such as CVD, plasma CVD, ion beam forming process, or ionization vapor deposition are enough. Depending on the UBMS process, the adhesiveness of the DLC film is suitably heightened.

Here, deep groove ball bearings of the Examples 16 to 19 applying the eighth embodiment of the invention and deep groove ball bearings of the Comparative Examples 16 to 19 for comparison were manufactured.

The inner ring 401, the outer ring 402 and the rolling elements 403 are made of the bearing steel SUJ2 specified by JIS, and as to the Example 17, the tempering was carried out at 240° C., to obtain the hardness of Hv694.

As to the Comparative Examples 16-18, the tempering was carried out at 160° C., to obtain the hardness of Hv765.

As shown in Table 11, the Example 16 formed the DLC film composed of the three layers of the metallic layer made of Cr and Fe, the composite layer made of metal and carbon and the carbon layer made of carbon on the inner and outer rings 401, 402 through the UBMS process.

Further, the Example 17 formed the DLC film composed of the three layers of the metallic layer made of Cr and Fe, the composite layer made of metal and carbon and the carbon layer made of carbon to the inner and outer rings 401, 402 through the ion plating process.

Also as to the Comparative Examples 16 to 19, as shown in Table 12, the DLC films were formed by any of the plasma CVD process, ion plating process, or UBMS process.

The amounts of the retained austenite existing in the base material surface are also described herein.

TABLE 12

| | Film forming process | Tempering temperature (° C.) | Hardness before film-forming (Hv) | Amount of residual austenite (vol %) | Intermediate layer | Film thickness (μm) | Life (h) |
|---|---|---|---|---|---|---|---|
| Comparative Example 16 | Plasma CVD | 160 | 765 | 11 | Titanium | 2 | 1.2 |
| Comparative Example 17 | Ion plating | 160 | 763 | 8 | Tungsten | 2 | 2.8 |
| Comparative Example 18 | UBMS | 160 | 760 | 9 | Chromium | 2 | 4.5 |
| Example 16 | UBMS | 200 | 740 | 6 | Chromium | 2 | 10 |
| Example 17 | UBMS | 240 | 694 | 1 | Chromium | 2 | 10 |
| Example 18 | UBMS | 260 | 640 | 0 | Chromium | 2 | 10 |
| Example 19 | UBMS | 290 | 610 | 0 | Chromium | 2 | 10 |
| Comparative Example 19 | UBMS | 320 | 590 | 0 | Chromium | 2 | 4.8 |

Test bearing: 6206
Face pressure: 1.6 GPa
Rotation number: 8000 rpm
Atmosphere: Atmospheric air
Lubrication: Mineral oil, 0.01 (cc/10 minutes)

In the tests, the thermocouple was inserted in the housing of the outer ring of the bearing, and the bearing life was judged at the time point when the temperature rose by 20° C. from the stationary temperature. The tests were stopped after 10 hours.

As seen from Table 12, each of the Examples 16 to 19 obtained the life of twice of the Comparative Examples.

That is, the amounts of the retained austenite in the Comparative Examples 16 to 18 are out of the inventive range, so that the lives are shorter than those of the Examples.

The amount of the retained austenite in the Comparative Example 19 is within the inventive range, so that the life is lengthened than those of the Comparative Examples 1 to 3, but since the tempering temperature is 320° C., the hardness in the base material is less than Hv600, and the lives are shorter than those of the Examples based on the invention.

The lives of the Examples 16 to 19 are long for the following reasons.

The Examples decompose the less amount of the retained austenite by heightening the temperature during film-forming, and as no change in dimension occurs, the adhesiveness of the DLC film is good. Namely, by determining the tempering temperature to be 200° C. or higher, an effect enabling to especially lengthen the lives of the bearings formed with the DLC is acknowledged.

If carrying out the tempering treatment at 260° C. or higher, the amount of the retained austenite can be made 0 vol %, but the surface hardness goes down. Therefore, the endurance when forming the DLC film having large hardness depends on the hardness of the base material.

The surface hardness available to the invention preferably ranges Hv600 to 740. The surface hardness referred to herein means a surface hardness prior to DLC film-forming.

Figure 29:
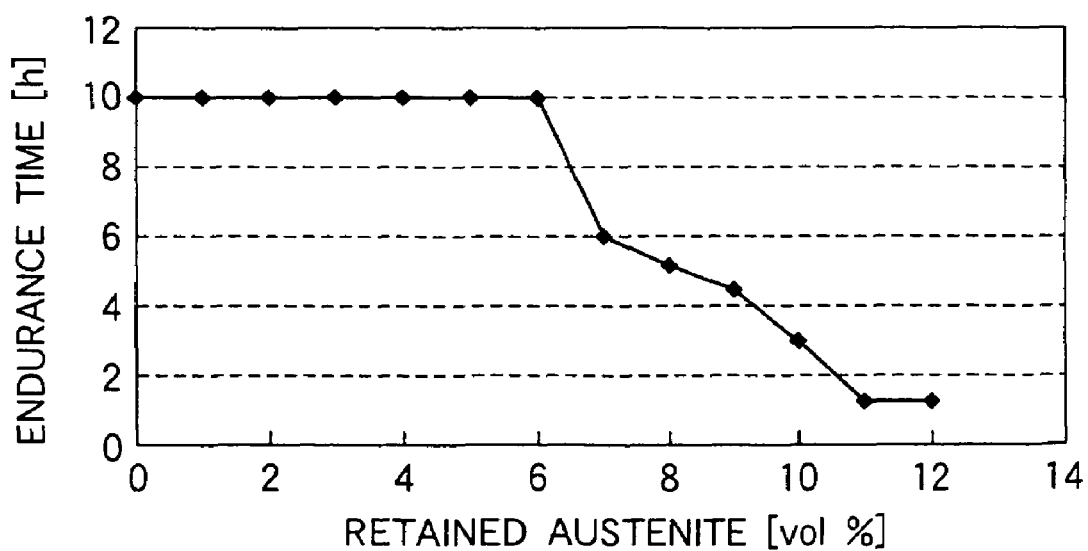
FIG. 29 is a view showing the relationship between the amount of the retained austenite and the endurance of the DLC coated bearing.

FIG. 29 shows the relationship between the amount of the retained austenite and the endurance of the DLC coated bearing.

If the amount of the retained austenite is more than 6 vol %, the dimensional change occurs in the bearing owing to the DLC treatment, and the adhesiveness and the bearing precision are deteriorated to make the endurance poor. Therefore, the amount of the retained austenite is desirably 6 vol % or less.

In particular, 0 vol % is suited, and the surface hardness of Hv600 or high is most suited to the invention.

These conditions are obtained by the bearing of a high carbon chromium steel tempered at 200 to 290° C.

As mentioned above, according to the eighth embodiment of the invention, it is possible to secure the excellent lubricating properties of the DLC film for a long period of time without peeling of the DLC film even under usage of large contact stress.

Next, a description will be given of ninth and tenth embodiments of the rolling member, referring to FIGS. 30 to 39.

<Ninth Embodiment>

Figure 30:
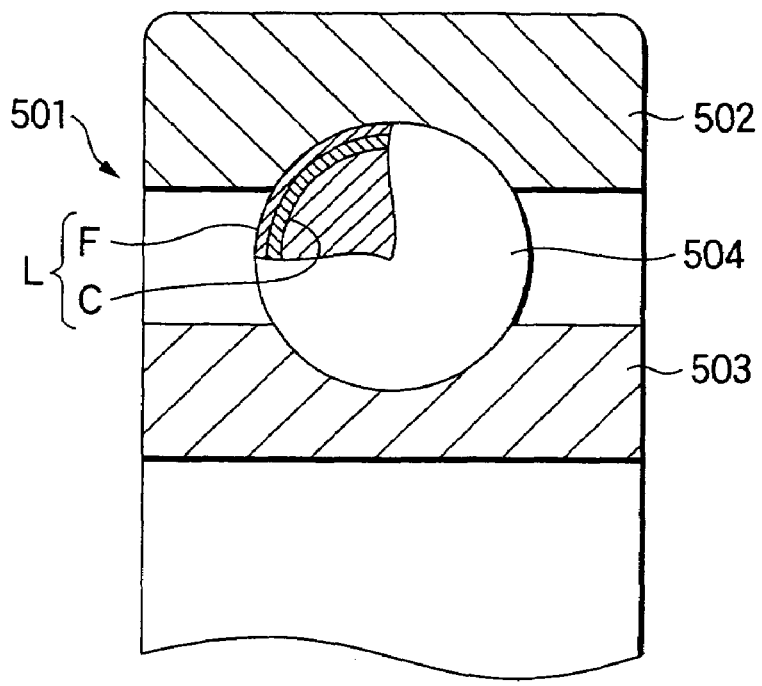
FIG. 30 is a vertically cross sectional view showing the deep groove ball bearing according to a ninth embodiment of the invention.

FIG. 30 is a vertically cross sectional view showing the structure of a single-row deep groove ball bearing 501 as an example of the rolling member according to the ninth embodiment of the invention. The deep groove ball bearing 501 comprises an outer ring 502, an inner ring 503, a plurality of balls 504 rotatably disposed between the outer ring 502 and the inner ring 503, and a steel-made non-contacting seal (Z shape—not shown). The dimension is 8 mm of an inner diameter, 22 mm of an outer diameter and 7 mm of a width.

The outer ring 502, the inner ring 503 and the balls 504 are made of martensitic stainless steel (0.45 C-13 Cr-0.13N), quenched at 1050° C. for 30 min, subzero treated at −80° C. for 1 hr, and tempered at 460° C. for 2 hr. The ball 504 is provided with a lubricating layer L having lubricating property on a surface thereof. The lubricating layer L has the fluorine compound layer F and the diamond like carbon layer C. These two layers F and C are formed in the order of the fluorine compound layer F and the diamond like carbon layer C from the surface side.

The fluorine compound layer F comprises a fluorine compound having, e.g., perfluoroalkyl group and alkyl group. The diamond like carbon layer C comprises three layers of the metallic layer made of at least one kind of metals of Cr, W, Ti, Si, Ni and Fe, the composite layer made of metal and carbon, and the carbon layer made of carbon, and these layers are arranged in the order of the metallic layer, the composite layer and the carbon layer from the core portion.

Next, a description will be given of a method of forming the fluorine compound layer F and the diamond like carbon layer C on the surface of the ball 504.

Deoiled balls 504 were mounted on an unbalanced magnetron spattering apparatus (UBMS 504) made by Kobe Steel Works Ltd., a bombard treatment was performed for 15 minutes through the spattering process by an argon plasma, and then the metal layer (the intermediate layer) made of titanium was formed on a surface of the ball 504 as a target of titanium.

Subsequently, while supplying negative bias voltage to the balls 504, the spattering efficiency of the carbon target was increased, the composite layer and the carbon layer were formed, and the diamond like carbon C was formed. By use of a planetary ball mill, the surface of the ball 504 was finished to be Ra 0.004 μm, washed and dried.

As to the film-forming process, desirable are a sputtering using an unbalanced magnetron sputter, a pulse laser arc deposition process, or a plasma CVD, and among them, the spattering process using the unbalanced magnetron is suited to the rolling sliding member, since it controls easily and independently the equivalent elastic modulus and plastic deformation hardness.

In particular, in case the base material is the metallic layer, if an interior structure of the diamond like carbon C is made an oblique layer gradually changing the composition of the interior thereof, it is possible to render no interface therebetween, thereby enabling to much heighten the adhesiveness of the diamond like carbon C to the base material.

Besides, as mutual combination force of carbon atoms composing the diamond like carbon C is strong, the diamond like carbon C itself is less to be worn or spoiled. Further, the diamond like carbon C is made hard as mentioned above and smooth in the surface, so that the rolling resistance of the balls 4 is lightened and the rolling action is made very smooth and the diamond like carbon C is difficult to be worn. Roughness and hardness of the diamond like carbon C can be changed by adjusting pressure or temperature of the film-forming atmosphere when forming the diamond like carbon C, a kind of a gas, or supplying voltage.

The equivalent elastic modulus of the diamond like carbon C is preferably 80 to 240 GPa. If being more than 240 GPa, the equivalent elastic modulus is larger than that of steel, and the steel deforms prior to the diamond like carbon C, so that the diamond like carbon C is easily broken owing to repeated stress. If being less than 80 GPa, the surface hardness of the diamond like carbon C decreases, abrasion is easy to occur with respect to the contact stress, and the function of the diamond like carbon C would be spoiled.

The materials for composing the intermediate layer are not especially limited, as far as the alloying elements of the steel as the base material or such elements having atomic radii almost equivalent to those of the composing elements of the steel is concerned, and for example, Cr, W, Ti, Si, Ni, Fe, or Co are taken up. Among them, in case the base material is the stainless steel or the bearing steel, Ti, Cr or Ni are desirable for the intermediate layer, and depending on the alloy components of the steel, Si, W, or Co may be appropriately selected.

Next, the fluorine compound layer F is formed on the diamond like carbon layer C. Served as the fluorine compound is Surflon SC-101 (trade name) made by Asahi Glass Co., Ltd. being the fluorine compound having perfluoroalkyl group and alkyl group. This compound is diluted with a solvent such as ethyl acetate to produce a solution (dilution rate 10%), and this solution is coated on the surface of the ball 504 and heat-treated, and thus the fluorine compound layer F is formed. Specifically, the balls 504 are immersed in the solution, dried and heat-treated at 250° C. By such a treatment, the fluorine compound layer F is formed on the uppermost surface of the ball 504.

Incidentally, as the fluorine compound is very low in affinity to the metal, the adhesive force to the metal surface is weak. For example, JP-A-62-246621 discloses a method of forming a film of a compound having the perfluoroalkyl group on the metal surface, but as the compound having the lubricating property and the metal are very weak in correlation, the adhesiveness is low, and it is difficult to impart a sufficient lubricating property to the metal surface.

But, in the ninth embodiment, the diamond like carbon layer C exists between the metal surface of the ball 504 and the fluorine compound layer F. As the alkyl group of the fluorine compound has the affinity with carbon such as the DLC, the alkyl group orients toward the side of the diamond like carbon layer C, and a part thereof is introduced into the diamond like carbon layer C. Accordingly, the adhesiveness between the fluorine compound layer F and the diamond like carbon layer C is largely increased.

As the perfluoroalkyl group of the fluorine compound is arranged on the uppermost surface of the ball 504, the lubricating property is sufficiently given to the surface of the ball 504. Thus, the ball 504 has the excellent lubricating property, and even under the condition of the boundary lubrication, it is excellent in the abrasion resistance and the fretting resistance.

With respect to the deep groove ball bearing 501, the results of fluctuation-endurance test will be explained. The fluctuation-endurance was evaluated by rotation torque of the bearing after repeatedly carrying out fluctuating movements under the following conditions. The inner ring was rotated 2 rpm under the condition of effecting the axial load of 49 N, and the rotating torque taken at an initial period of rotation was measured.

Figure 31:
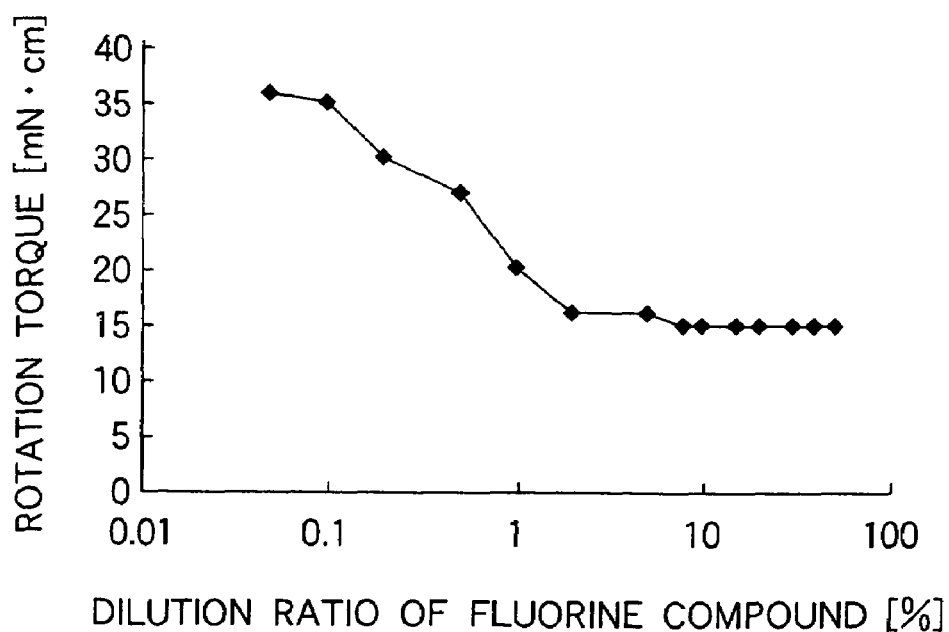
FIG. 31 is a graph showing the relationship between the dilution rate of fluorine compound and the rotation toque.

(Conditions of Fluctuating Movement)
  Fluctuating frequency: 20 Hz
  Fluctuating angle of the outer ring: 8°
  Axial load: 49 N
  Number of repeating fluctuations: 5,000,000
  Atmospheric temperature: Room temperature Along with the above mentioned deep groove ball bearing 501, the fluctuation-endurance test was performed with respect to the deep groove ball bearings with thickness of the fluorine compound layer F variously changed (other structures are the same). The results are shown in the graph of FIG. 31. The thickness of the fluorine compound layer F was controlled by the ratio of dilution with ethyl acetate in the fluorine compound. The dilution ratio means a ratio of the amount of fluorine compound to the total amount of fluorine compound and ethyl acetate. For example, 10% of the ratio of dilution means that 10 parts of fluorine compound is diluted with 90 parts of ethyl acetate.

As is seen from the graph, if the dilution ratio is 1% or less, the fretting is easy to occur by the fluctuating test, causing a problem that the rotating torque after the fluctuating test becomes large. This is why the film of the fluorine compound layer F is too thin, and lubrication at fluctuating is shortened. It is accordingly preferable that the dilution ratio is larger than 1%.

If being more than 30%, the rotation torque becomes good, but there easily appear cost-up, worsening of workability and unevenness in film thickness.

For stabilizing the fretting resistance, the dilution ratio is desirably 15% or less, and for obtaining the stable lubricating effect, the dilution ratio is desirably more than 2%.

As the Comparative Example, the same fluctuation-endurance test was performed on the following two kinds of deep groove ball bearings.

The deep groove ball bearing of the comparative Example 20 has the diamond like carbon layer on the ball surface having without the intermediate layer, and the structure is the same as the deep groove ball bearing of the ninth embodiment, excepting that the fluorine compound layer is not furnished and the material composing the outer ring, the inner ring and the balls is different.

The deep groove ball bearing of the comparative Example 21 has perfluoropolyether (fluorine compound layer) on the ball surface, and the structure is the same as the deep groove ball bearing of the ninth embodiment, excepting that the diamond like carbon layer and the fluorine compound layer are not furnished and the material composing the outer ring, the inner ring and the balls is different.

The material qualities composing the outer ring, the inner ring and the balls of the Comparative Examples 20 and 21 are the quenched and tempered bearing steel (SUJ2), the Young's modulus is 220 GPa and the surface hardness is 7.5 GPa.

As a result of the fluctuation-endurance tests, the rotation torque of the deep groove ball bearing of the Comparative Example 20 was about 30 mN·cm, and that of the comparative Example 21 was about 27 mN·cm. The deep groove ball bearings of the Comparative Examples 20 and 21 were acknowledged with damages on the ball surfaces by repeating the fluctuation movements. Owing to roughness and abrasion in the surface, the rotation torque increased before and after repeating the fluctuation movements.

Production Example

In the ninth embodiment, the diamond like carbon layer C was formed on the surface of the ball 504 by the spattering process. As to the process of uniformly forming the film on the ball surface, explanation will be made referring to FIGS. 32A and 32B. This process is concerned with a process of uniformly forming the film on the spherical surface of such as the ball of the bearing (the rolling elements).

In the CVD film-forming process making the gas into a plasma to form the film on the metal surface, in the PVD film-forming process ionizing the evaporated substance to form the film on the metal surface, or in the spattering process, there are known a method of processing a material to be processed while rotating it on its axis for improving the adhesiveness when film-forming and the film-forming precision (JP-A-63-62875), or a method of processing a material to be processed while auto-rotating it and revolving a jig including the material to be processed within a chamber (JP-B-7-94711). These film-forming methods can form films in uniform thickness, and are useful to industrial tools.

The material to be processed in the above mentioned conventional film-forming methods is usually a bar-shaped or a ring shaped parts represented by the tool, and the film is formed mainly on the peripheral surface of the material. These parts can face in the direction of irradiating the plasma or the ion by the above mentioned rotation or revolution, and so the film in uniform thickness can be formed.

However, in case the material to be processed is a spherical body such as a ball to be employed to the bearing, it is difficult to support the material, and it is very difficult to form the film in uniform thickness as the above mentioned tools. For example, there is a method where a plurality of balls are brought into a metal-made basket as a barrel, and while rotating the barrel, the film-forming components are supplied from the plasma source or the ion source for forming the film, but the size of the ball is limited or unevenness is easy to occur in the film thickness.

Therefore, this method of the invention solves the above mentioned problems involved with the prior art, and has an object to offer a method enabling to form film of uniform thickness on spheres such as bearing balls.

To attain the object, this method has the following structure. The method irradiates a film-forming substance (for example, a compound generated from a metal made into plasma or ionized and a gas) to a spherical material to be processed so as to form the film on the surface of the spherical material to be processed, and then the spherical material to be processed is mounted on a movable plate composed of a non-metallic material, and irradiating the substance to the spherical material to be processed while rotating the spherical material on the moving plate.

With such a structure, it is possible to give the uniform rotating motion to the spherical material to be processed, to thereby uniformly face the whole of spherical material to a direction from which the film-forming substance is irradiated. Thus, the spherical material can be formed with the uniform film. The processed material is excellent in sphericity.

This film-forming method is applicable not only to the spherical body as the bearing ball but also to members of other shapes such as the outer ring or the inner ring of the bearing.

A description will be given of two examples of forming the film on the bearing balls with reference to the drawings.

Figure 32A:
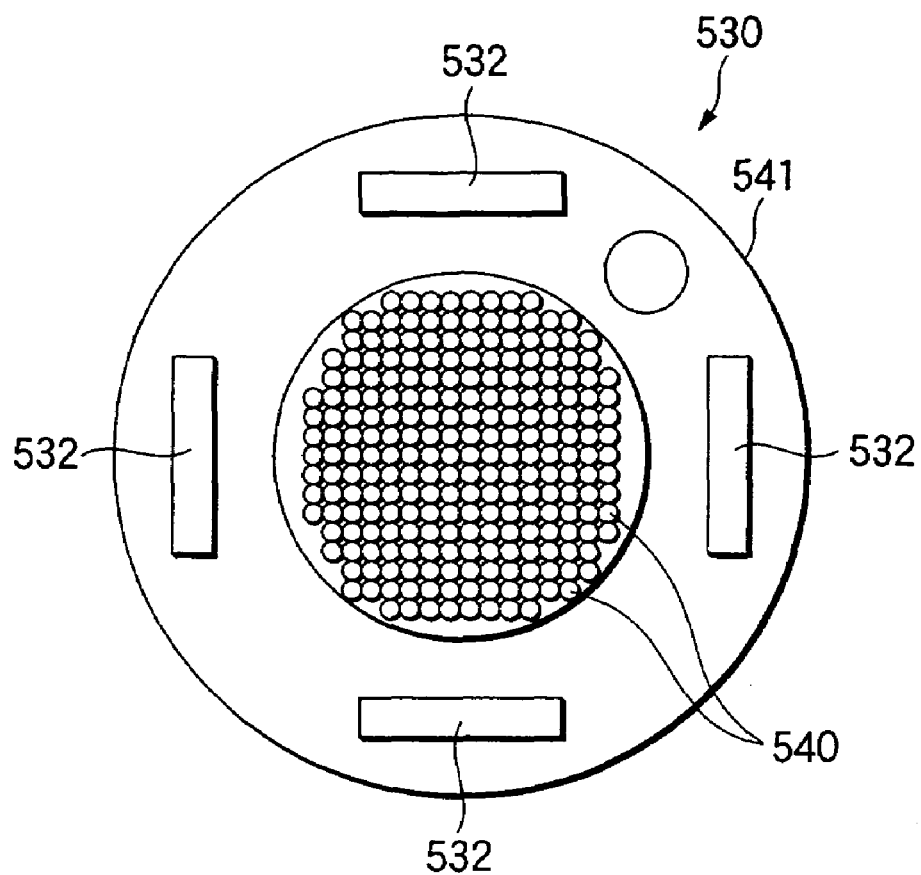
FIGS. 32A and 32B are schematic views for explaining the unbalanced spattering apparatus.
Figure 32B:
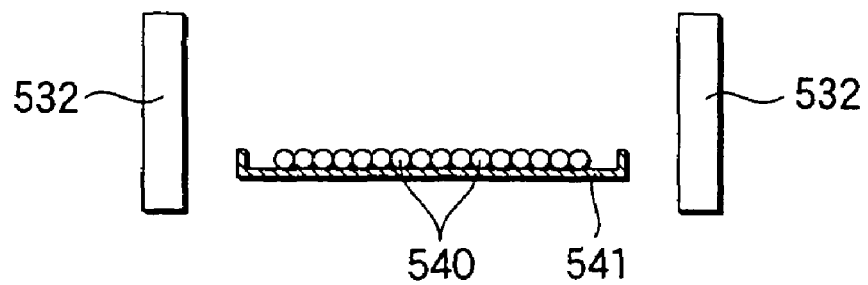

With reference to FIGS. 32A and 32B, a description will be given of the first production example of forming the film on the surfaces of the balls 540 (specimens) by using the UBMS apparatus made by Kobe Steels Work, Ltd. through the spattering process by the argon plasma. FIG. 32A is a plan view of the UBMS apparatus 530, and FIG. 32B is a side view thereof.

The UBMS apparatus 530 is provided with the plate 541 which is a disc made of SUS304 having a diameter of 300 mm and includes an outer wall having a height of 12 mm on an outer periphery (that is, cup shape). 8000 pieces of the balls 540, each made of SUS440 and having a diameter of 2 mm are mounted on the plate 541. By the way, SUS304 is the non-magnetic material.

At first, the bombard treatment (dry cleaning) was performed on the surface of the ball 540. Then, the metallic layer of titanium was formed as the intermediate layer with the titanium target thereon.

Next, the bombard treatment with the argon gas was performed on the surface (the intermediate layer) so as to form the composite layer by mixing the composing element of the balls 540 and titanium by the atomic order.

Subsequently, while supplying the negative voltage to the balls 540, the spattering efficiency of the carbon target was increased to form the composite layer and the carbon layer, so as to form the diamond like carbon.

In such a manner, the UBMS apparatus 530 is attached with a plurality of targets 532 to be used for spattering, and spattering electric sources of the Ti and C targets are independently controlled, so that the spattering efficiency of Ti is continuously decreased, whereas the spattering efficiency of C is continuously increase, whereby the composite layer of Ti and C is formed. By applying a DC source to the spattering source of the target, the spattering efficiency of the argon ion can be continuously changed.

This composite layer is an oblique layer gradually changing the compositions of C and Ti, and the diamond like carbon C may be formed where the composition ratios are continuously changed. After forming the intermediate layer, while decreasing the power of the spatter electric source of target of the intermediate layer, the power of spatter electric source of the C target is increased simultaneously. These powers and the bias voltages to be supplied to the specimens are performed by a computer control, and it is possible to form the composite layer being the oblique layer of C and Ti.

Upon forming the above mentioned film, the plate 541 is obliquely installed at predetermined angle (hereinafter referred to as "oblique angle") with respect to a horizontal direction. At this time, the film-forming is carried out while rotating the oblique plate 541 at, e.g., 10 rpm by a motor (rotation where a vertical line passing the center of the plate 41B is a rotating axis). The plate 541 is rotated so that the balls 540 rotate at constant speed on the plate 541, and all the surfaces of the balls 540 may be uniformly faced to the plasma. It is therefore possible to form the film of the uniform thickness on the overall of the balls 540, and the sphericity of the processed ball 540 is excellent.

Further, as the plate 541 is obliquely installed, the balls 540 move intensively upon rotating, and the position of the ball 540 on the plate 541 may be largely replaced, so that the film of the uniform thickness may be formed on a lots of balls 540.

Figure 33:
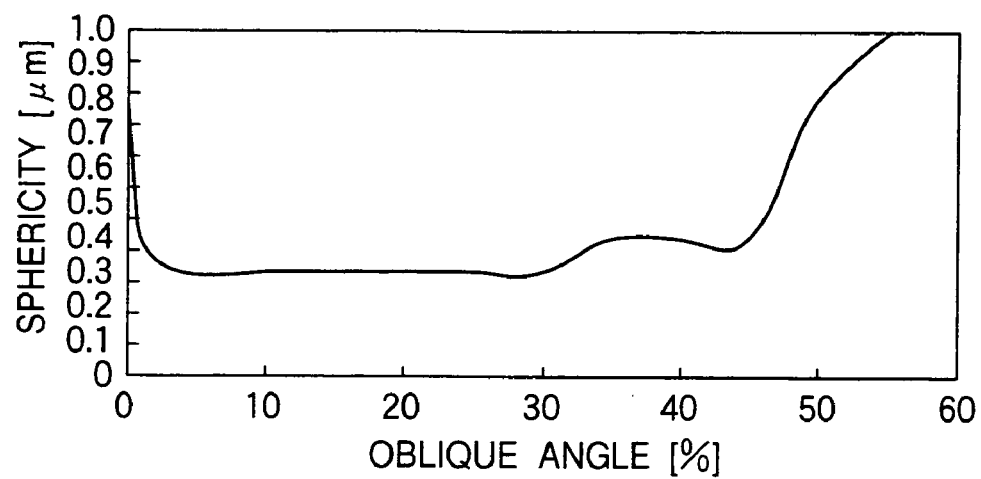
FIG. 33 is a graph showing the relationship between the oblique angle of the plate and the sphericity of the film-formed ball.

The oblique angle of the plate 541 is desirably 1 to 45° with respect to the horizontal direction. A graph showing the relationship between the oblique angle of a plate 41 and the sphericity of the film-formed ball 540 is shown in FIG. 33. As is seen from the same, if the oblique angle is less than 2°, the centrifugal force of rotation of the plate 541 is insufficient, and the balls 540 do not rotate uniformly, and the film thickness is easy to be uneven. As a result, variation in the film thickness is large, and the sphericity is worsened.

If the oblique angle is more than 45°, the balls 540 overlap one another or drop from the plate 541B, and the sphericity is worsened.

The oblique angle of the plate 541 is desirable within the above mentioned range for providing the good sphericity, though depending on sizes and number of the balls 540.

A description will be given of another example (the second production example) of forming the film of the uniform thickness while rotating the balls by different means from that of the above mentioned first production example, referring to FIGS. 32 and 34.

Figure 34:
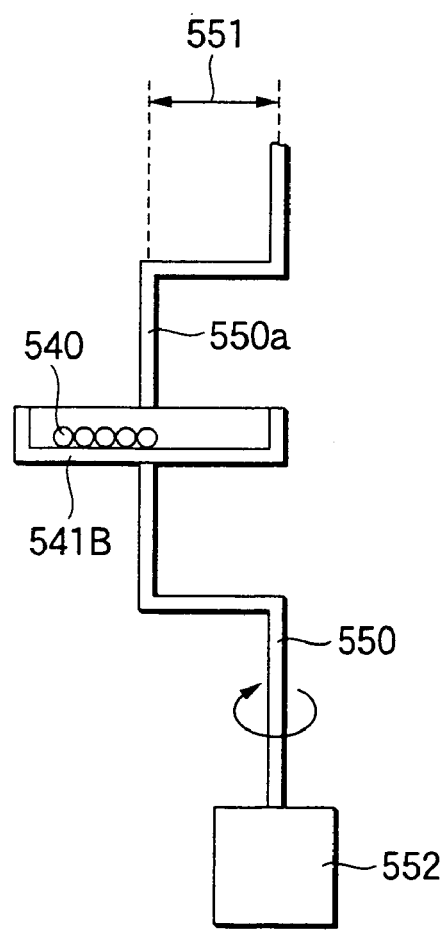
FIG. 34 is a schematic view for explaining the structure of the rotating apparatus for rotating balls when film-forming.

FIG. 34 is a schematic view for explaining the structure of the rotating apparatus for rotating the balls 540 when film-forming.

The second production example is almost the same as the first production example excepting a method and a mechanism of rotating the balls 540, and so only different points will be explained and the similar points will be omitted. In FIG. 34, the same as or similar parts to those of FIG. 32 are given the same numerals.

In place of the plate 41 and the motor in the first production example, a rotating apparatus of FIG. 34 is installed in the UBMS apparatus 530. This rotating apparatus comprises the plate 541 locating the balls 540, the shaft 550 rotating the plate 541 and the motor 552. The shaft 550 has a U-bent shape (crank) portion 550*a* to which the plate 541 is connected at its center part. The plate 541 and the shaft 550 are all composed of SUS304 being a non-magnetic material.

With such a structure, when the shaft 550 is rotated by the motor 552, the plate 541 moves in circle with a radius of the projecting width of the U-shaped portion 550*a*, i.e., an eccentric width 551 of the shaft, and the balls 547 rotate on the plate 541B.

The titanium target (not shown) installed at a position of about 45 degree above the plate 541 was generated in plasma by the spatter to form titanium particles and reacted the titanium particles with titanium particles and nitrogen gas, and generated titanium nitride. The titanium nitride was irradiated to the rotating balls 540 for forming the film of titanium nitride on the surface of the ball 540.

As the balls 540 are rotated by the rotating apparatus, all the surfaces of the balls 540 may be faced to the irradiation of titanium nitride. It is therefore possible to form the film of the uniform thickness on the overall of the balls 540, and the sphericity of the processed ball 540 is excellent.

Figure 35:
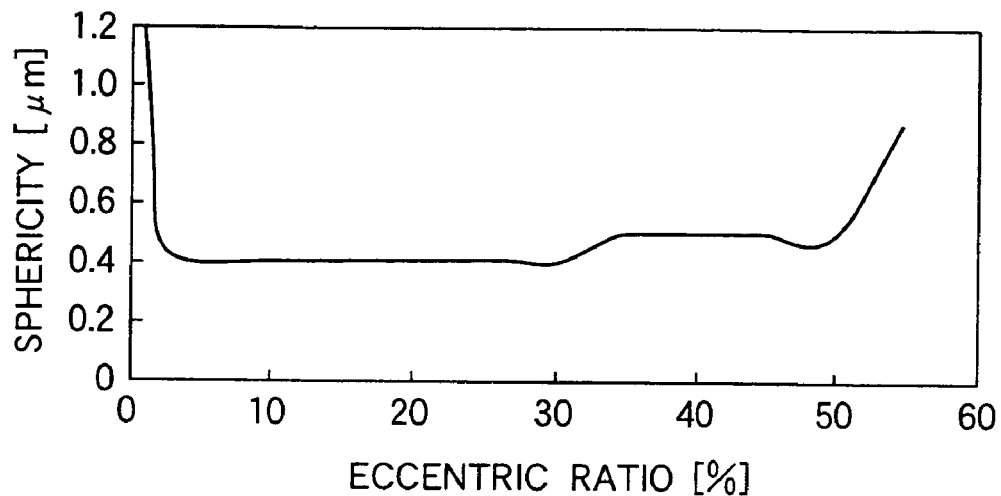
FIG. 35 is a graph showing the relationship between the eccentric rate and the sphericity of the film-formed ball.

The correlation between an eccentric width 551 of the shaft 550 and the sphericity of the film-formed ball 540 is evaluated, and the result is shown in FIG. 35. The eccentric ratio of the lateral axis in the graph of FIG. 35 means the ratio of the eccentric width 551 to the radius of the disc plate 541. For example, the eccentric rate 10% means that the radius of the plate 541 is 100 mm and the eccentric width 551 is 10 mm.

For fully rotating the balls 547 to obtain the film of the uniform thickness, the eccentric rate is preferably 2 to 50%. If being less than 2%, the rotation of the ball 547 is ready for stopping and the film thickness is easily uneven. If being more than 50%, the centrifugal force by the circular motion of the plate 541 is too large, the balls 540 are easy to gather to the outer wall side of the plate 541 and the film thickness is easily uneven.

Incidentally, the materials of the plate 541 and the shaft 550 in the first and second production examples are desirable in materials less to be magnetized, and the non-magnetic material is suitable for the plate 541 and the shaft 550. Specifically, austenite based stainless steel, for example, SUS304 and SUS316 are taken up.

Next, as a comparative example with the first and second production examples, a description will be given of an example where the balls are brought into a metal made basket (barrel), and while rotating the entire barrel, the film-forming components are supplied from the plasma source or the ion source for forming the film.

This comparative production example is almost the same as the first production example excepting a method and a mechanism of rotating the balls 547 and, and so only different points will be explained and the detailed description of the similar points will be omitted . The same as or similar parts to those of FIG. 31 will be explained with the same numerals. A mesh of the barrel is 1.8 mm and the number of the balls 547 are 3000 pieces.

With respect to the ball formed with the film by the above method, the sphericity was measured, and was 0.8 μm. The film thickness of the diamond like carbon was uneven, and the sphericity was bad.

As explained above, according to the above methods (first and second production examples), as the film-forming is performed while rotating the spherical materials to be processed, there are no shadow parts with respect to the irradiation of the film-forming components, and it is possible to form the film of the uniform thickness. Thus, the sphericity of the film-formed balls is excellent.

(Tenth Embodiment)

Figure 36:
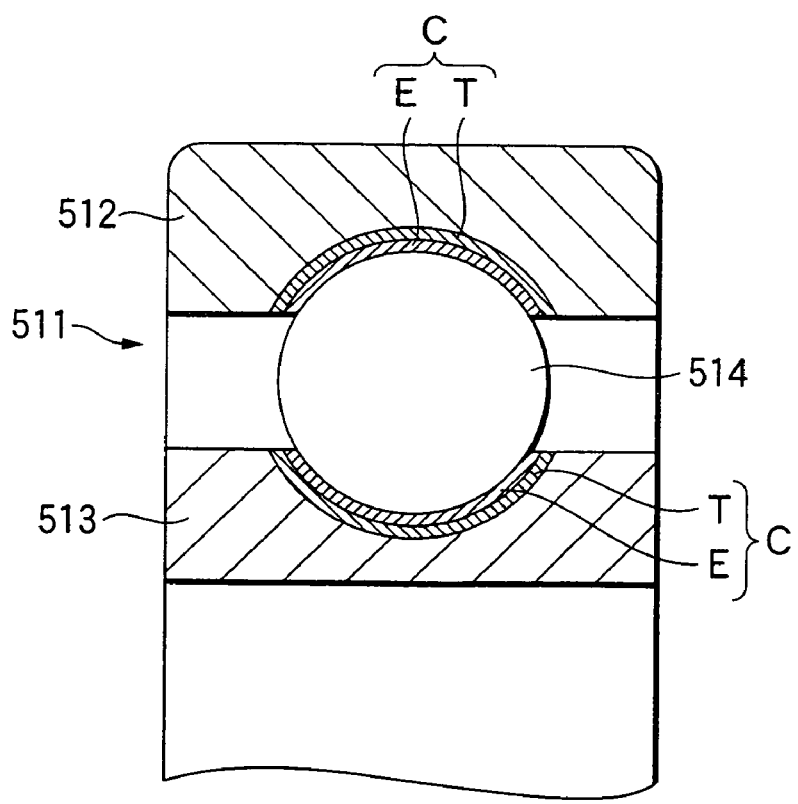
FIG. 36 is a vertically cross sectional view showing the deep groove ball bearing according to a tenth embodiment of the invention.

FIG. 36 is a vertically cross sectional view showing the structure of a single-row deep groove ball bearing 511 as a rolling member according to the tenth embodiment of the invention. The deep groove ball bearing 511 comprises an outer ring 512, an inner ring 513, a plurality of balls 514 rollably disposed between the outer ring 512 and the inner ring 513. The dimension is 30 mm of an inner diameter, 62 mm of an outer diameter and 16 mm of a width.

The outer ring 512, the inner ring 513 are made of high carbon chromium steel (SUJ2), quenched at 830° C. for 1 hr, and tempered at 260° C. for 1 hr.

The raceway surfaces of the outer ring 512 and the inner ring 513 are provided with a lubricating layer having the lubricating property, and the diamond like carbon layer C is disposed on the surface side of the lubricating layer L.

The diamond like carbon layer comprises three layers of a metallic layer made of at least one kind of metals of Cr, W, Ti, Si, Ni and Fe, a composite layer made of metal and carbon, and a carbon layer made of carbon, and these layers are arranged in the order of the metallic layer, the composite layer and the carbon layer from a core portion. The Young's modulus of the base material of the raceway surface having the lubricating layer L is 220 GPa, and the surface hardness is 7.5 GPa. Hereinafter, the combined part of the metallic layer and the composite layer will be referred to as the metallic composite layer T.

The ball 514 is made of ceramic ($Si_3N_4$), and may be composed of the bearing steel or the stainless steel similarly to the outer ring 512 and the inner ring 513, and at this time the diamond like carbon layer C may be formed on the surface.

Next, a description will be given of a method of forming the diamond like carbon layer C on the raceway surfaces of the outer ring 512 and the inner ring 513.

The specimens (the outer ring 512 and the inner ring 513) were placed within a pressure reduced chamber. While supplying the bias voltage to the specimens, the intermediate layer (the metallic layer) comprising the metallic nitride (TiN) by use of the metal target (Ti is desirable) and the nitrogen gas were formed on the raceway surfaces of the specimens were formed by the spattering method. Depending on the processing time, the thickness of the intermediate layer may be controlled. The stoichimetric ratio and the equivalent elastic modulus of metallic nitride may be controlled by depending on partial pressure of nitrogen. The metallic compound for forming the intermediate layer is not limited to TiN, and other metallic compounds are sufficient.

Next, the surface of the specimen was performed with the bombard treatment with the argon gas so as to form the composite layer by mixing the composing element of the balls 40 and the intermediate layer by the atomic order.

Subsequently, while supplying the negative voltage to the specimen, the spattering efficiency of the carbon target was increased to form the composite layer and the carbon layer, so as to form the diamond like carbon C.

Thus, while continuously decreasing the spattering efficiency of the metal forming the metallic compound layer T, the spattering efficiency of the carbon target is increased, so that the composite layer of the metal and the diamond like carbon may be formed.

This composite layer is an oblique layer where the compositions of the metal and C are continuously changed, and it is possible to form the diamond like carbon C continuously changing the composition ratio. After forming the intermediate layer, while decreasing the electric source power of the spatter source of the target of the intermediate layer, the power of the spatter source of the C target is increased simultaneously. These powers and the bias voltage to be supplied to the specimens are controlled by a computer, and it is possible to form the composite layer being the oblique layer of the metal and C.

By the way, by controlling the DC source of the spattering source of the target, the spattering efficiency of the argon ion can be continuously changed. By stopping the metal spattering and performing the carbon spattering only, the carbon layer E is formed. The thickness of the thus formed diamond like carbon C can be controlled by the processing time.

In forming the diamond like carbon layer C, the spattering process may be employed as mentioned above, but other process such as the ion plating process with the target of sintered carbon may be sufficient. The diamond like carbon layer C may be added with other metallic elements as silicon, titanium, or chromium.

The metallic composite layer T which is poor in the lubricating property but has the good adhesiveness with the metal as the base material of the specimen, intervene between the carbon layer E having the good lubricating property but having the poor adhesiveness with the metal as the base material of the specimen and the metal (the base material of the specimen), whereby strong multi-layer structure is formed and the good lubricating property is imparted to the raceway surfaces of the specimens (the outer ring 512 and the inner ring 513).

The thickness of the metallic compound layer T is 0.2 to 5 μm. If being less than 0.2 μm, the difference between the elastic modulus of the diamond like carbon layer C and that of the metal is too large, and the diamond like carbon layer is easily broken. On the other hand, if being more than 5 μm, the internal stresses of the metallic compound layer T is large to cause the self-destruction, and these substances remarkably peel from the metal surface.

The thickness of the diamond like carbon layer C is preferably 0.8 to 8 μm. If being less than 0.8 μm, the metallic compound layer T and the opposite member probably contact with each other to easily cause seizure. On the other hand, if being more than 8 μm, the internal stress of the diamond like carbon layer C is large to cause the self-destruction, and this substance remarkably peels from the metallic composite layer. The thickness of the diamond like carbon layer C is more preferably 1 to 5 μm.

Further, the diamond like carbon C preferably has the equivalent elastic modulus of 80 to 240 GPa. Thereby, the specimens (the outer ring 512 and the inner ring 513) have the satisfactory performance as the rolling members in the seizure resistance and the destruction resistance. If being less than 80 GPa, the hardness goes down, easily causing abrasion. If being more than 240 GPa, it has high elasticity in comparison with the metal (the base material of the specimen) and difficulty to follow elastic deformation of the metal, resulting to easily invite the self-destruction. For more securing such effects, it is more preferable that the equivalent elastic modulus is 130 to 200 GPa.

A description will be given of the results of endurance test with respect to the deep groove ball bearing 511. The bearing was rotated with the following conditions under the condition of the boundary lubrication, and the endurance test was evaluated by the time until the seizure occurred.

(Conditions of the Endurance Test)

Rotation number: 12000 rpm

Axial load: 2000 N

Lubricating condition: Spinox (trade name) as the spindle oil made by Nippon Oil Co., Ltd. was diluted to be 5% with hexane and was poured into the bearing by 0.3 ml by the micro cylinder.

Atmospheric temperature: Room temperature

In the deep groove ball bearing 511, the endurance test was performed by variously changing the thickness of the metallic compound layer T, the thickness of the diamond like carbon layer C, and the equivalent elastic modulus of the diamond like carbon C. The results are shown in the graphs of FIGS. 37 to 39.

Figure 37:
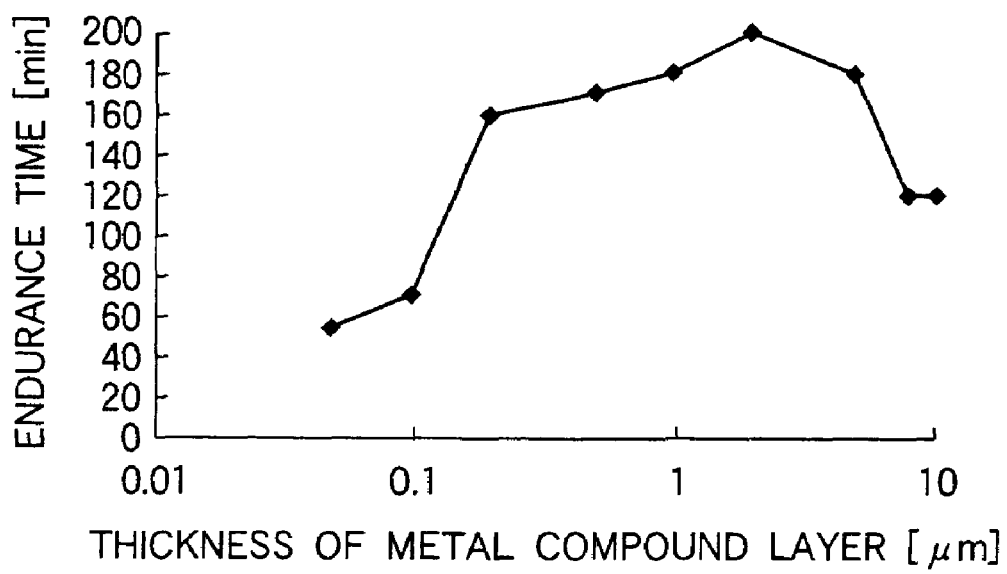
FIG. 37 is a graph showing the relationship between the thickness of the metallic compound and the endurance time.

FIG. 37 is a graph showing the correlation between the thickness of the metallic compound layer T and the endurance time. FIG. 38 is a graph showing the correlation between the thickness of the diamond like carbon layer C and the endurance time, and FIG. 39 is a graph showing the correlation between the equivalent elastic modulus and the endurance time, and the thickness of the metallic compound T is uniformly set to be 2 μm, and the thickness of the diamond like carbon C is uniformly set to be 2.5 μm.

As is seen from FIG. 37, if the thickness of the metallic compound layer T is 0.2 to 5 μm, the good endurance is obtained. If being less than 0.2 μm, the cushioning force of the metallic compound layer T was insufficient, the diamond like carbon layer C was destructed and the endurance time was deteriorated. If being more than 5 μm, the metallic compound layer T caused the self-destruction, and it peeled from the metal surface and the endurance time was deteriorated.

Figure 38:
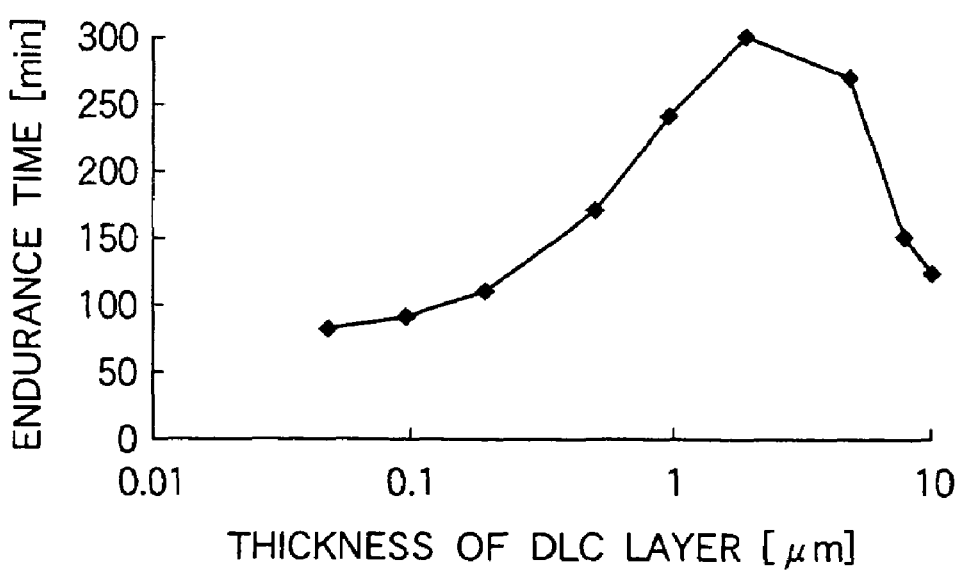
FIG. 38 is a graph showing the relationship between the thickness of the DLC layer and the endurance time.
Figure 39:
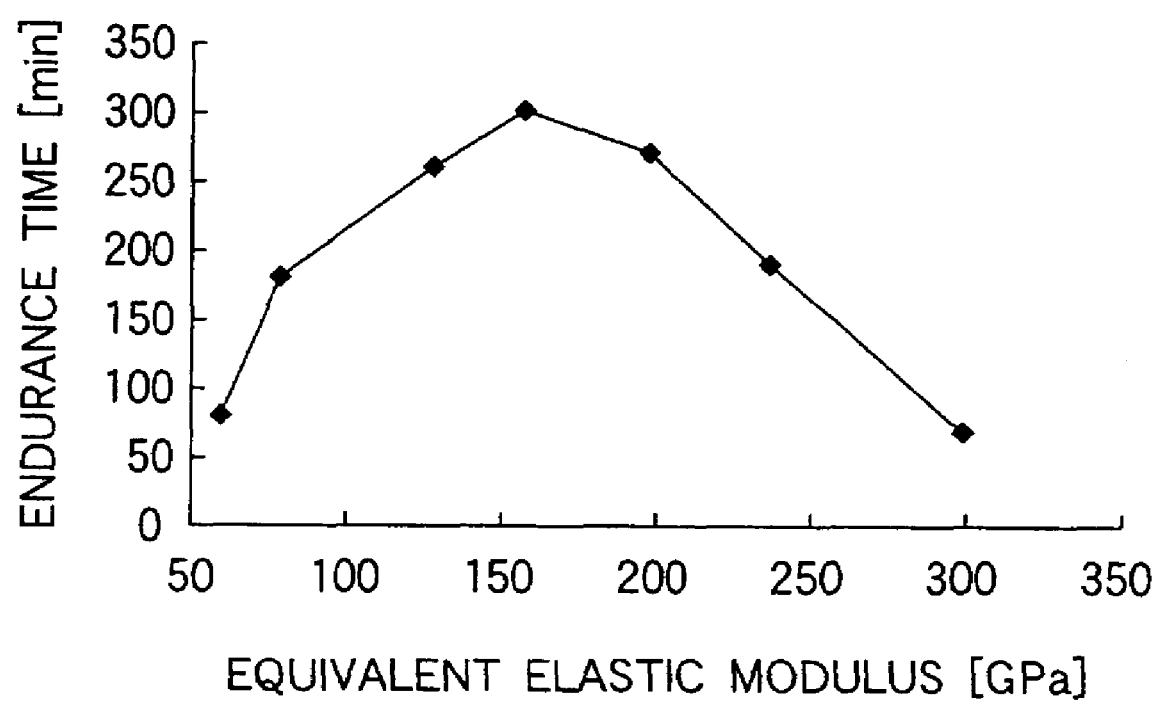
FIG. 39 is a graph showing the relationship between the equivalent elastic modulus of the DLC layer and the endurance time.

As is seen from FIG. 38, if the thickness of the diamond like carbon layer C is 0.8 to 8 μm, the good endurance is obtained. If being less than 0.8 μm, the metallic compound layer T contacted to the opposite member with each other to cause the seizure and the endurance time was deteriorated. If being more than 8 μm, the diamond like carbon layer C caused the self-destruction, and it peeled from the metallic compound layer T and the endurance time was deteriorated. In addition, if the thickness of the diamond like carbon layer C is 1 to 5 μm, the better endurance is obtained.

Further, as is seem from the graph of FIG. 39, the diamond like carbon C preferably has the equivalent elastic modulus of 80 to 240 GPa, and more preferably 130 to 200 GPa. If being less than 80 GPa, the hardness decreases, and the diamond like carbon layer C is easily destructed. If being more than 240 GPa, it has high elasticity in comparison with the metal (the base material of the specimen) and difficulty to follow elastic deformation of the metal, resulting to easily invite the self-destruction. Therefore, the endurance time is deteriorated.

As the Comparative Example, with respect to the following two kinds of deep groove ball bearings, the endurance tests were similarly carried out.

The deep groove ball bearings of the Comparative Examples 22 and 23 are formed with the only metallic compound layer on the raceway surfaces of the outer ring and the inner ring (the thickness: 0.05 μm and 0.1 μm), and have the same structure as the deep groove ball bearing 511 of the tenth embodiment, excepting that the carbon layer is not provided.

As a result of the endurance tests, it was insufficient that the endurance time was 55 min in the deep groove ball bearing of the Comparative Example 22 having the thickness of the metallic compound layer being 0.05 μm, while the endurance time was 70 min in the deep groove ball bearing of the Comparative Example 23 having the thickness of the Ti compound layer being 0.1 μm. In addition, the deep groove ball bearings of the Comparative Examples 22 and 23 were recognized that the peelings were generated in the raceway surfaces after the endurance tests.

The ninth and tenth embodiments are only examples of the invention, and the invention is not limited to these embodiments, but is applied to, for example, the material qualities of the outer ring, the inner ring and the balls, kinds of compounds composing the fluorine compound layer F and the diamond like carbon layer C, and the methods of forming these layers.

The ninth and tenth embodiments have been explained by exemplifying the bearing rings and rolling elements of the deep groove ball bearing as the rolling member, but the invention can be applied to the rolling member composing other kinds of the rolling bearing such as the roller bearing, or the rolling member composing other kinds of the rolling apparatus such as the ball screw or the linear guide. Further, the invention can be served as the sliding member.

As having explained above, the rolling member and the rolling apparatus of the invention are provided on the surface with the lubricating layer having the diamond like carbon layer and the fluorine compound layer, and the diamond like carbon layer comprises three layers of the metallic layer made of at least one kind of metals of Cr, W, Ti, Si, Ni and Fe, the composite layer made of metal and carbon, and the carbon layer made of carbon.

Further, the fluorine compound layer is formed on the uppermost surface, and even if the surface of the rolling members are boundary lubrication, as there is no contact of metal-to-metal, it is possible to prevent occurrence of abrasion and fretting.

A description will be given of an eleventh embodiment of the invention with reference to FIGS. 40 to 44.

Figure 40:
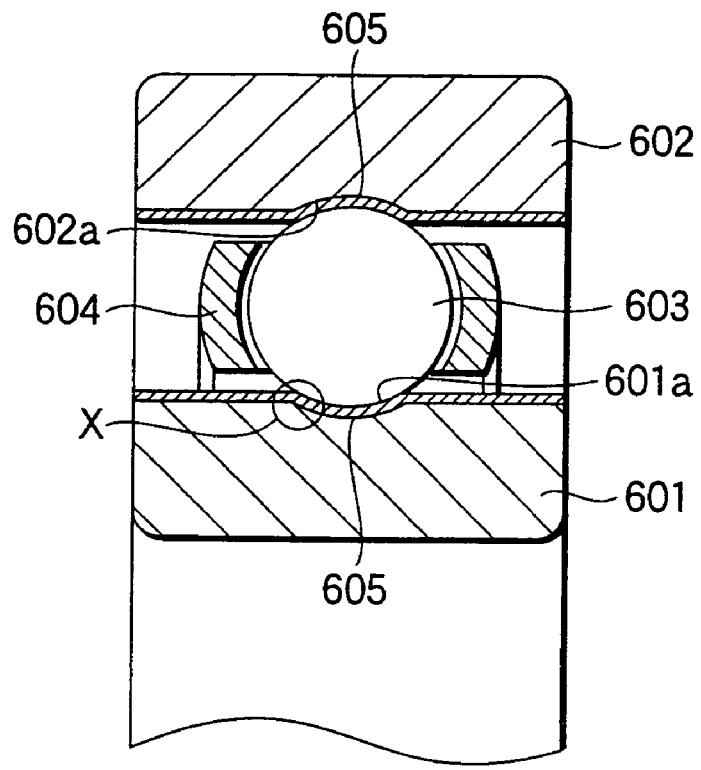
FIG. 40 is a vertically cross sectional view for explaining a deep groove ball bearing as the rolling apparatus of an eleventh embodiment of the invention.

As shown in FIG. 40, the deep groove ball bearing (the rolling apparatus) comprises an inner ring (an inside member: the rolling sliding member) 601 having a raceway surface 601a on an outer circumferential surface, an outer ring (an outside member: the rolling sliding member) 602 having a raceway surface 602a opposite to the raceway surface 601a on an inner circumferential surface, a plurality of balls (rolling elements: the rolling sliding member) 603 rotatably disposed between both raceway surfaces 601a, 602a, and a retainer 604 holding the plurality of balls 603 equidistantly in the circumferential direction.

The inner ring 601, the outer ring 602 and the ball 603 are made of SUJ2, and the dimension of the bearing has the inner diameter of 7.94 mm, the outer diameter of 12.7 mm, and the width of 3.97 mm. A non-contacting steel seal (Z shape) is attached to both ends of the outer ring of the bearing (although not shown in figure).

The raceway surface 601a of the inner ring 601 and the raceway surface 602a of the outer ring 602 are provided with the diamond like carbon layer (DLC) 605 having the lubricating property and the equivalent elastic modulus being 80 GPa to 240 GPa.

Figure 41:
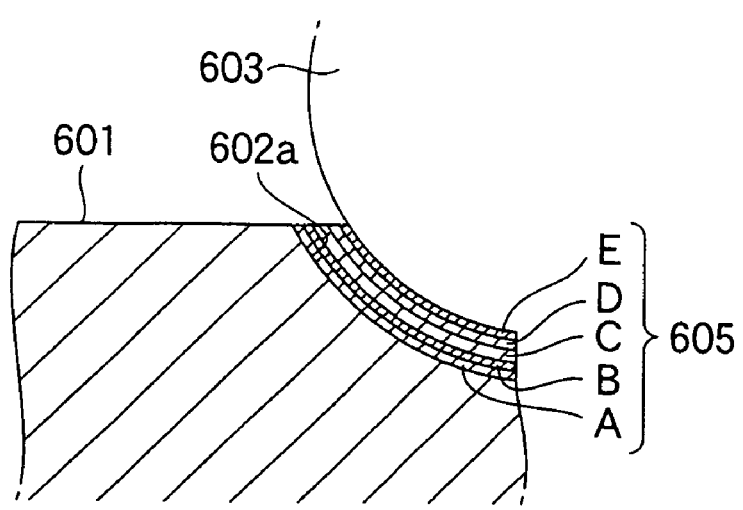
FIG. 41 is a partially enlarged cross sectional view of an X portion of FIG. 40.

The DLC layer 605, as shown in FIG. 41, includes the five layers of the metallic layer A having two kinds of metals of Cr and W among Cr, W, Ti, Si, Ni and Fe, the first composite layer B having said metals and carbon, the carbon layer C having carbon, the second composite layer D having carbon and the fluorine compound, and the fluorine composite layer E. The five layers are arranged in the order of the fluorine composite layer E, the second composite layer D, the carbon layer C, the composite layer F and the metallic layer M from the surface side toward the base material side (the raceway surface side), there are arranged.

In the eleventh embodiment, since the first composite layer B is composed of the two kinds of metals of Cr and W among Cr, W, Ti, Si, Ni and Fe, and carbon, in comparison with a structure of one kind of metal and carbon, brittleness of the metallic carbide generated by a combination of the metal and carbon can be reduced, and as a result, brittleness of the first composite B can be reduced. Of course, the first composite layer B may also be composed of one kind of metal of Cr, W, Ti, Si, Ni and Fe, and carbon, and it is needless to say that such an embodiment falls in the range of the invention.

A method of forming the DLC layer will be explained with an example of the outer ring 602 in regard to a case that the first composite layer B is composed of one kind of Cr (chromium) and carbon, and a case that it is composed of two kinds of Cr (chromium) and W (tungsten) and carbon.

In the case that the first composite layer B is composed of one kind of Cr (chromium) and carbon, the degreased outer ring 602 was installed on an unbalanced magnetron spattering apparatus (UBMS 504) made by Kobe Steel Works, Ltd., and a bombard treatment was performed on the raceway surface 602a for 15 minutes through the spattering process by an argon plasma.

Targeting chromium, the metallic layer A was formed on the raceway surface 602a through the spattering. Subsequently, continuing the spattering of chromium, a sputtering of carbon by targeting carbon was started. By the spattering, the first composite layer B of one kind metal and carbon was formed on the metallic layer A.

While gradually decreasing the spattering efficiency of the metal, the carbon spattering efficiency was slowly increased. The spattering of the two kinds of metals was ended, and with the only carbon spattering, the carbon layer C was formed on the composite layer.

Continuing thereto, while slowly decreasing the spattering efficiency of the carbon spattering, the spattering efficiency of ethylene tetrafluoride resin was slowly increased so as to form the second composite layer D of carbon and the fluorine compound layer. Next, the spattering of carbon was ended, and with the only ethylene tetrafluoride spattering, the fluorine compound layer E was formed on the second composite layer D. (The thickness of the whole DLC layer is 2.3 µm.)

Thereby, it is possible to form an oblique layer (the first composite layer B) changing continuously and gradually the layer composition from the layer (the metallic layer A) composed of one kind metal toward the carbon-composed layer (the carbon layer C). And, further, continuing to the oblique layer, it is possible to form the carbon layer C the second composite layer D of carbon and the fluorine compound layer, and the fluorine compound layer. The DLC 605 of such a structure has the very excellent adhesiveness among the respective layers (the metallic layer A, first composite layer B, carbon layer C, second composite layer D and fluorine compound layer E) and the superior lubricating property.

Next, also in regard to the case that the first composite layer B is composed of two kinds of Cr (chromium) and W (tungsten) and carbon, similarly, the degreased outer ring 602 was installed on an unbalanced magnetron spattering apparatus (UBMS 504) made by Kobe Steel Works, Ltd., and a bombard treatment was performed on the raceway surface 602a for 15 minutes through the spattering process by an argon plasma.

Targeting tungsten and chromium, these two kinds of metals were spattered on the raceway surface 602a so as to form the metallic layer A. Subsequently, continuing the spattering of these two kinds of metals, a sputtering of carbon by targeting carbon was started. By the spattering, the first composite layer B of metallic carbide of the two kinds of metals and carbon was formed on the metallic layer A.

While gradually decreasing the spattering efficiency of the two kinds of metals, the carbon spattering efficiency was slowly increased. Then, the spattering of the two kinds of metals was ended, and with the only carbon spattering, the carbon layer C was formed on the first composite layer B. The film-forming method of the second composite layer D and the fluorine compound layer E is the same as the above mentioned, and the entire thickness of the DLC film was 2.2 µm.

With the above method, it is possible to form an oblique layer (the first composite layer B) changing continuously and gradually the layer composition from the layer (the metallic layer A) composed of two kinds of metals toward the carbon-composed layer (the carbon layer C), the carbon layer C continuing to the oblique layer, the second composite layer D of carbon and the fluorine compound layer, and the fluorine compound layer. The DLC 605 of such a structure has the very excellent adhesiveness among the respective layers (the metallic layer A, first composite layer B, carbon layer C, second composite layer D and fluorine compound layer E) and the superior lubricating property.

Figure 25:
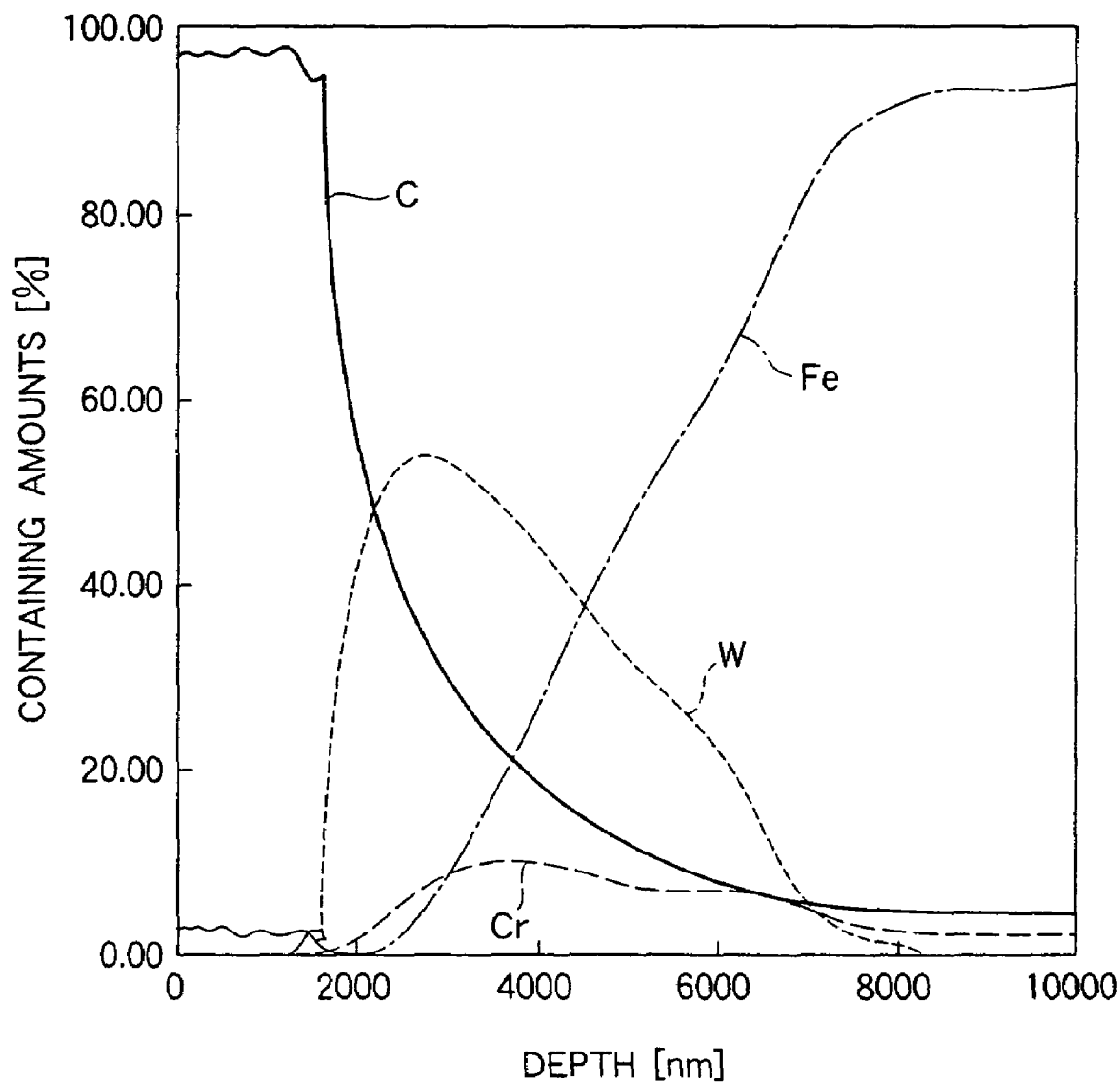
FIG. 25 is a measuring chart of analyzing elements forming the DLC layer.

The results of analyzing the elements forming the DLC film 605 in case the first composite layer B was composed of two kinds of Cr (chromium) and W (tungsten) is the same as that of FIG. 25 obtained by use of a glow discharge emission analyzer (GDLS-9950 made by Shimadzu Seisakusho, Ltd.)

The UBMS apparatus can install a plurality of targets to be used for spattering, and the spattering electric sources of the respective targets are independently controlled, whereby the spattering efficiency of the respective elements may be arbitrarily controlled. Thus, the UBMS apparatus is suited to the film-forming of the composite layer including the oblique layer.

For example, in the process of forming the first composite layer B and the first composite layer D, while decreasing the electric power of the spatter source (DC source) of the respective targets, the power of the spatter source (DC source) of the other component is increased simultaneously (at this time, negative bias voltage is supplied to the outer ring 602).

Figure 42:
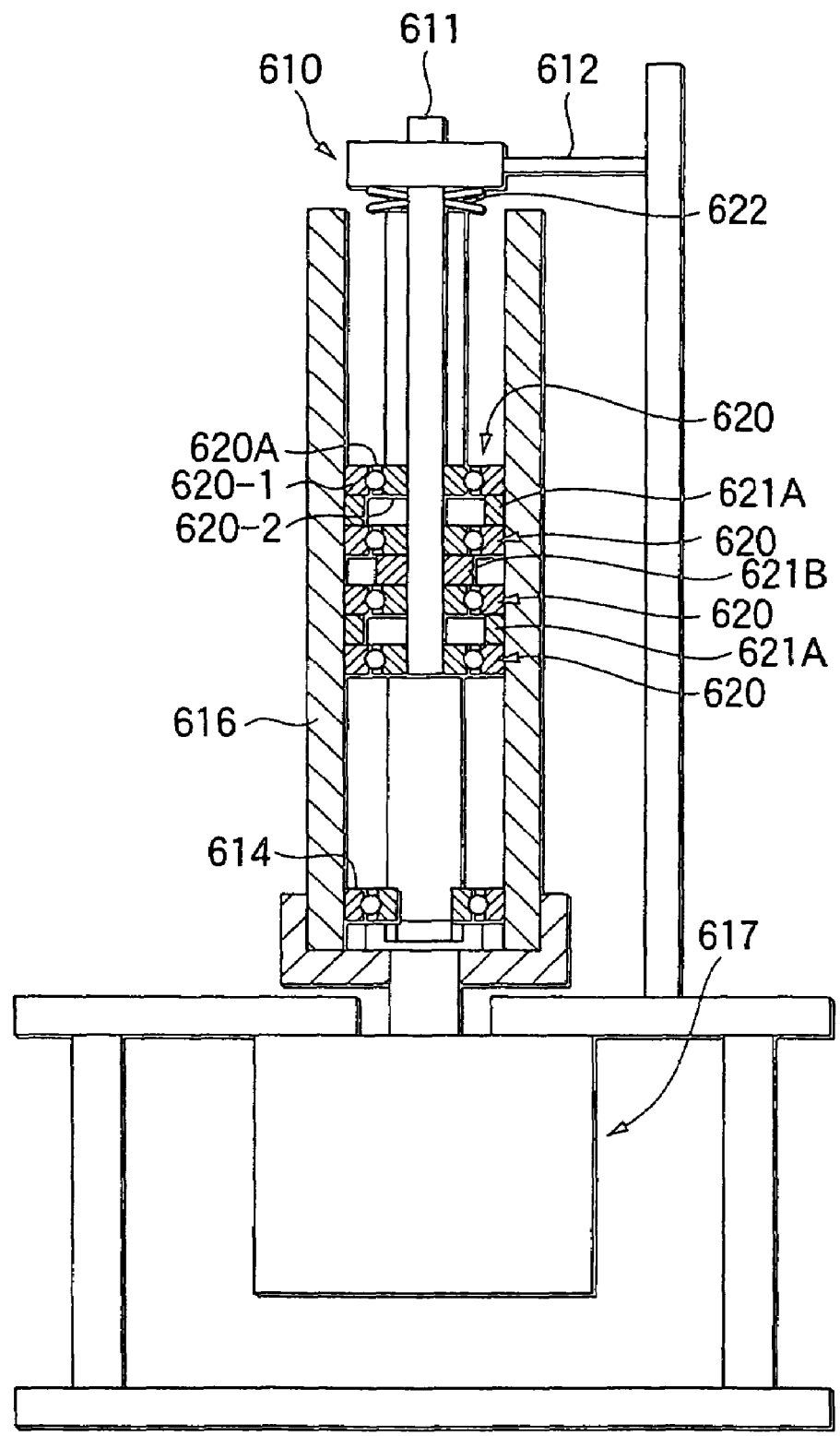
FIG. 42 is a cross sectional view of a fluctuation-endurance test machine.

By use of the fluctuation-endurance test machine shown in FIG. 42, the endurance tests were carried out on the testing bearings of Example 24, Comparative Examples 24 and 25.

In the fluctuation-endurance test machine, an axially biasing unit 610 of a washer and a pre-load spring is fixed to a shaft 611 secured by a rotation stopper 612. A housing 616 is supported at a lower part by a support bearing 614 and connected to an AC servo motor 617, and fluctuatingly rotated at predetermined angle and rotating number. 620 designates four test bearings, and 620A is rolling elements.

In the respective test bearings 620, an outer ring 620-1 is fitted to an inner diameter of the housing 616, while an inner ring 620-2 is inserted into the shaft 611, and sleeves 621A, 621B separate from the shaft 611 are alternately piled, and the housing 616 and the outer ring 620-1 are rotatably supported, while the shaft 611 and the inner ring 620-2 are unrotatably supported.

The sleeves 621A, 621B are axially pressed by a coned disc spring 622 of the axially biasing unit 610 so as to add the pre-load (Fa) to the inner ring 620-2, the outer ring 620-1 and the rolling elements 620A of the test bearing 620.

The fluctuation-endurance test was performed under the conditions described below, and the rotation torque of the test bearing was measured. The torque performance was measured in torque and torque variation taken at beginning of rotation.

Test bearing: inner diameter: 7.94 mm, outer diameter: 12.7 mm, and width: 3.97 mm
Fluctuating frequency: 30 Hz
Fluctuating angle of the outer ring: 8°
Axial load: 29.4 N
Number of repeating fluctuations: 5,000,000

The torque variations were confirmed before and after the fluctuation test. The torque taken to rotation of the inner ring before the test was about 19.6 mN·cm.

In the test bearing of Comparative Example 24, the film of the titanium metallic layer was formed on the raceway surfaces of the inner and outer rings by a holocathode type ion plating process, and the carbon layer is formed thereon by a plasma CVD process. In the test bearing of Comparative Example 25, the DLC layer (not containing the fluorine compound layer) of the uppermost carbon was formed on the raceway surfaces of the inner and outer rings by the UBMS, and the test bearing of Example 24 was formed with the same DLC layer (the uppermost surface contained the fluorine compound layer) as the DLC layer 605 of FIG. 41 (the first composite layer B was composed with one kind metal of Cr (chromium) and carbon).

The tested results are shown in Table 13.

TABLE 13

| | Film forming process | Film thickness (μm) | Fluorine compound | Interface of carbon layer | Torque change |
|---|---|---|---|---|---|
| Example 24 | UBMS | 2 | Yes | Oblique layer | 103% |
| Comparative Example 24 | Plasma CVD | 2 | No | Discontinuous interface | 180% |
| Comparative Example 25 | UBMS | 2 | No | Oblique layer | 150% |

By the fluctuation-endurance test under the above test conditions, the test bearings of the Comparative Examples 24 and 25 were confirmed to have damages on the surface of the raceway surfaces. That is, the test bearings of the Comparative Examples 24 and 25 generated surface coarseness and abrasion in comparison with the bearings before test, and the torque after test abnormally rose.

The using condition accompanying such fluctuations are much seen in the rolling bearings supporting a magnetic read-in apparatus of an information machinery or a wirebonder, and the torque variation is taken up as a problem rather than the torque at the beginning period.

From the results of Table 13, in the test bearing of Comparative Example 24, as titanium of the intermediate layer and the carbon layer composed the interface, the strength of the DLC film was weak, and the surface of the raceway surface was worn to cause the abnormal rising of the torque (180%) after test.

In the test bearing of the Comparative Example 25, the strength of the DLC film rose, but as the lubricating property in the surface thereof is poor, the surface of the raceway surface was worn to cause the abnormal rising of the torque (150%) after test.

On the other hand, the Example 24 showing the eleventh embodiment made the film by the UBMS until the uppermost surface of the DLC layer (the fluorine compound layer E of ethylene tetrafluorine), and since the oblique layer is formed with the changing portion (the first composite layer B) of the carbon layer C from the metallic layer A and the changing portion (the second composite layer D) of the fluorine compound layer E from the carbon layer C, the film strength of the DLC layer is increased.

The fluorine compound layer E of the uppermost surface of the DLC layer is excellent in the lubricating property and composes the abrasion resistance surface strong against fluctuation such as fretting, so that the torque rising after test is a little (103%).

Figure 43:
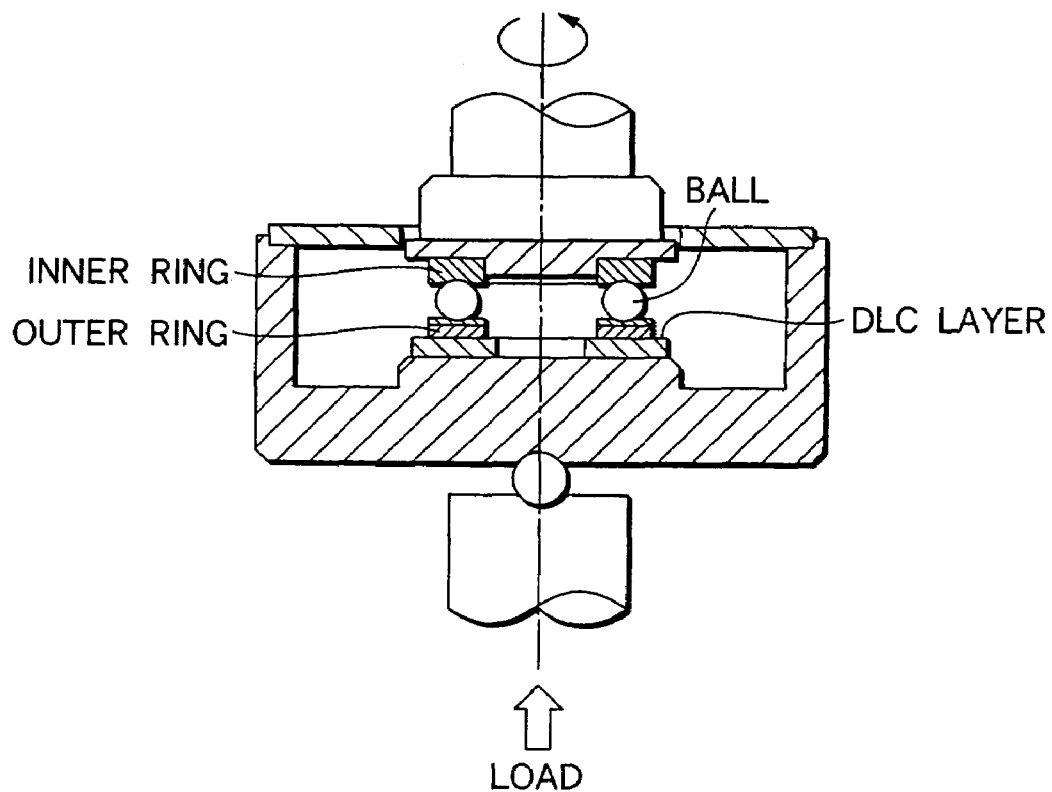
FIG. 43 is a cross sectional view of a thrust bearing endurance test machine.

Next, in the thrust bearing furnished with substantially the same DLC layer as that of the deep groove ball bearing of FIG. 40, the test bearings variously changing the equivalent elastic modulus of the DLC layer were prepared, and by use of the endurance test machine of the thrust bearing shown in FIG. 43, the rotation test was carried out for evaluating the correlation between the equivalent elastic modulus and the endurance of the DLC layer.

In the tests, the outer ring was a plane member having no raceway groove, and the DLC film was formed on the raceway part contacting with the ball, and 11 pieces of balls were disposed between the raceway surfaces of the inner and outer rings.

The DLC film is formed by the UBMS apparatus similarly to the above mentioned, and the metals to be used to the metallic layer and the first composite layer are, for example, Cr and W, and no limitation is especially made as far as the atomic radius is near to that of the base material of the bearing.

The equivalent elastic modulus of the DLC film can be changed by controlling the bias voltage supplied to the outer ring, otherwise controlling the partial pressure of a gas to be introduced.

If controlling sorts or ratios of the partial pressure of the gases to be introduced (Ar, $H_2$ or hydrocarbon based gas such as methane), the equivalent elastic modulus and the surface sliding resistance of the DLC film can be arbitrarily controlled, so that it is possible to form a desired DLC film meeting a purpose by introducing a mixed gas or a sole gas.

Further, the thickness of the DLC film can be more precisely controlled depending on the spattering time.

The rotating test was the thrust load of 3.5 kN and the rotating speed of 6000 rpm, and the lubricant oil was perfluoroporoether oil.

And, vibrations were measured by an accelerating sensor made by Endebuco Inc. attached to a bearing supporting portion, and the breakage of the DLC film was detected by increase of the vibration values. The endurance of the DLC film was evaluated by the total rotation number of the bearing until the DLC film is broken.

Figure 44:
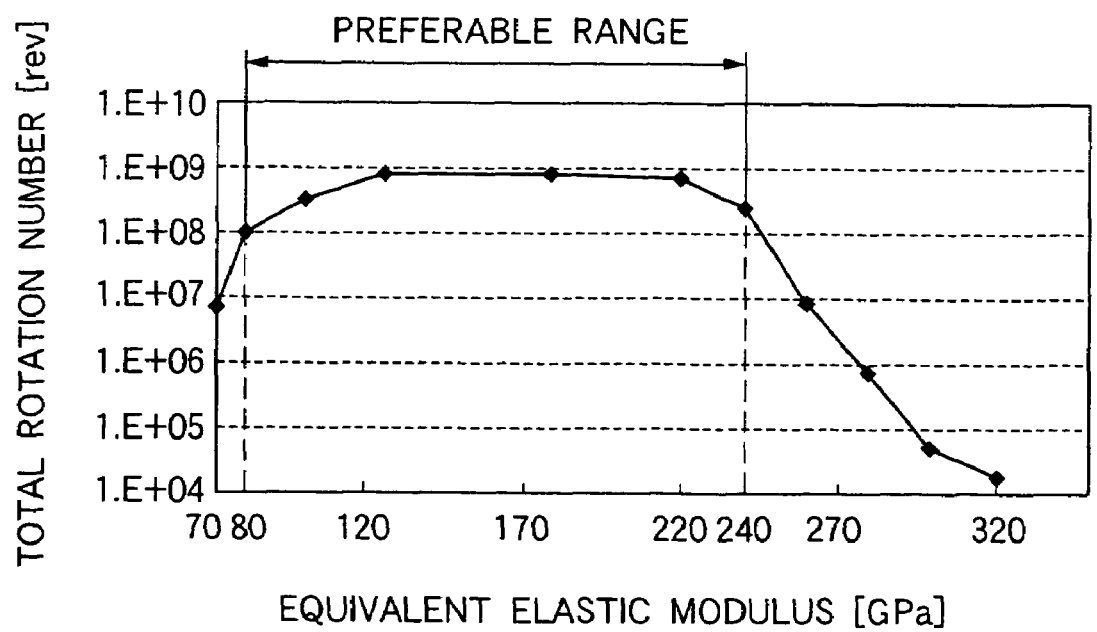
FIG. 44 is a graph showing the relationship between equivalent elastic modulus of the DLC layer and the total rotation number (endurance) of the bearing.

FIG. 44 shows the relationship between the equivalent elastic modulus and the total rotation number (endurance).

As is seen from FIG. 44, if the equivalent elastic modulus of the DLC layer is 80 GPa or more to 240 GPa or less, it is seen that the endurance of the DLC layer is excellent. If being less than 80 GPa, the surface hardness of the DLC is lowered, and abrasion is easy to occur with respect to the contact stress.

On the other hand, if being more than 240 GPa, in the surface of the base material such as the bearing steel having the small equivalent elastic modulus, the equivalent elastic modulus of the DLC layer becomes larger than that of the bearing steel and the base material deforms prior to the DLC, so that the film is easily broken by the repeated stress.

The invention is not limited to the above mentioned embodiments, but appropriately modified so far as not being out of the subject of the invention.

For example, in the embodiment, the deep groove ball bearing is exemplified for explanation, but the invention is not limited thereto and may be applied to angular ball bearing, cylindrical roller bearing, tapered roller bearing, needle roller bearing, radial shape rolling apparatus such as a self-aligning roller bearing, a thrust shape rolling apparatus such as the thrust roller bearing.

In the embodiment, the rolling bearing is exemplified as the rolling apparatus for explanation, but the invention is not limited thereto, and may be applied to other rolling apparatus such as a direct-acting bearing, a ball screw, or direct bearing In addition, the DLC film was formed by the spattering using the unbalanced magnetron, but instead, the DLC film may depend on a pulse laser arc deposition process or a plasma DVC process. Such spattering is most suited which uses the unbalanced magnetron easy to independently control the equivalent elastic modulus and a plastic deformation hardness.

As is seen from the above explanation, according to the eleventh embodiment, the diamond like carbon layer including a metallic layer made of at least one kind of metal, a first composite layer having the metal and carbon, a carbon layer made of carbon, a second composite layer having a fluorine compound and carbon, and a fluorine composite layer on an uppermost surface. Thus, it is possible to form the DLC layer having the lubricating film difficult to be broken even if a large contact stress acts on, and the lubricating layer on the uppermost surface, and the invention may be suitably applied to members composing units (for example, the rolling apparatus) to which large contact stress is effected.

Further, having the excellent lubricating property, the DLC layer enables to suitably serve under the oil free condition, and is less to cause abrasion or generation of heat and strong against repeated stress, and has a long serving life.

While only certain embodiments of the invention have been specifically described herein, it will apparent that numerous modifications may be made thereto without departing from the spirit and scope of the invention.

What is claimed is:

1. A rolling sliding member adapted to causing a rolling contact or a sliding contact relative to an opposite member, comprising:
    a base material made of steel;
    a diamond like carbon layer formed on the contacting face and having a lubricating property, the diamond like carbon layer including:
    a metallic layer;
    a first composite layer having the metal and carbon;
    a carbon layer made of carbon; and
    a fluorine composite layer on an uppermost surface.

2. The rolling sliding member as set forth in claim 1, wherein
    the rate of carbon in the first composite layer gradually increases from a side of the metallic layer toward a side of the carbon layer.

3. The rolling sliding member as set forth in claim 1, wherein
    the diamond like carbon layer further includes a second composite layer having a fluorine compound and carbon.

4. The rolling sliding member as set forth in claim 3, wherein
    from the surface side toward a base material, the diamond like carbon layer is arranged in the order of the fluorine composite layer, the second composite layer, the carbon layer, the first composite layer and the metallic layer.

5. The rolling sliding member as set forth in claim 3, wherein
    the rate of carbon in the first composite layer gradually increases from the metallic layer side toward the carbon layer side, and
    the rate of carbon in the second composite layer gradually decreases from the carbon layer side toward the fluorine composite layer side.

6. The rolling sliding member as set forth in claim 1, wherein
    an equivalent elastic modulus of the diamond like carbon layer is set to be 80 to 240 GPa.

7. The rolling sliding member as set forth in claim 1, wherein
    the diamond like carbon is formed by using an unbalanced magnetron sputter.

8. A rolling apparatus, comprising:
    an inner member having a raceway surface on an outer face;
    an outer member having on an inner face, a raceway surface opposite to the raceway surface of the inner member and being disposed outside of the inner member; and
    rolling elements rollably disposed between both the raceway surfaces,
    wherein
    at least one of the inner member, the outer member and the rolling elements is formed by the rolling sliding member as set forth in claim 1.

9. The rolling sliding member as set forth in claim 1, wherein the metallic layer is made of at least one metal selected from Cr, W, Ti, Si, Ni and Fe.

* * * * *